United States Patent
Grosjean et al.

(10) Patent No.: US 11,770,112 B1
(45) Date of Patent: Sep. 26, 2023

(54) MEMS RESONATOR WITH CO-LOCATED TEMPERATURE SENSOR

(71) Applicant: SiTime Corporation, Santa Clara, CA (US)

(72) Inventors: Charles I. Grosjean, Los Gatos, CA (US); Ginel C. Hill, Sunnyvale, CA (US); Paul M. Hagelin, Saratoga, CA (US); Renata Melamud Berger, Palo Alto, CA (US); Aaron Partridge, Cupertino, CA (US); Markus Lutz, Mountain View, CA (US)

(73) Assignee: SiTime Corporation, Santa Clara, CA (US)

( * ) Notice: Subject to any disclaimer, the term of this patent is extended or adjusted under 35 U.S.C. 154(b) by 97 days.

(21) Appl. No.: 17/197,378

(22) Filed: Mar. 10, 2021

Related U.S. Application Data

(62) Division of application No. 16/591,717, filed on Oct. 3, 2019, which is a division of application No. (Continued)

(51) Int. Cl.
*H03H 9/24* (2006.01)
*H03H 3/007* (2006.01)
(Continued)

(52) U.S. Cl.
CPC ......... *H03H 9/2457* (2013.01); *B81C 1/0069* (2013.01); *H03H 3/0072* (2013.01); *H03H 3/0076* (2013.01); *H03H 9/1057* (2013.01)

(58) Field of Classification Search
CPC ..... H03H 2003/021; H03H 2003/0471; H03H 9/02244; H03H 9/02102; H03H 3/04;
(Continued)

(56) References Cited

U.S. PATENT DOCUMENTS 6,630,367 B1  10/2003 Kubena
7,369,004 B2 *  5/2008 Partridge ................. H03B 5/30
                                                      331/116 M
(Continued)

FOREIGN PATENT DOCUMENTS

WO     2012110708 A1    8/2012

OTHER PUBLICATIONS

T. Pensala, A. Jaakkola, M. Prunnila and J. Dekker, "Temperature compensation of silicon MEMS Resonators by Heavy Doping," 2011 IEEE International Ultrasonics Symposium, 2011, pp. 1952-1955, doi: 10.1109/ULTSYM.2011.0486. (Year: 2011).*
(Continued)

*Primary Examiner* — Burton S Mullins

(57) ABSTRACT

A microelectromechanical system (MEMS) resonator includes a substrate having a substantially planar surface and a resonant member having sidewalls disposed in a nominally perpendicular orientation with respect to the planar surface. Impurity dopant is introduced via the sidewalls of the resonant member such that a non-uniform dopant concentration profile is established along axis extending between
(Continued)

the sidewalls parallel to the substrate surface and exhibits a relative minimum concentration in a middle region of the axis.

19 Claims, 43 Drawing Sheets

Related U.S. Application Data

15/697,417, filed on Sep. 6, 2017, now Pat. No. 10,476,477, which is a division of application No. 14/569,538, filed on Dec. 12, 2014, now Pat. No. 9,774,313, which is a division of application No. 13/837,407, filed on Mar. 15, 2013, now Pat. No. 8,916,407.

(60) Provisional application No. 61/617,230, filed on Mar. 29, 2012, provisional application No. 61/617,389, filed on Mar. 29, 2012.

(51) Int. Cl.
*B81C 1/00* (2006.01)
*H03H 9/10* (2006.01)

(58) Field of Classification Search
CPC ............... H03H 3/0076; H03H 3/013; H03H 2003/0407; H03H 9/2426
USPC .... 310/300, 309, 346, 341, 342; 438/50, 52; 333/197
See application file for complete search history.

(56) References Cited

U.S. PATENT DOCUMENTS

| | | | | |
|---|---|---|---|---|
| 7,442,258 | B2* | 10/2008 | Kim | C23C 14/042 118/301 |
| 7,446,619 | B2* | 11/2008 | Partridge | H03H 9/2405 331/116 M |
| 7,639,104 | B1* | 12/2009 | Quevy | H03H 9/2457 333/197 |
| 7,868,522 | B2* | 1/2011 | Ruby | H03H 9/02102 310/346 |
| 7,944,124 | B1 | 5/2011 | Bernstein | |
| 8,234,774 | B2* | 8/2012 | Hagelin | H03B 5/32 29/609.1 |
| 8,354,332 | B2* | 1/2013 | Ayazi | H03H 9/467 438/510 |
| 8,546,240 | B2* | 10/2013 | Harame | G06F 30/39 438/422 |
| 8,558,643 | B2* | 10/2013 | Prunnila | H03H 9/02448 257/415 |
| 8,916,477 | B2 | 12/2014 | Grosjean | |
| 9,774,313 | B1 | 9/2017 | Grosjean | |
| 10,476,477 | B1 | 11/2019 | Grosjean | |
| 2005/0151592 | A1* | 7/2005 | Partridge | H03L 1/027 331/16 |
| 2006/0261915 | A1 | 11/2006 | Lutz | |
| 2006/0276015 | A1 | 12/2006 | Morris | |
| 2009/0153258 | A1 | 6/2009 | Lutz | |
| 2009/0158566 | A1 | 6/2009 | Hagelin | |
| 2009/0224850 | A1 | 9/2009 | Nakamura | |
| 2009/0243747 | A1 | 10/2009 | Gaidarzhy | |
| 2010/0127596 | A1 | 5/2010 | Ayazi | |
| 2010/0283353 | A1 | 11/2010 | Van Der | |
| 2011/0109194 | A1 | 5/2011 | Hung | |
| 2011/0127625 | A1 | 6/2011 | Van Der | |
| 2012/0013412 | A1 | 1/2012 | Winkler | |
| 2012/0043626 | A1 | 2/2012 | Lin | |
| 2012/0132003 | A1 | 5/2012 | Comi | |
| 2012/0286903 | A1 | 11/2012 | Prunnila | |
| 2013/0285676 | A1 | 10/2013 | Rahafrooz | |
| 2014/0339953 | A1 | 11/2014 | Li | |
| 2014/0339963 | A1 | 11/2014 | Iihola | |
| 2015/0091411 | A1 | 4/2015 | Verhiejden | |
| 2016/0130137 | A1 | 5/2016 | Huang | |
| 2020/0095119 | A1 | 3/2020 | Chang | |

OTHER PUBLICATIONS

A. K. Samarao, G. Casinovi and F. Ayazi, "Passive TCF compensation in high Q silicon micromechanical resonators," 2010 IEEE 23rd International Conference on Micro Electro Mechanical Systems (MEMS), 2010, pp. 116-119, doi: 10.1109/MEMSYS.2010. 5442553. (Year: 2010).*
Final office action, U.S. Appl. No. 15/912,551, dated Apr. 1, 2021, 14 pages.
Ghahsareh, "Frequency Stability In Thin-Film Piezoelectric-On-Substrate Oscillators," 120pp, Oklahoma State PhD thesis, Dec. 2013.
Hajaam, Arash, "Sub-100ppb/° C Temperature Stability in Thermally Actuated High Frequency Silicon Resonators via Degenerate Phosphorous Doping and Bias Current Optimization," Jan. 2011, IEDM Tech. Dig.. 7.5.1-7.5.4. 10.1109/IEDM.2010.5703317, 4 pages.
Bachelet et al., "Structural-energy calculations based on norm-conserving pseudopotentials and localized Gaussian orbitals", Physical Review B, vol. 24, No. 8, pp. 4745-4752, Oct. 1981.
Bruner et al., "Electronic Effect in the Elastic Constants of Germanium", Physical Review Letters, vol. 7, No. 2, pp. 55-56, Jul. 1961.
Cerdeira et al., "Effect of Carrier Concentration on the Raman Frequencies of Si and Ge", Physical Review B, vol. 5, No. 4, pp. 1440-1454, Feb. 1972.
Csavinszky et al., "Effect of Doping on the Elastic Constants of Silicon", Physical Review, vol. 132, No. 6, pp. 2434-2440 Dec. 1963.
ECN Magazine, "World's First MEMS Real Time Clock," Nov. 29, 2010, 4 pages.
EE Times, "Built-in MEMS resonators beat quartz," Nov. 30, 2010, 3 pages.
Einspruch et al., "Electronic Effect in the Elastic Constant C' of Silicon", Applied Physics Letters, vol. 2, No. 1, pp. 1-3, Jan. 1963.
Hall, "Electronic Effects in the Elastic Constraints of n-Type Silicon", Physical Review, vol. 161, No. 3, pp. 756-761, Sep. 1967.
Harrison, "Pseudopotential theory of covalent bonding", Physical Review B, vol. 14, No. 2, pp. 702-711, Jul. 1976.
Hopcroft et al., "What is the Young's Modulus of Silicon?", Journal of Microelectromechanical Systems, vol. 19, No. 2, pp. 229-238, Apr. 2010.
Keyes, "Density of States of Degenerate n-Type Silicon from Elastic Constants", Solid State Communications, vol. 32, No. 2, pp. 179-180; 1979.
Keyes, "Elastic Properties of Diamond-Type Semiconductors", Journal of Applied Physics, vol. 33, No. 11, pp. 3371-3372, Nov. 1962.
Kim, "Electronic effect on the elastic constant of n-type silicon", J. Appl. Phys., vol. 52, No. 5, pp. 3693-3695, May 1981.
McSkimin, "Measurement of Elastic Constants at Low Temperatures by Means of Ultrasonic Waves—Data for Silicon and Germanium Single Crystals, and for Fused Silica", Journal of Applied Physics, vol. 24, No. 8, pp. 988-997, Aug. 1953.
Pensala et al., "Temperature Compensation of Silicon MEMS Resonators by Heavy Doping", Ultrasonics Symposium (IUS), 2011 IEEE International, pp. 1952-1955, Oct. 2011.
Pourkamali, Siavash; "High Frequency Capacitive Single Crystal Silicon Resonators and Coupled Resonator Systems," Dissertation at Georgia Institute of Technology; Dec. 2006.
Rodriguez et al., "Structural properties of tetrahedrally coordinated crystals from first-principles calculations of pressure and total energies" Physical Review B, vol. 31, No. 8, pp. 5327-5334, Apr. 1985.
Samarao, et al., "Temperature Compensation of Silicon Micromechanical Resonators via Degenerate Doping", IEDM, pp. 789-792, Dec. 2009.

(56) References Cited

OTHER PUBLICATIONS

Sanchez-Dehesa et al., "Self-consistent calculation of the internal strain parameter of silicon", Physical Review B, vol. 26, No. 10, pp. 5960-5962, Nov. 1982.
Smith et al., "Reevaluation of the derivatives of the half order Fermi integrals", J. Appl. Phys., vol. 73, No. 11, pp. 7030-7034, Jun. 1993.
Van Camp et al. "First Principles Calculation of Ground State and Electronic Properties of C and Si", Physica Scripta, vol. 35, pp. 706-709; 1987.

* cited by examiner

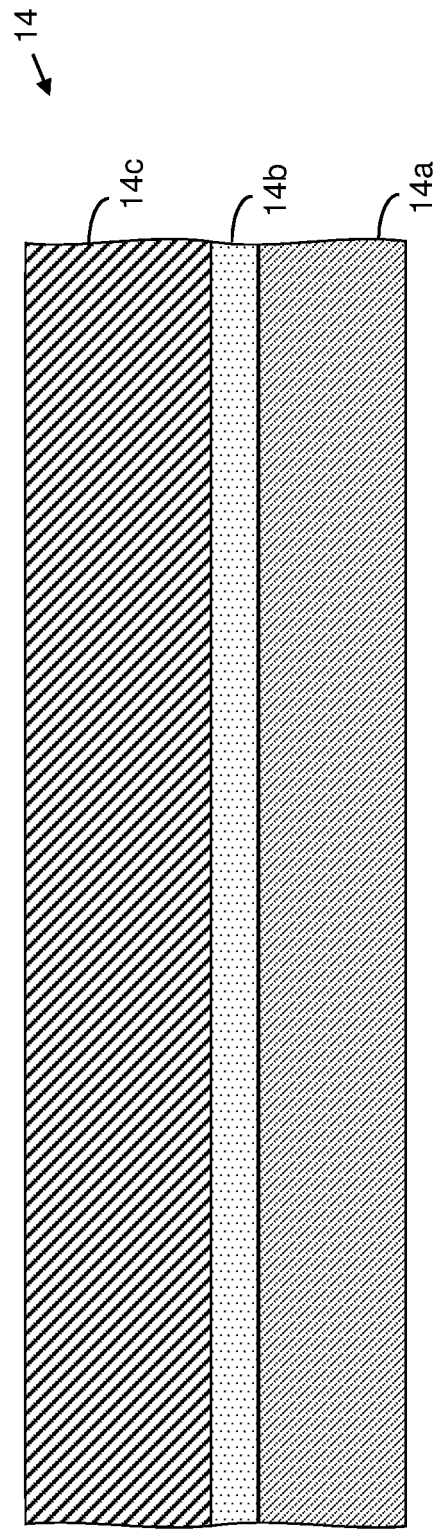
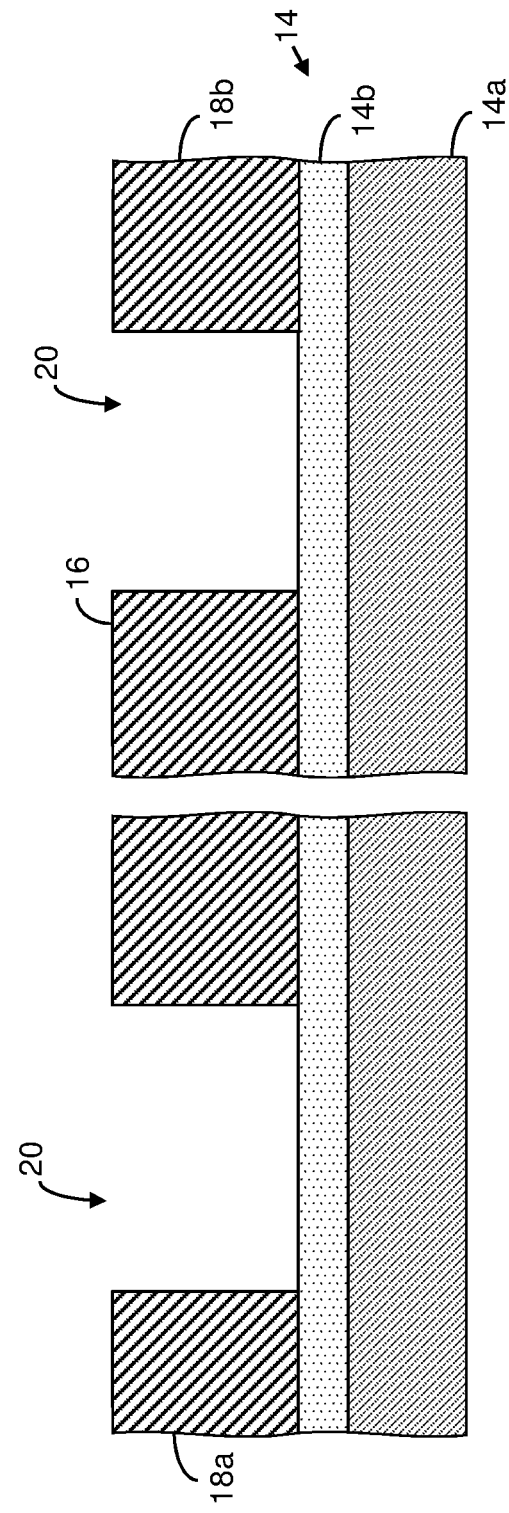
FIGURE 3A
FIGURE 3B

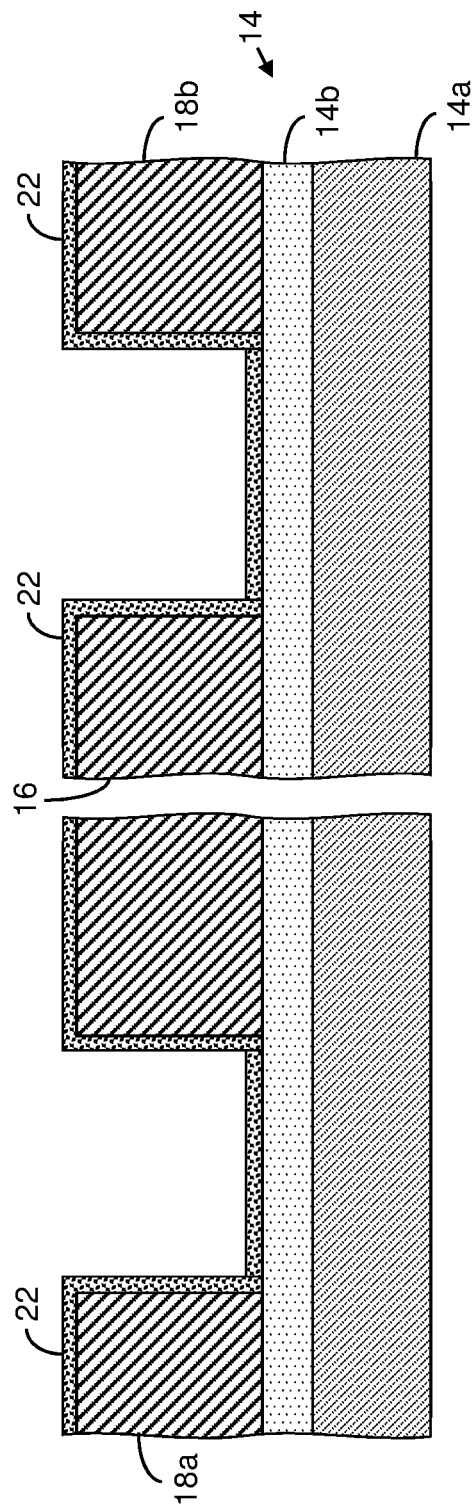
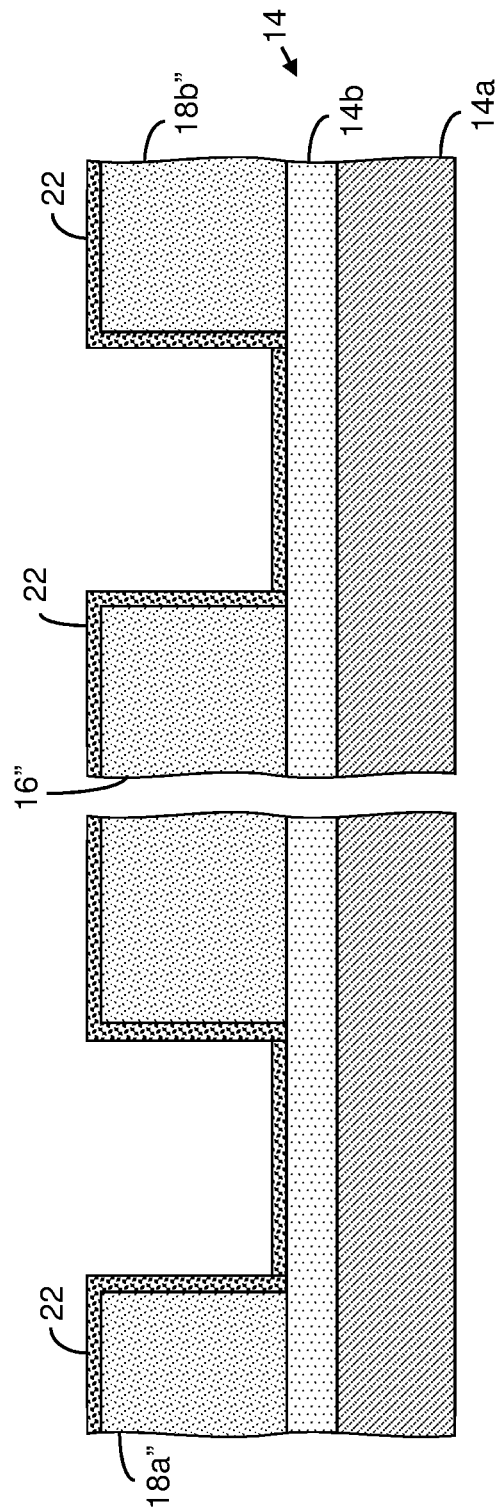

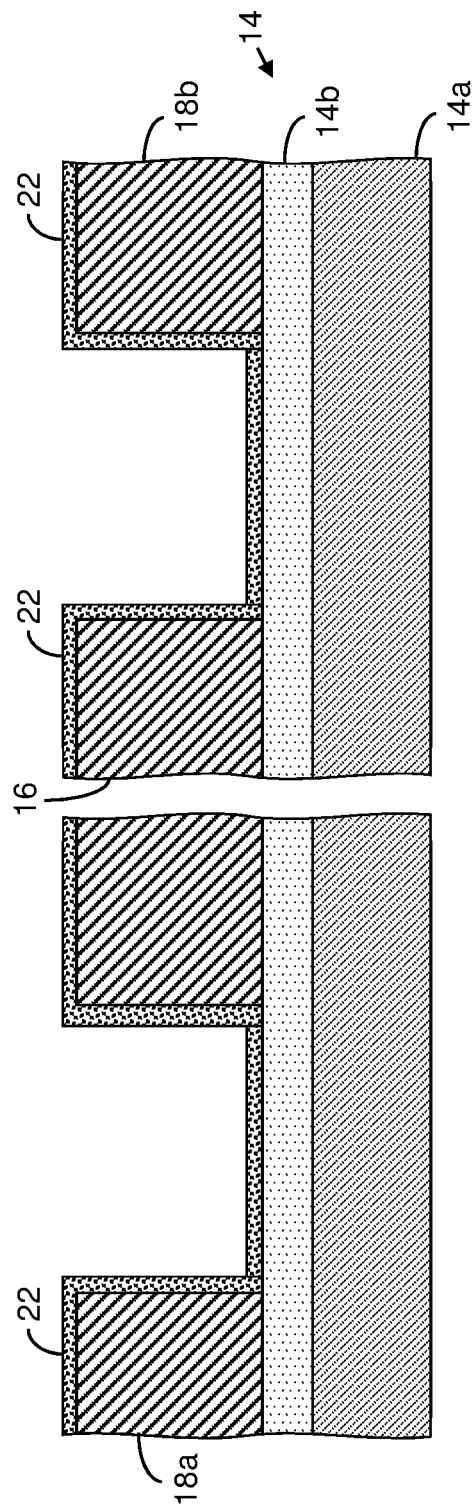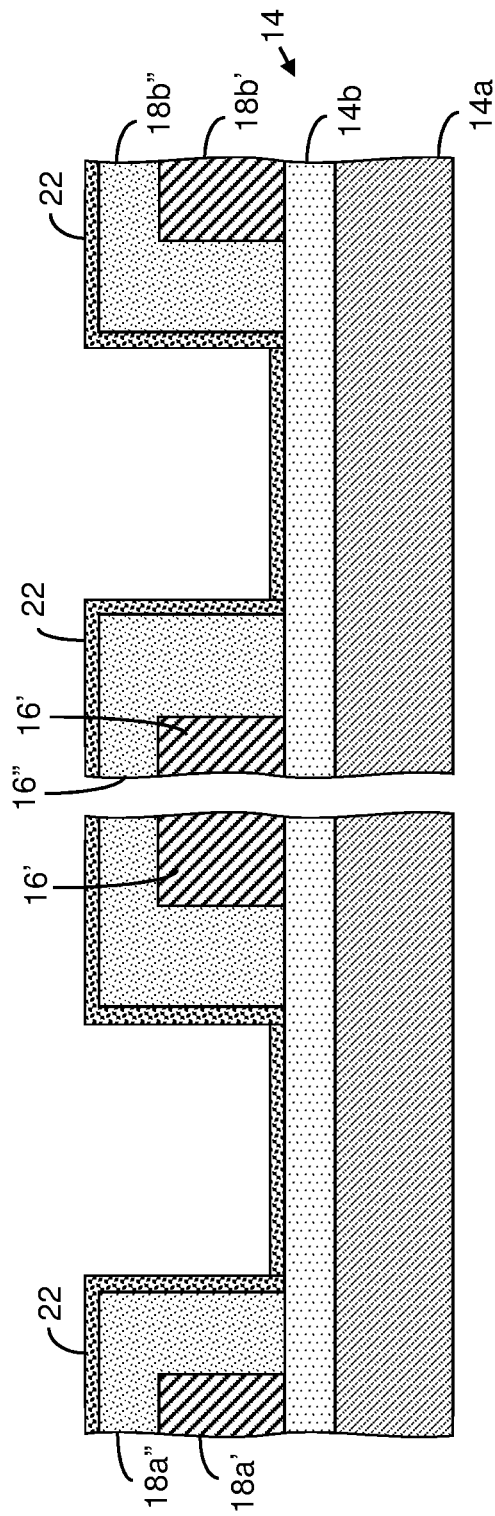
FIGURE 6A
FIGURE 6B

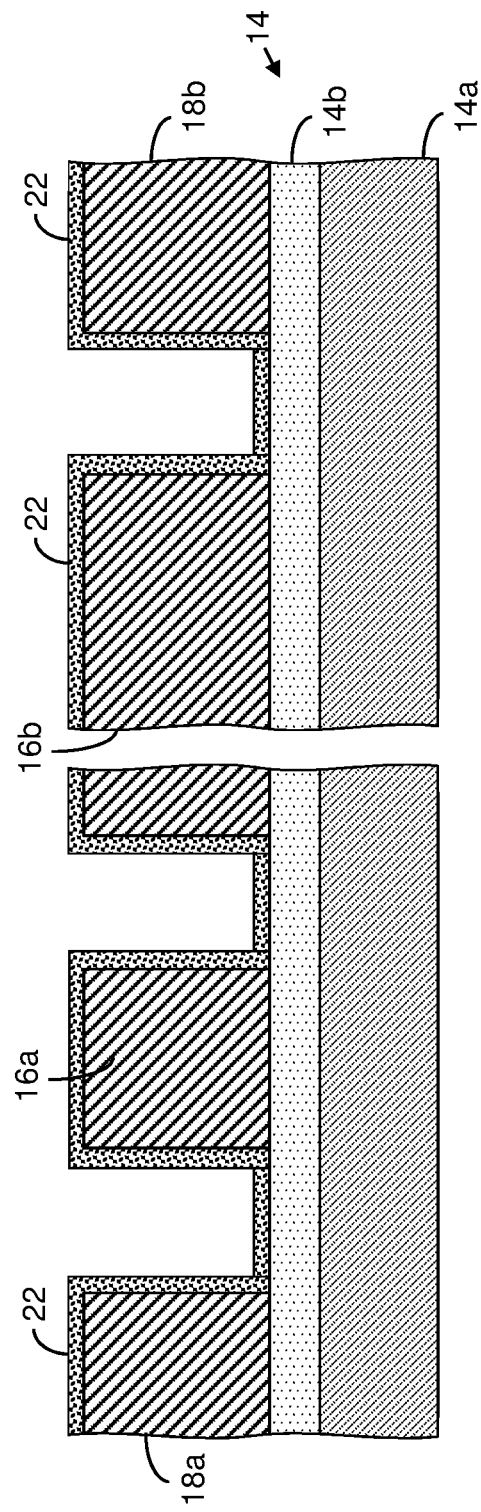
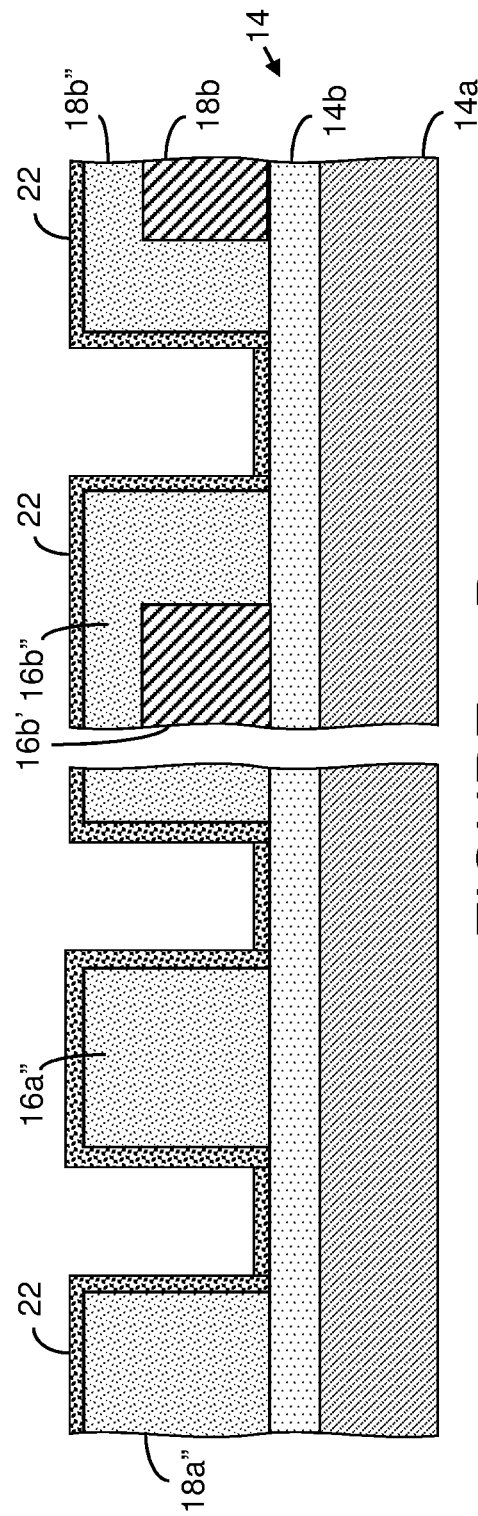
FIGURE 10A
FIGURE 10B

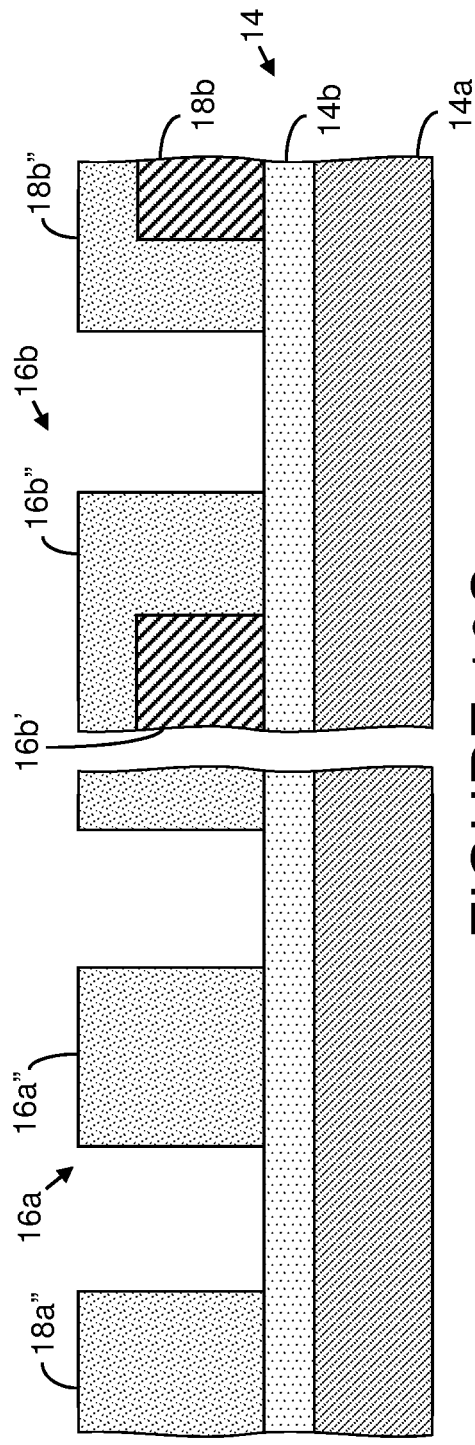
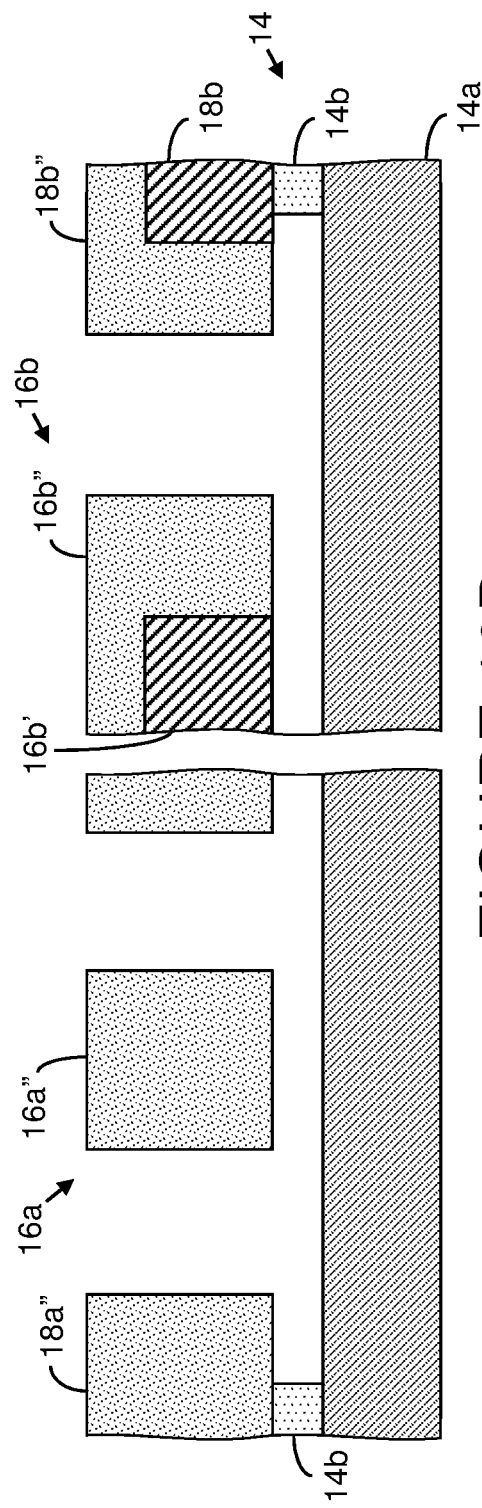
FIGURE 10C
FIGURE 10D

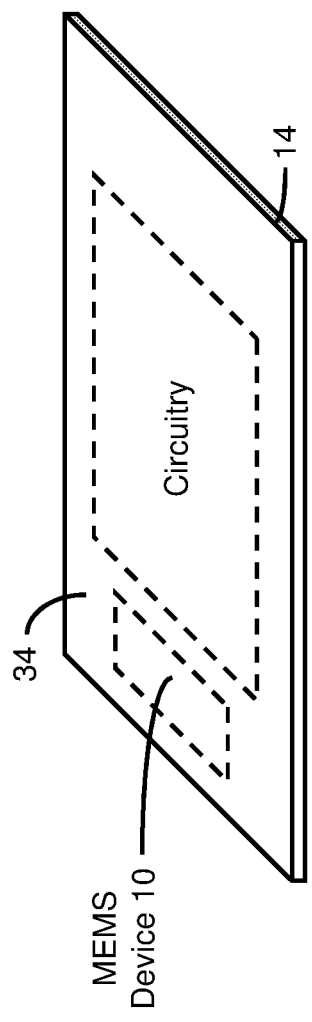
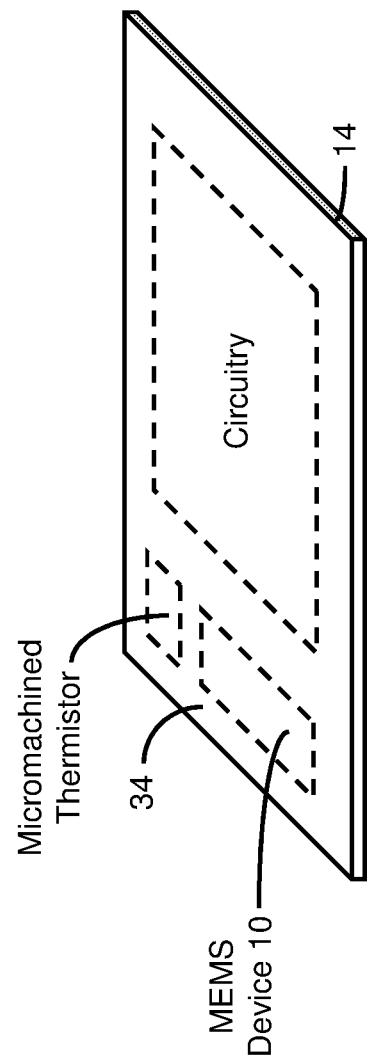

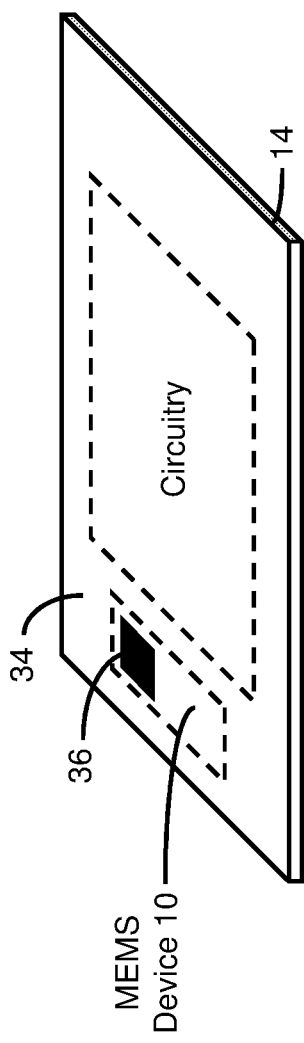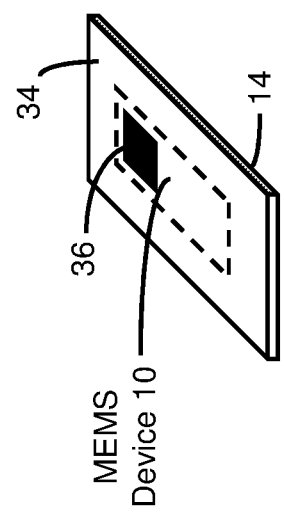

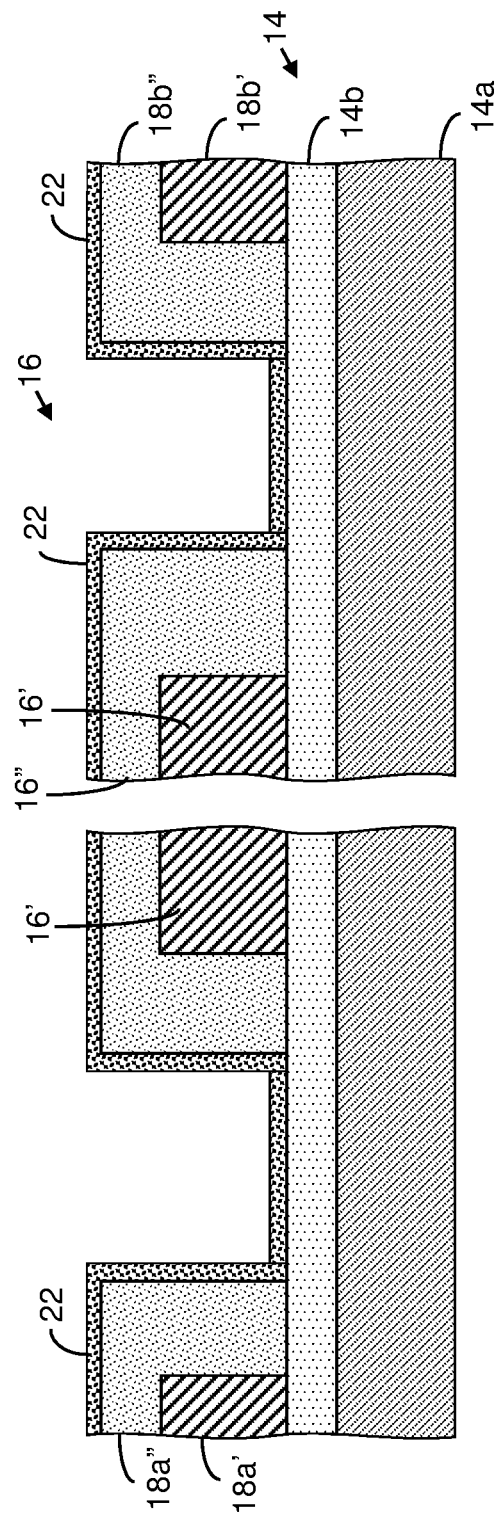
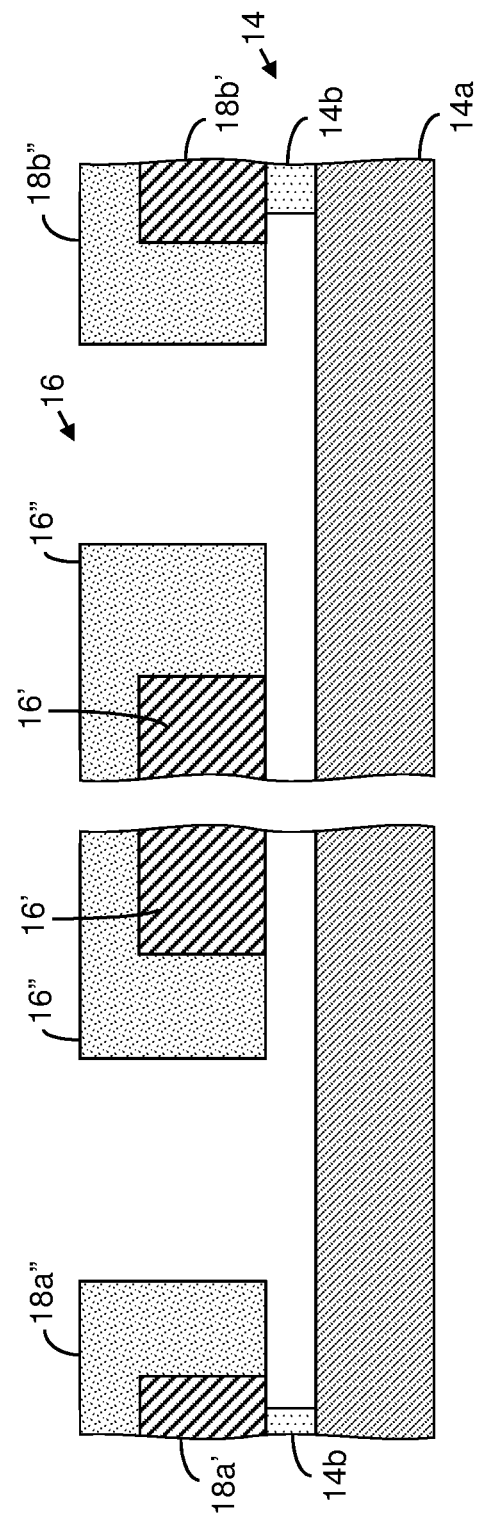
FIGURE 14A
FIGURE 14B

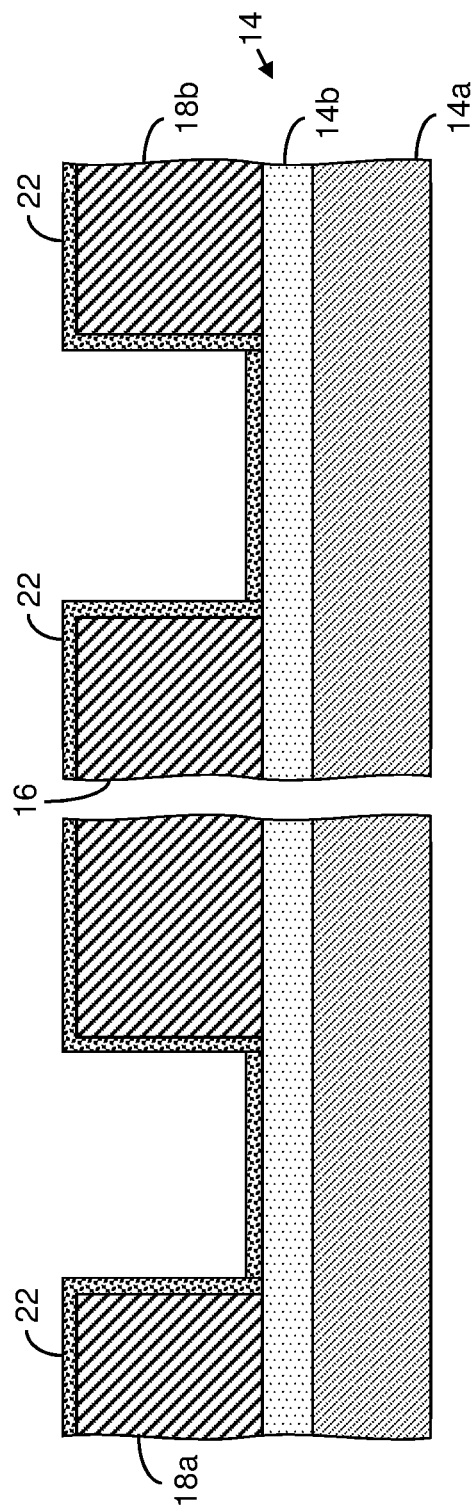
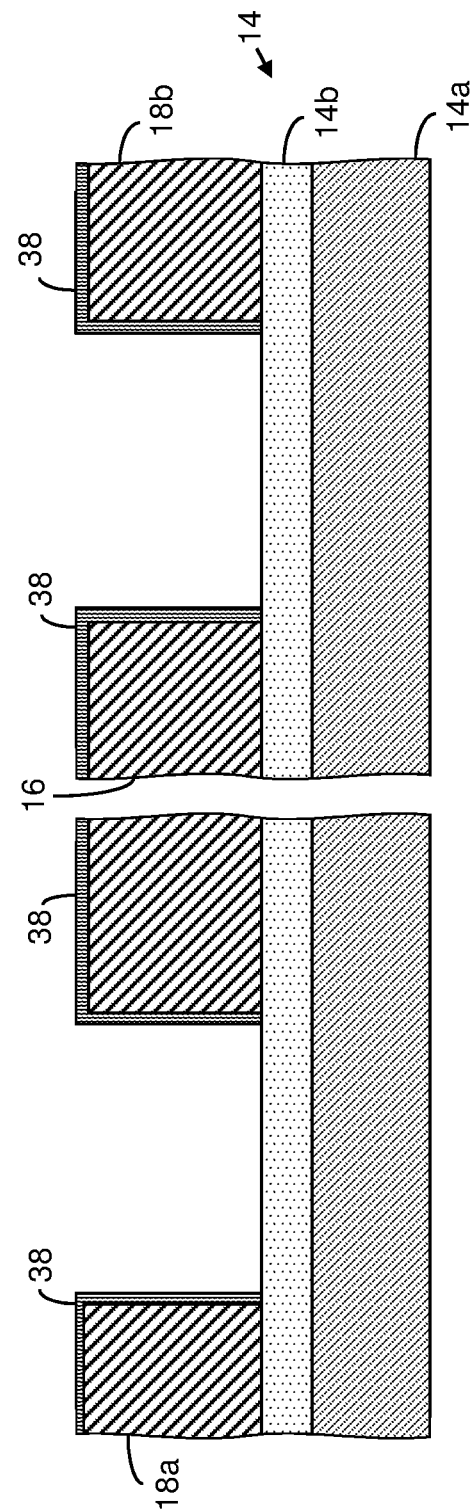
FIGURE 15A
FIGURE 15B

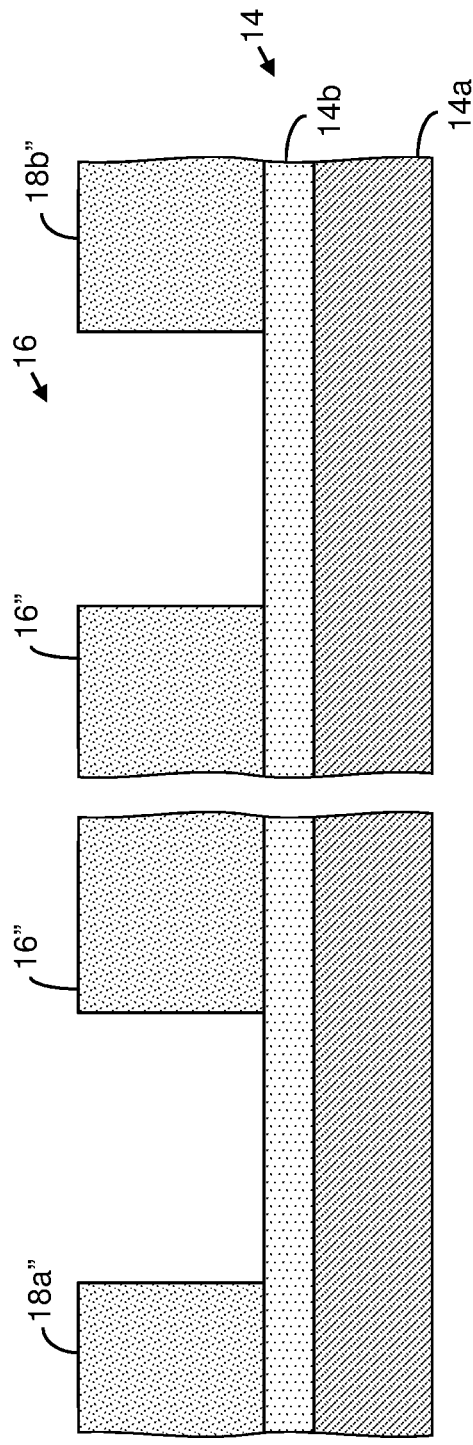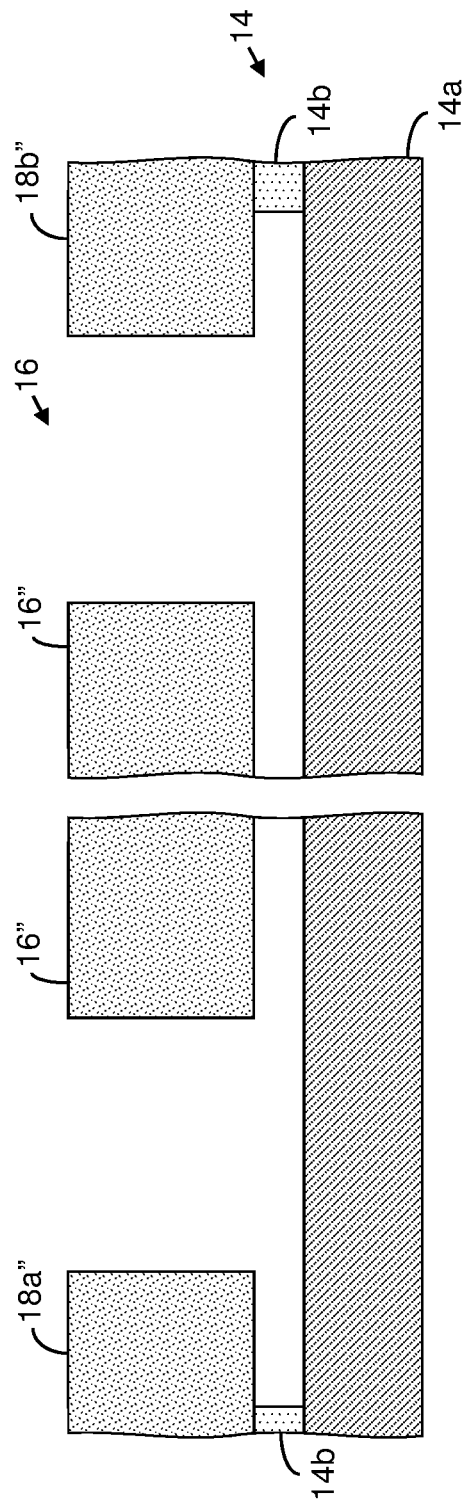

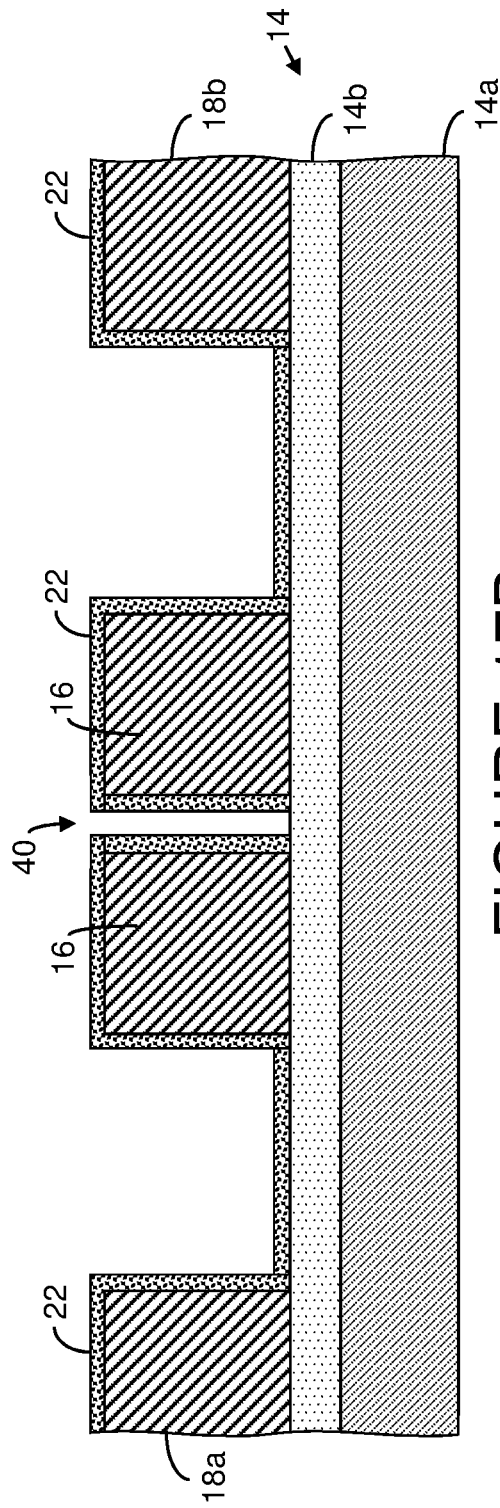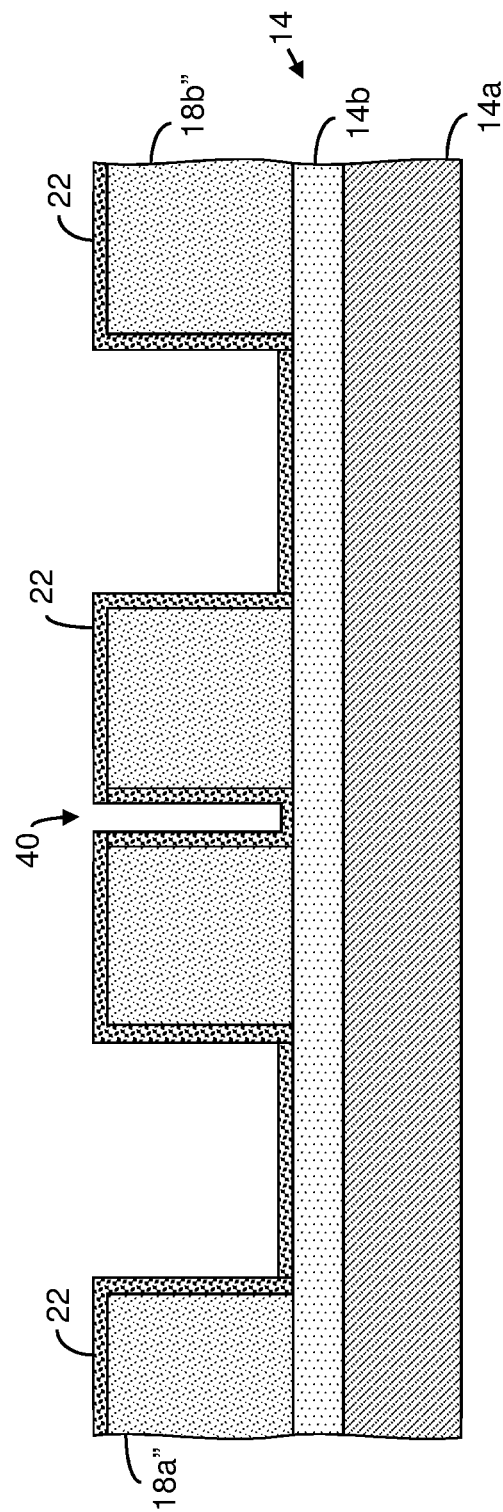
FIGURE 17B
FIGURE 17C

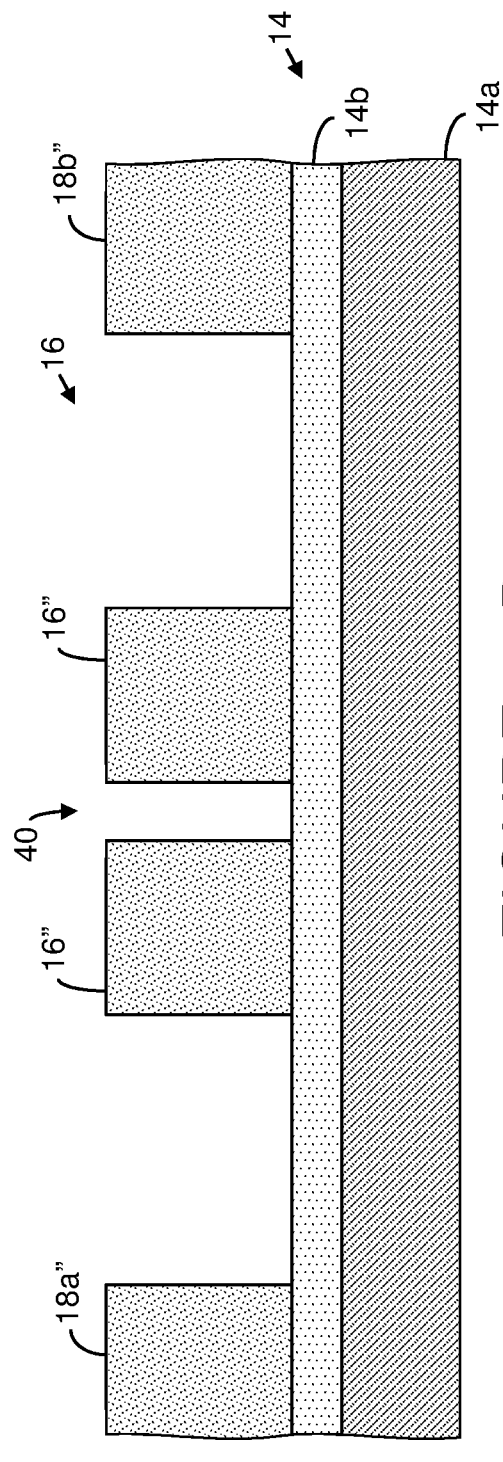
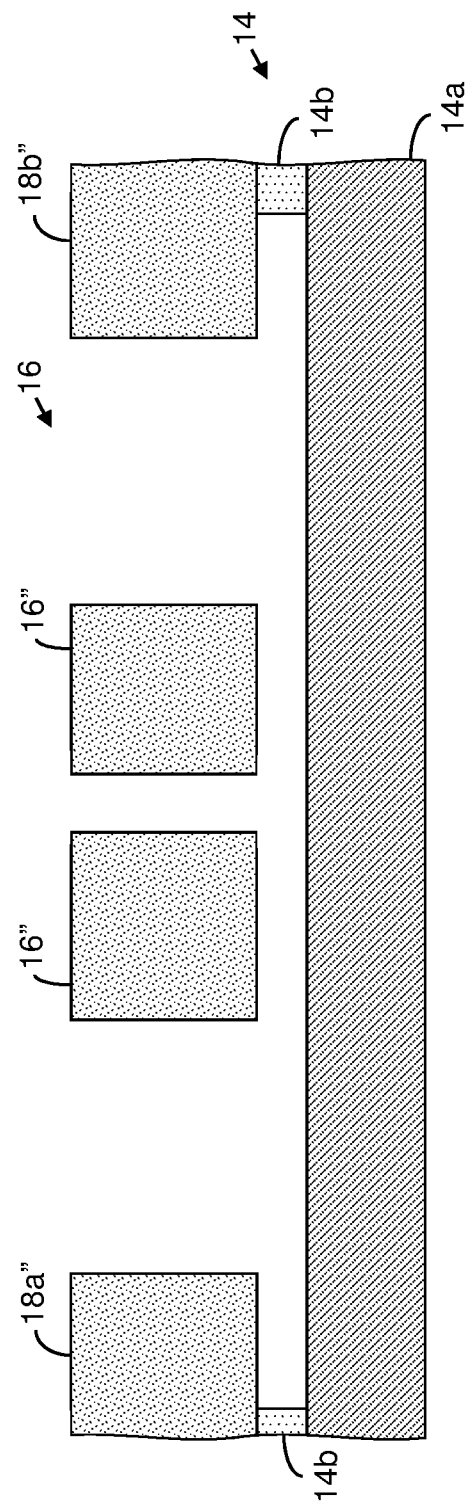
FIGURE 17D
FIGURE 17E

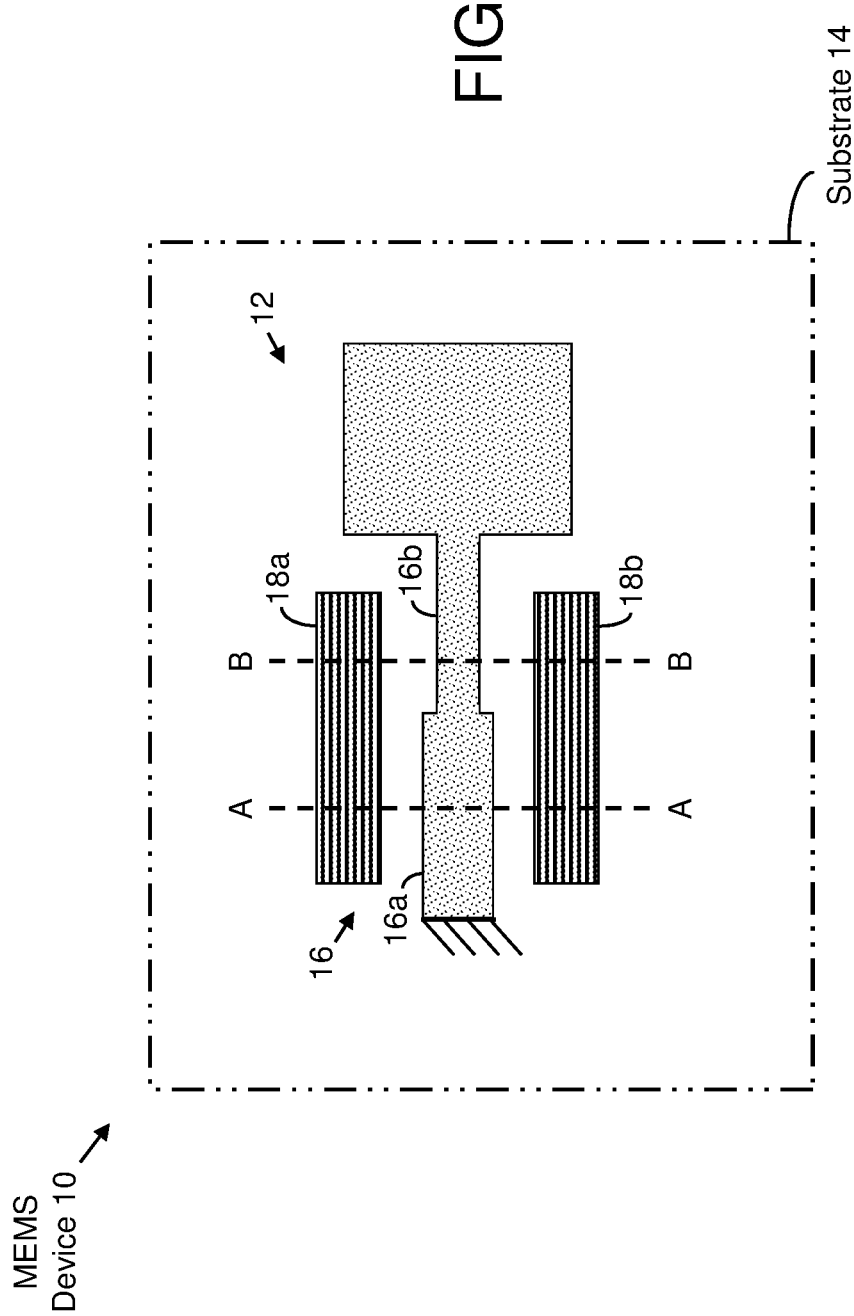

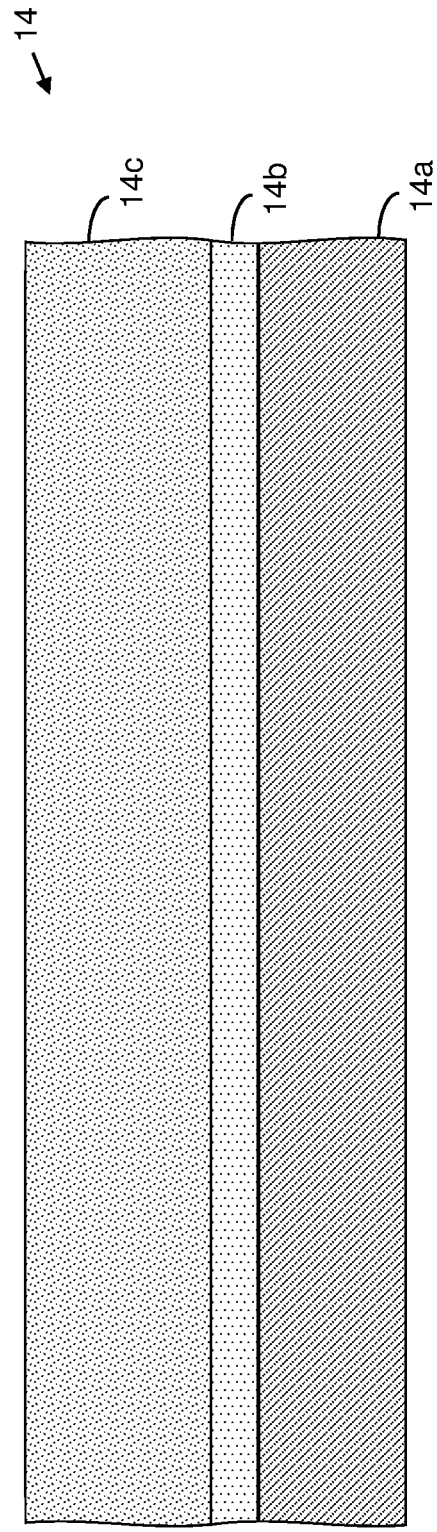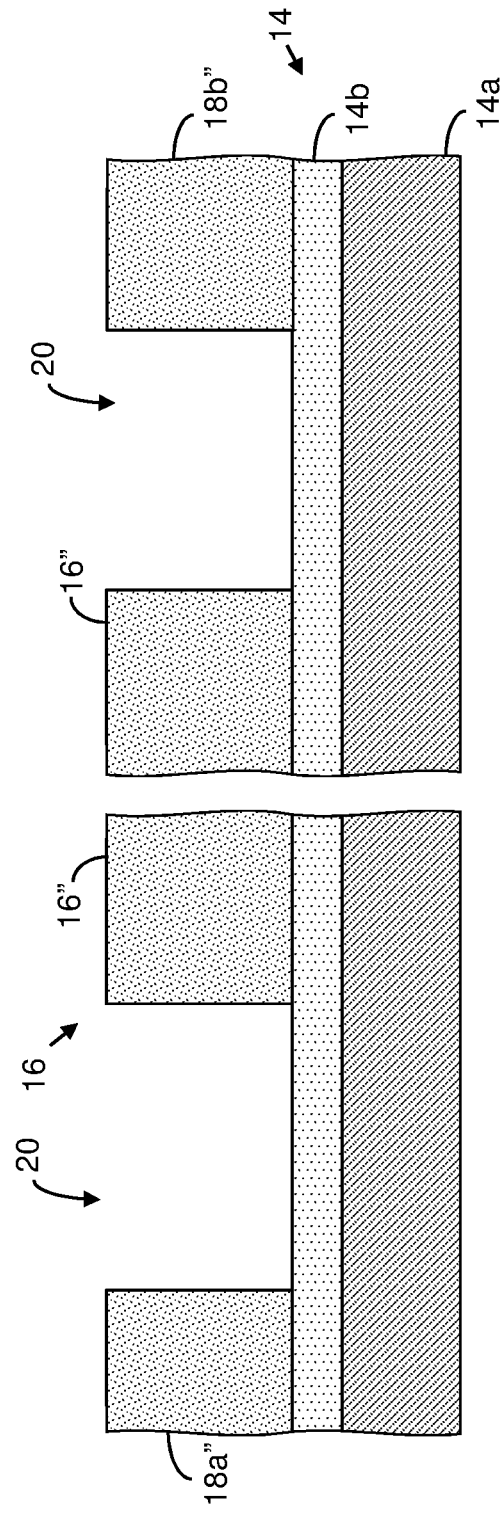
FIGURE 20A
FIGURE 20B

MEMS RESONATOR WITH CO-LOCATED TEMPERATURE SENSOR

CROSS-REFERENCE TO RELATED APPLICATIONS

This application is a divisional of U.S. application Ser. No. 16/591,717, entitled "Laterally-Doped MEMS Resonator," filed Oct. 3, 2019, which is a divisional of U.S. application Ser. No. 15/697,417, entitled "Laterally-Doped MEMS Resonator," filed Sep. 6, 2017 (now U.S. Pat. No. 10,476,477), which is a divisional of U.S. application Ser. No. 14/569,538, entitled "Laterally-Doped MEMS Resonator," filed Dec. 12, 2014 (now U.S. Pat. No. 9,774,313), which is a divisional of U.S. application Ser. No. 13/837,407, entitled "MEMS Device and Method of Manufacturing Same," filed Mar. 15, 2013 (now U.S. Pat. No. 8,916,407), which claims priority to U.S. Provisional Application No. 61/617,389, entitled "MEMS Device and Method of Manufacturing Same," filed Mar. 29, 2012 and to U.S. Provisional Application No. 61/617,230, entitled "Superdoped Resonators and Methods of Designing and Manufacturing Same," filed Mar. 29, 2012. Each of the foregoing applications is hereby incorporated by reference herein in its entirety.

INTRODUCTION

In one aspect, the present inventions relate to methods of manufacturing microelectromechanical and/or nanoelectromechanical (collectively hereinafter "MEMS" or "microelectromechanical") structures and devices/systems including same; and more particularly, in one aspect, to methods of manufacturing a microelectromechanical structure comprising one or more moveable or resonating members fabricated from highly doped semiconductor. In one embodiment, the semiconductor is silicon, germanium or carbon. The semiconductor may also be compound materials, for example, silicon-germanium. The crystalline structure of the semiconductor material may be monocrystalline or polycrystalline, for instance monocrystalline silicon or polycrystalline silicon or polycrystalline carbon. Notably, polycrystalline, as used herein also refers to nanocrystalline and other non-monocrystalline material forms, for instance diamond-like carbon. The polycrystalline material may be a compound, for instance polycrystalline silicon germanium.

In one embodiment, the one or more moveable or resonating members may be fabricated from monocrystalline silicon having doping concentrations greater than $10^{15}$ cm$^{-3}$, and preferably, between $10^{15}$ cm$^{-3}$ and $10^{21}$ cm$^{-3}$. In another embodiment, the one or more moveable or resonating members of the microelectromechanical structure may be fabricated from monocrystalline silicon having doping concentrations greater than $10^{19}$ cm$^{-3}$, and preferably, between $10^{19}$ cm$^{-3}$ and $10^{21}$ cm$^{-3}$. In a further embodiment, the material may be polycrystalline silicon doped in similar ranges. Such doping concentrations may provide predetermined temperature coefficients of frequency of the moveable or resonating members of the structures.

In the case of a monocrystalline material, when the movable or resonating structures are fabricated at specific angles relative to the orientation of the crystal planes of the material they can have specific or predetermined temperature sensitivity that is a function of the angles and the shape of the structure. Specifically, when the movable structures or resonators are fabricated in highly doped monocrystalline material, they can provide, in operation, both positive and negative temperature coefficients of frequency.

Notably, most semiconductor starting materials (or wafers) include an initial dopant at a predetermined concentration. Those semiconductor starting materials that are not initially doped with an impurity are often referred to as "intrinsic". This initial or "background" concentration of impurities sets the carrier type of the material (e.g. n-type or p-type). The carrier type may be maintained with the higher doping of the same type or can be reversed by doping with a higher level of opposite type, often referred to as counter-doping.

The present inventions may employ any dopant to provide the highly doped semiconductor (for example, monocrystalline silicon). In one embodiment, for example, the dopant provides excess n-type carriers in the moveable or resonating members of the microelectromechanical structure (for example, one or more elements of Group 15 of the periodic table—such as phosphorous, arsenic and/or antimony). In another embodiment the dopant provides excess p-type carriers in the moveable or resonating members (for example, one or more elements of Group 13 of the periodic table—such as boron, gallium and/or indium).

The dopant type and/or doping levels may be selected to provide a predetermined sensitivity of the temperature dependent characteristics of the moveable or resonating members of the microelectromechanical structure. For example, in one embodiment, the dopant type and/or doping levels of the silicon significantly reduce the sensitivity of one or more temperature dependent characteristic of the microelectromechanical structure. In this regard, in most implementations, the resonance frequency of the MEMS resonator should remain substantially stable over a range of operating temperatures. This, however, will not typically be the case as thermally induced changes to the Young's modulus (or other variables) tend to change in the mechanical stiffness of the structure. That is, thermally-induced changes to the Young's modulus tend to cause considerable variation or change in the frequency of the output of the resonator (this change with temperature is sometimes referred to as "drift" or "temperature drift").

Material dimensions and density are examples of other parameters that may change with temperature. Moreover, the MEMS device may be designed and manufactured to, and in operation, compensate the Young's modulus so that the MEMS device varies with temperature in such a predetermined manner as to balance other changes with temperature to minimize and/or control the total or net change. Electronic parameters of the oscillator circuit may also cause temperature sensitivity of frequency, and these too may be compensated in some embodiments. Therefore, the system may be compensated as a whole with resonator doping to produce the desired behavior over temperature.

In another embodiment, the dopant type and/or doping levels may be selected to provide predetermined manufacturing controllability and/or tolerances of the doping operation to reduce and/or control the sensitivity of the temperature dependent characteristics of the one or more moveable or resonating members of the microelectromechanical structure. For example, in this embodiment, although the dopant and/or doping levels do not provide a maximum reduction in the sensitivity of the temperature dependent characteristic of the moveable or resonating members, such dopant type(s) and/or levels provide a sensitivity of the temperature dependent characteristic (for example, temperature coefficient of frequency) over manufacturing variations or tolerances in doping operations or concentrations which is within a predetermined range or limits.

The sensitivity to temperature may be optimized to be small or of a preferred magnitude. For instance a device with a small temperature sensitivity may be advantageous as a reference device whereas one with a larger sensitivity may be advantageous as a temperature sensor.

Notably, in one embodiment, the doping processes (which may employ multiple masking processes) of the moveable or resonating members of the microelectromechanical structure may include a plurality of dopant types and/or a plurality of doping levels, which, in sum, provide a net doping concentration of a predetermined type. For example, the doping processes may include (i) a first dopant type, having a first type of carriers, at first doping level and (ii) a second dopant type, also having the first type of carriers, at a second doping level. Here, the doping processes provide a net doping concentration (which is within a predetermined range) of a predetermined type.

In another embodiment, the doping processes may include counter-doping which includes (i) a first dopant type, having a first type of carriers, at first doping level and (ii) a second dopant type, having a second type of carriers which are opposite the first type of carriers, at a second doping level. In the context of counter-doping, the dominant dopant type and the net doping concentration of the moveable or resonating members of the microelectromechanical structure depend on, among other things, the dopant types and the doping levels of such impurities. Indeed, in another embodiment, the doping processes of the moveable or resonating members of the microelectromechanical structure (which may employ multiple masking processes) may provide a first region of the moveable or resonating members having first dopant type(s) and/or first doping level(s), and a second region of the moveable or resonating members having second dopant type(s) and/or second doping level(s). Here, a portion of the moveable or resonating member may be highly doped with the first dopant type (having the first type of carriers) and another portion of the moveable or resonating member may be highly doped with the second dopant type (having the second type of carriers—which is opposite the first type of carriers).

In another embodiment, the doping process(es) may be "patterned" so that one or more first regions or structures of a MEMS device are doped to a first impurity concentration level and one or more other regions or structures of the device are substantially maintained at background doping level and/or at an impurity concentration level that is/are different from the first region(s) or structure(s). Here, one or more regions/portions of a structure may be doped to a first impurity concentration level while other regions/portions of the structure are not doped and/or are doped differently (for example, a different impurity, impurity level, different gradient and/or impurity type) so that one structure of the device is fabricated from the highly doped semiconductor and another structure is not fabricated from substantially the same highly doped semiconductor (for example, such other structure may be fabricated from material having a impurity concentration that is substantially at the background doping level). In another embodiment, the doping process(es) may be uniform but the structures may have varied dimensions, shapes, proportions, orientations and/or resonant modes. In this way the structures may have different temperature behaviors or may behave differently in other ways. Indeed, the structures need not all be resonators, but can have mixed functions, for instance resonators and thermistors.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or devices in different figures are labeled similarly. It is understood that various combinations of the structures, components, and/or devices, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 3A-3F illustrate cross-sectional views of a portion of the exemplary microelectromechanical structure of FIG. 2 (along dotted line A-A) at various stages of manufacturing, in accordance with certain aspects and/or embodiments of the present inventions, wherein FIG. 3A illustrates a cross-sectional view of substrate prior to formation of the microelectromechanical structure (wherein in this exemplary illustration, the starting substrate may be a semiconductor-on-insulator), FIG. 3B illustrates a cross-sectional view of the microelectromechanical structure after definition or formation (using, for example, well-known lithographic and etching techniques), FIG. 3C illustrates the forming, depositing and/or growing a dopant carrier layer on the moveable or resonating members of the microelectromechanical structure, FIG. 3D illustrates transformation of the semiconductor material of the moveable or resonating members to a highly doped semiconductor material (for example, by transferring and/or driving in impurities from the dopant carrier layer to the semiconductor material of the moveable or resonating members via thermal annealing or heating), FIG. 3E illustrates the moveable or resonating member after removal of dopant carrier layer thereby providing moveable or resonating member comprising a semiconductor material having a high concentration of impurities (for example, a highly doped monocrystalline silicon), and FIG. 3F illustrates release of the moveable member of the microelectromechanical structure via removal of a sacrificial layer of the substrate, in accordance with certain aspects and/or embodiments of the present inventions;

FIGS. 5A-5D illustrate cross-sectional views, along dotted line A-A of the exemplary microelectromechanical structure illustrated in FIG. 2, at various stages of manufacturing, in accordance with certain aspects and/or embodiments of the present inventions, wherein FIG. 5A illustrates a cross-sectional view of the microelectromechanical structure after transfer of impurities from the dopant carrier layer to the moveable or resonating members and prior to release of such members from the substrate (for example, according to the process illustrated in FIGS. 3A-3E, and the text associated therewith), and after providing or depositing a sacrificial layer on the microelectromechanical structure, FIG. 5B illustrates a cross-sectional view after forming, depositing, growing and/or providing an encapsulation layer on and/or over sacrificial layer and prior to release of the microelectromechanical structure from the substrate (via removal or etching of the sacrificial layer from around the microelectromechanical structure), and FIG. 5C illustrates a cross-sectional view after releasing of the microelectromechanical structure from the substrate wherein the sacrificial layers are removed or etched from around microelectromechanical structure thereby substantially or entirely releasing (vertically and horizontally) the moveable or resonating members of the microelectromechanical structure; in one embodiment, the vents are closed and the cavity sealed after releasing microelectromechanical structure, for example, via deposition forming, depositing, growing and/or providing another encapsulation layer (see FIG. 5D); notably, in one embodiment, vents (not illustrated in this series of figures) are formed in encapsulation layer wherein the sacrificial layer is removed around microelectromechanical structure, via the vents, using well known processing techniques;

FIG. 5E illustrates a cross-sectional view of the microelectromechanical structure after providing or depositing a sacrificial layer on the dopant transfer layer, FIG. 5F illustrates a cross-sectional view after releasing of the microelectromechanical structure from the substrate wherein the sacrificial layers and the dopant carrier layer are removed or etched thereby substantially or entirely releasing (vertically and horizontally) the moveable or resonating members of the microelectromechanical structure; in one embodiment, the vents are closed and the cavity sealed after releasing microelectromechanical structure, for example, via deposition forming, depositing, growing and/or providing another encapsulation layer (see FIG. 5G); again, the vents (not illustrated in this series of figures) may be formed in encapsulation layer and the sacrificial layer is removed or etched around microelectromechanical structure using well known processing techniques;

FIGS. 6A-6D illustrate cross-sectional views of a portion of the exemplary microelectromechanical structure of FIG. 2 (along dotted line A-A) at various stages of manufacturing using a substrate of FIG. 3A and the microelectromechanical structure defined or formed as in FIG. 3B, in accordance with certain aspects and/or embodiments of the present inventions, wherein FIG. 6A illustrates the forming, depositing and/or growing a dopant carrier layer on the moveable or resonating members of the microelectromechanical structure, FIG. 6B illustrates transformation of a portion of the semiconductor material of the moveable or resonating members to a highly doped semiconductor material (for example, by transferring and/or driving in impurities from the dopant carrier layer to the semiconductor material of the moveable or resonating members via thermal annealing or heating) thereby providing a portion that is highly doped via transfer of dopants from the carrier layer and a portion that is substantially unaffected by the dopants from the carrier layer, FIG. 6C illustrates a cross-sectional view after removal of the dopant carrier layer from the moveable or resonating members of the microelectromechanical structure, and FIG. 6D illustrates the moveable member of the microelectromechanical structure after release from the substrate via removal of a sacrificial layer of the substrate, in accordance with certain aspects and/or embodiments of the present inventions;

FIGS. 10A-10D illustrate cross-sectional views of a portion of the exemplary microelectromechanical structure of FIG. 9 (along dotted line A-A) at various stages of manufacturing using a substrate of FIG. 3A and the microelectromechanical structure defined or formed as in FIG. 3B, in accordance with certain aspects and/or embodiments of the present inventions, wherein FIG. 10A illustrates the forming, depositing and/or growing a dopant carrier layer on the moveable or resonating members of the microelectromechanical structure and FIG. 10B illustrates transformation of a portion of the semiconductor material of the moveable or resonating members to a highly doped semiconductor material (for example, by transferring and/or driving in impurities from the dopant carrier layer to the semiconductor material of the moveable or resonating members, for example, via thermal annealing or heating) thereby providing moveable or resonating members having different doping concentrations, in accordance with certain aspects and/or embodiments of the present inventions, FIG. 10C illustrates a cross-sectional view after removal or etching of the dopant carrier layer from the moveable or resonating members of the microelectromechanical structure, and FIG. 10D illustrates the moveable member of the microelectromechanical structure after release from the substrate via removal of a sacrificial layer of the substrate, in accordance with certain aspects and/or embodiments of the present inventions;

FIGS. 11A-11D illustrate cross-sectional views of a portion of the exemplary microelectromechanical structure of FIG. 2 (along dotted line A-A) at various stages of manufacturing using a substrate of FIG. 3A and the microelectromechanical structure defined or formed as in FIG. 3B, in accordance with certain aspects and/or embodiments of the present inventions, wherein FIG. 11A illustrates a cross-sectional view after releasing of the microelectromechanical structure from the substrate wherein the sacrificial layer is removed or etched thereby substantially or entirely releasing (vertically and horizontally) the moveable or resonating members of the microelectromechanical structure, FIG. 11B illustrates forming, depositing and/or growing a dopant carrier layer on the moveable or resonating members of the microelectromechanical structure, FIG. 11C illustrates transformation of a portion of the semiconductor material of the moveable or resonating members to a highly doped semiconductor material (for example, by transferring and/or driving in impurities from the dopant carrier layer to the semiconductor material of the moveable or resonating members via thermal annealing or heating) thereby providing a portion that is highly doped via transfer of dopants from the carrier layer and a portion that is substantially unaffected by the dopants from the carrier layer, and FIG. 11D illustrates a cross-sectional view after removal or etching of the dopant carrier layer from the moveable or resonating members of the microelectromechanical structure;

FIG. 12C illustrates a MEMS device and circuitry (which may be related to, employed to operate and/or distinct from the MEMS device) disposed or integrated on a die, wherein the MEMS device is fabricated using the techniques/embodiments of the present inventions; notably, the integrated circuitry may be fabricated during, before and or after manufacture/fabrication of the MEMS device;

FIG. 12D illustrates a die containing a MEMS device, a thermistor having one or more micromachined thermistor structures (as described above) and integrated circuitry (as described above);

FIGS. 12E and 12F illustrate a die containing a MEMS device and a temperature sensing diode;

FIGS. 14A and 14B illustrate cross-sectional views of a portion of the exemplary microelectromechanical structure of FIG. 2 (along dotted line A-A) at various stages of manufacturing using a substrate of FIG. 3A and the microelectromechanical structure defined or formed as in FIG. 3B, in accordance with certain aspects and/or embodiments of the present inventions, wherein FIG. 14A illustrates transformation of a portion of the semiconductor material of the moveable or resonating members to a highly doped semiconductor material (for example, by transferring and/or driving in impurities from the dopant carrier layer to the semiconductor material of the moveable or resonating members, for example, via thermal annealing or heating) thereby providing a portion that is highly doped via transfer of dopants from the carrier layer and a portion that is substantially unaffected by the dopants from the carrier layer, and FIG. 14B illustrates the moveable or resonating member after removal of dopant carrier layer and release of the moveable member of the microelectromechanical structure via removal of a sacrificial layer of the substrate, wherein the removal of the dopant carrier layer and release of the moveable or resonating members are performed substantially concurrently using the substantially the same process and etch materials, in accordance with certain aspects and/or embodiments of the present inventions;

FIGS. 15A-15D illustrate cross-sectional views of a portion of the exemplary microelectromechanical structure of FIG. 2 (along dotted line A-A) at various stages of manufacturing using a substrate of FIG. 3A, in accordance with certain aspects and/or embodiments of the present inventions, wherein FIG. 15A illustrates a cross-sectional view of the microelectromechanical structure after definition or formation (using, for example, well-known lithographic and etching techniques—see, for example, FIG. 3B) and forming, depositing and/or growing a dopant carrier layer on the moveable or resonating members of the microelectromechanical structure, FIG. 15B illustrates impurity dopant of the dopant carrier layer at the surface of the moveable members after removal of the dopant carrier layer but before the dopant is driven from the surface of the moveable members into substantial portions of the semiconductor material of the moveable members via, for example, thermally annealing and/or heating and thereby substantially increasing the doping concentrations of a significant portion of the semiconductor material of the moveable members, FIG. 15C illustrates transformation of the semiconductor material of the moveable or resonating members to a highly doped semiconductor material (for example, by transferring and/or driving-in the dopant impurities from the surface of the semiconductor material of the moveable members, and FIG. 15D illustrates release of the moveable member of the microelectromechanical structure via removal of a sacrificial layer of the substrate, in accordance with certain aspects and/or embodiments of the present inventions;

FIGS. 17A-17E illustrate cross-sectional views of a portion of the exemplary microelectromechanical structure of FIG. 2 (along dotted line A-A) at various stages of manufacturing using a substrate of FIG. 3A, in accordance with certain aspects and/or embodiments of the present inventions, wherein FIG. 17A illustrates a cross-sectional view of the microelectromechanical structure after definition or formation (using, for example, well-known lithographic and etching techniques), FIG. 17B illustrates the forming, depositing and/or growing a dopant carrier layer on the moveable or resonating members of the microelectromechanical structure, FIG. 17C illustrates transformation of the semiconductor material of the moveable or resonating members to a highly doped semiconductor material (for example, by transferring and/or driving in impurities from the dopant carrier layer to the semiconductor material of the moveable or resonating members via thermal annealing or heating), FIG. 17D illustrates the moveable or resonating member after removal of dopant carrier layer thereby providing moveable or resonating member comprising a semiconductor material having a high concentration of impurities (for example, a highly doped monocrystalline silicon), and FIG. 17E illustrates release of the moveable member of the microelectromechanical structure via removal of a sacrificial layer of the substrate, in accordance with certain aspects and/or embodiments of the present inventions;

FIG. 18 illustrates a top view of an exemplary microelectromechanical structure according to certain aspects and embodiments of the present inventions wherein the exemplary microelectromechanical structure includes one or more moveable members fabricated from highly doped semiconductor, wherein one or more of the moveable members include a first portion having a first width and first doping density and a second portion having a second width and a second doping density;

FIGS. 20A-20F illustrate cross-sectional views of a portion of the exemplary microelectromechanical structure of FIG. 2 (along dotted line A-A) at various stages of manufacturing, in accordance with certain aspects and/or embodiments of the present inventions, wherein FIG. 20A illustrates a cross-sectional view of substrate prior to formation of the microelectromechanical structure (wherein in this exemplary illustration, the starting substrate may be a semiconductor-on-insulator) wherein the active substrate includes a first, background and/or initial doping concentration, FIG. 20B illustrates a cross-sectional view of the microelectromechanical structure after definition or formation (using, for example, well-known lithographic and etching techniques), FIG. 20C illustrates the forming, depositing and/or growing an impurity removal or absorption layer on the moveable or resonating members of the microelectromechanical structure, FIG. 20D illustrates transformation of the semiconductor material of the moveable or resonating members by removing impurities from the semiconductor material (for example, via thermal annealing or heating), FIG. 20E illustrates the moveable or resonating member after removal of impurity removal layer thereby providing moveable or resonating member comprising a semiconductor material having a high concentration of impurities (for example, a highly doped monocrystalline silicon), and FIG. 20F illustrates release of the moveable member of the microelectromechanical structure via removal of a sacrificial layer of the substrate, in accordance with certain aspects and/or embodiments of the present inventions;

Figure 1:
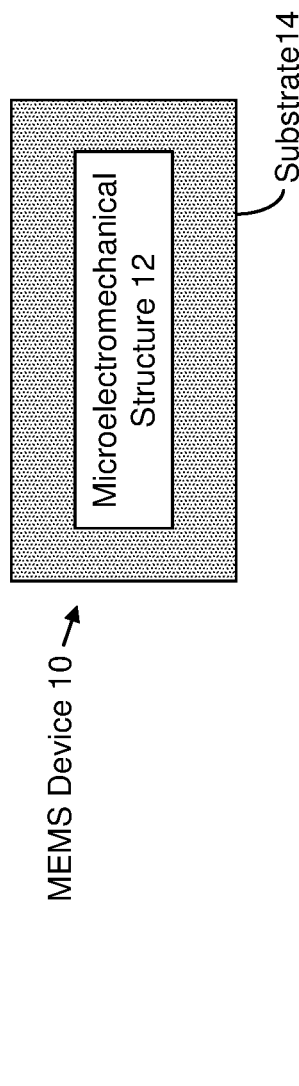
FIG. 1 illustrates a block diagram representation of a microelectromechanical structures (for example, one or more gyroscopes, resonators and/or accelerometers) manufactured according to the present inventions.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

At the outset, it should be noted that there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Further, in the course of describing and illustrating the present inventions, various architectures, structures, components, functions and/or elements, as well as combinations and/or permutations thereof, are set forth. It should be understood that architectures, structures, components, functions and/or elements other than those specifically described and illustrated, are contemplated and are within the scope of the present inventions, as well as combinations and/or permutations thereof.

With that in mind, in one aspect, the present inventions are directed to a method of manufacturing a microelectromechanical structure having one or more moveable or resonating members. The method of manufacture fabricates moveable or resonating members from a substrate (for example, monocrystalline silicon) having a first dopant concentration, using, for example, conventional lithographic and etching techniques. After formation of one or more of the moveable or resonating members, the method of the present inventions deposits, forms, grows and/or provides a dopant carrier layer on the moveable or resonating members. The dopant carrier layer includes n-type or p-type impurities to be incorporated into the material of the moveable or resonating members to substantially increase the impurity doping concentrations of the material of the moveable or resonating members by at least one order of magnitude. In this way, the sensitivity of temperature dependent characteristics of the one or more moveable or resonating members of the microelectromechanical structure is/are reduced, controlled and/or maintained within a predetermined range.

The present inventions may employ any impurity dopant to provide a highly doped semiconductor material of the moveable or resonating members. For example, in one embodiment, the dopant provides excessive n-type carriers in the moveable or resonating members (for example, one or more elements of Group 15 of the periodic table—such as phosphorous, arsenic and/or antimony). In another embodiment, the dopant provides excessive p-type carriers in the moveable or resonating members (for example, one or more elements of Group 13 of the periodic table—such as boron, gallium and/or indium).

The impurity dopant in the dopant carrier layer, during and/or after depositing, forming, growing and/or providing the dopant carrier layer on the moveable or resonating members, is transferred from the dopant carrier layer and to the semiconductor material (for example, monocrystalline silicon) of the moveable or resonating members. In one embodiment, after the dopant carrier layer is deposited on the semiconductor material of the moveable or resonating members, the dopant in the carrier layer is transferred into the semiconductor material of the moveable or resonating members, via thermally annealing and/or heating, to substantially increase the doping concentrations of the semiconductor material of the moveable or resonating members and thereby reduce and/or control the sensitivity of the temperature dependent characteristics of the one or more moveable or resonating members of the microelectromechanical structure. For example, in one embodiment, where the semiconductor material of the moveable or resonating members is formed from monocrystalline silicon and includes an initial n-type impurity concentration of about $10^{13}$ cm$^{-3}$, the present inventions increase the n-type impurity concentration of the monocrystalline silicon of significant portions of the one or more moveable or resonating members to greater than $10^{15}$ cm$^{-3}$ (and preferably, between $10^{15}$ cm$^{-3}$ and $10^{21}$ cm$^{-3}$), and more preferably, to greater than $10^{19}$ cm$^{-3}$ (and preferably, between $10^{19}$ cm$^{-3}$ and $10^{21}$ cm$^{-3}$). Indeed, in yet another embodiment, where the semiconductor material of the moveable or resonating members is formed from monocrystalline silicon and includes an initial n-type impurity concentration of about $10^{19}$ cm$^{-3}$, the present inventions increase the n-type impurity concentration of the monocrystalline silicon of the one or more moveable or resonating members to greater than $6\times10^{19}$ cm$^{-3}$, and preferably between $10^{20}$ cm$^{-3}$ and $10^{21}$ cm$^{-3}$ (i.e., between one-half and two orders of magnitude).

Of course, the aforementioned impurity concentrations are exemplary and the maximum concentration may exceed $10^{21}$ cm$^{-3}$. The concentration may even be at or above the solid-solubility limit. If it is above the solid-solubility limit the dopant may form precipitates, which may be an acceptable condition. The discussion herein of a preferable dopant range does not preclude higher levels. Indeed, if higher levels are found to be advantageous they can be formed as described herein. Values provided here should not be considered limiting to the fabrication processes described here but only exemplary of the values that are presently known to be advantageous. Any concentrations and especially high concentrations of dopant, weather now known to be useful or later determined to be so are considered within the scope of this work. Notably, in another exemplary embodiment, after depositing the dopant carrier layer on the moveable or resonating members—but before the dopant is driven into significant portions of the semiconductor material of the moveable or resonating members, the dopant carrier layer is removed from the moveable or resonating members. In this embodiment, the dopant is driven into the semiconductor material of the moveable or resonating members during or after removal of the dopant carrier layer, for example, via thermally annealing and/or heating. In this way, the doping concentrations of a significant portion of the semiconductor material of the moveable or resonating members are substantially increased. Here, the dopant from the dopant carrier layer is transferred to the exposed surface of the semiconductor material of the moveable or resonating members during deposition of the dopant carrier layer—and, after removal of the dopant carrier layer, the dopant which is substantially at the surface of the semiconductor material of the moveable or resonating members is driven deeper into the semiconductor material of the moveable or resonating members (via, for example, thermally annealing and/or heating) to thereby reduce and/or control the sensitivity of the temperature dependent characteristics of the one or more moveable or resonating members of the microelectromechanical structure.

Figure 2:
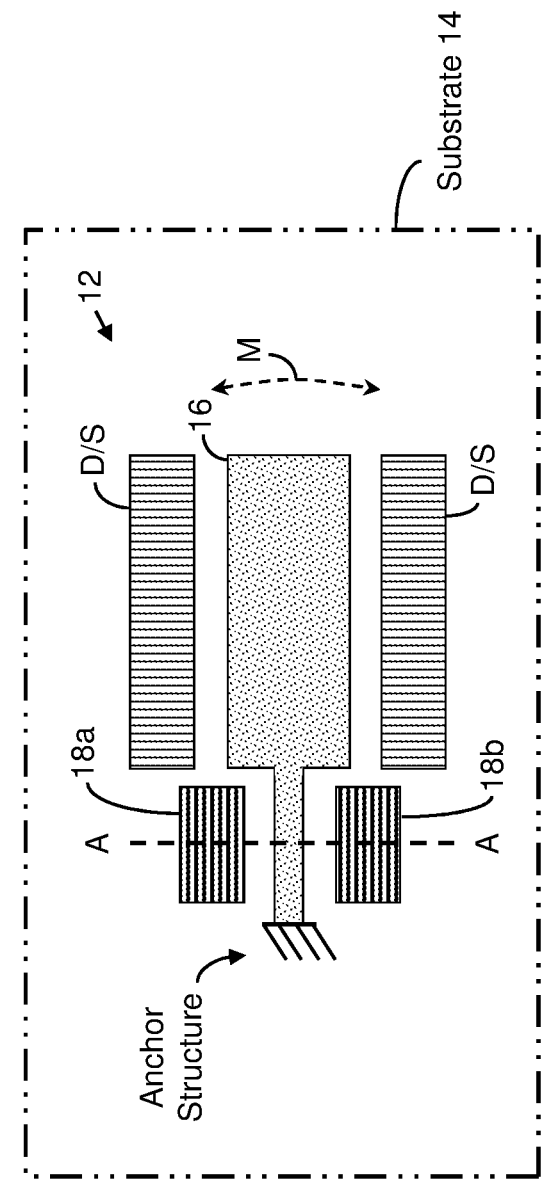
FIG. 2 illustrates a top view of an exemplary microelectromechanical structure according to certain aspects and embodiments of the present inventions wherein the exemplary microelectromechanical structure includes moveable members and stationary members (for example, drive and/or sense electrodes) or field areas (hereinafter, collectively, "stationary members"); notably, the present inventions are applicable to any microelectromechanical structure, including structures where it is advantageous and/or desirable to provide, manage and/or control the sensitivity of the temperature dependent characteristics of the microelectromechanical structure.

With reference to FIGS. 1 and 2, in one embodiment, MEMS device 10 includes microelectromechanical structure 12 which is fabricated or formed in and/or on from substrate 14, for example, a semiconductor on insulator (SOI) substrate (for example, silicon or germanium region/layer/material disposed on or over an insulator region/layer/material (for example, a silicon oxide, silicon nitride and/or combination thereof)) or silicon, (for example, a standard bulk silicon), silicon-germanium, gallium-arsenide. The microelectromechanical structure 12 may include one or more moveable or resonating members and one or more stationary members (for example, drive and/or sense electrodes) and/or field areas (as noted above, such features are collectively described hereinafter as "stationary members"). In this illustrated exemplary embodiment, microelectromechanical structure 12 includes two moveable or resonating members 16 (which are illustrated as moving in-plane—see D) and a plurality of stationary members 18a and 18b (for example sense and/or drive electrodes) to induce and/or sense the motion of moveable or resonating members 16. It should be noted that microelectromechanical structure 12 may include any shape, architecture and/or configuration now known or later developed.

Note that the structure may be a resonator and may be another mechanical or electrical component. Indeed, the structure may be a gyroscope, an accelerometer, a pressure sensor, a microphone, a light sensor, or any of a wide range of devices.

With reference to FIGS. 3A and 3B, the manufacture of microelectromechanical structure 12, in one exemplary embodiment, includes forming or fabricating moveable or resonating member 16 from a semiconductor on insulator (SOI) substrate 14 having a silicon layer 14c disposed on an insulating or sacrificial layer 14b, which is disposed on a "handle" layer 14a (for example, silicon). In this exemplary embodiment, silicon layer 14c may be monocrystalline silicon having a first concentration of n-type impurities (for example, an n-type impurity concentration of about $10^{13}$ cm$^{-3}$). The moveable or resonating member 16 may be formed or fabricated in substrate 14c using conventional lithographic and etching techniques (see channels 20 which defines the moveable or resonating member 16). Indeed, any technique, now known or later developed, may be employed to form or fabricate moveable or resonating member 16 and stationary members 18.

After initially defining or forming one or more of the moveable or resonating members (and, in this exemplary embodiment, the stationary members 18), with reference to FIG. 3C, the method of the present inventions deposits, forms, grows and/or provides dopant carrier layer 22 on moveable or resonating members 16. The dopant carrier layer 22 includes one or more dopants and/or dopant types (n-type or p-type impurities) which are to be incorporated into moveable or resonating members 16. In this exemplary embodiment, dopant carrier layer 22 may be phosphorus oxychloride (POCl$_3$) which is employed as a source of phosphorus (an n-type impurity) to increase the concentration of dopant or impurities in the material of moveable or resonating members 16.

In another embodiment, phosphorus doped silicon glass, PSG, or phosphorus doped spin on glass, SOG may be employed to form carrier layer 22. Similarly, analogs of these with other doping types may be possible.

The carrier layer 22 may or may not fill the trenches and bridge the gaps. When the thickness of carrier layer 22 is large compared to the trench or gap with, as it often is with SOG, then the carrier layer 22 may tend to fill the trenches.

In another embodiment, dopant carrier layer 22 may be a boron doped glass (for example, BSG) which may also be employed as a phosphorus source to increase the amount of dopant in the material of moveable or resonating members 16. In yet another embodiment, the dopant source in the dopant carrier layer 22 may include arsenic—for example, indium arsenide, gallium arsenide, aluminum arsenide or combinations thereof (for example, indium gallium arsenide). Indeed, dopant carrier layer 22 may include any material having one or more dopants and/or dopant types (n-type or p-type impurities) which, during and/or after deposition on the moveable or resonating members 16 is transferred (concurrently or subsequently to layer formation) to the material of moveable or resonating members 16.

With reference to FIG. 3D, during and/or after providing, depositing, forming and/or growing dopant carrier layer 22 on moveable or resonating members 16, the dopants in dopant carrier layer 22 is transferred to or driven into moveable or resonating members 16 (which after transfer or drive-in portions are identified as 16" to reflect or indicate an increase in concentration of dopant within such portion of the material of members 16). In one embodiment, thermally annealing or heating is employed to induce the transfer of the n-type or p-type impurities. For example, where dopant carrier layer 22 is POCl$_3$ and the material of moveable or resonating members 16 is silicon, the phosphorous in the POCl$_3$ dopant carrier layer 22 is transferred from layer 22 to the material of moveable or resonating members 16 thereby increasing the concentration of n-type dopants by one or more orders of magnitude (and preferably, 2-8 orders of magnitude, and more preferably, 6-8 order of magnitude) of the concentration of n-type dopants in the material of moveable or resonating members 16. Indeed, where the base or initial impurity concentration of the material of moveable or resonating members 16 includes an initial n-type impurity concentration of about $10^{19}$ cm$^{-3}$, the increase of the concentration of n-type impurity dopants may be between one-half and two orders of magnitude.

The thickness of the dopant carrier layer 22 may be selected based on, among other things, the amount of dopant to be introduced into the material of moveable or resonating members 16, the transfer or driven processes and/or parameters (for example, the amount of time, atmosphere and/or temperature employed to drive in or transfer the dopant from the carrier layer 22 to the material of moveable or resonating members 16), certain material and structural parameters of moveable or resonating members 16 (for example, the type of material and the height, width and length of the moveable or resonating members 16), and/or the desired temperature dependent characteristics of the one or more moveable or resonating members of the microelectromechanical structure (for example, temperature coefficient of frequency (TCF) of such moveable or resonating members). Indeed, in one embodiment, the concentration of impurities in the material of the moveable or resonating members and/or gradients of such concentrations within the members are/is defined to provide one or more predetermined temperature dependent characteristics of the one or more moveable or resonating members (for example, TCF).

It should be noted that the amount of dopant driven into the structure from carrier layer 22 may be limited and/or controlled by the density of the dopant in carrier layer 22 and/or by the thickness of the carrier layer 22, and/or by other properties of the material of carrier layer 22. The amount of dopant driven into structure 16 may also be limited and or controlled by the time and temperature of the drive-in step and by the material of structure 16. By selecting the limit or control of delivered dopant with one or more of these factors, or in other ways, may lead to more predictable manufacturing or product specification. With these techniques the doping density may be optimized.

Figure 3E:
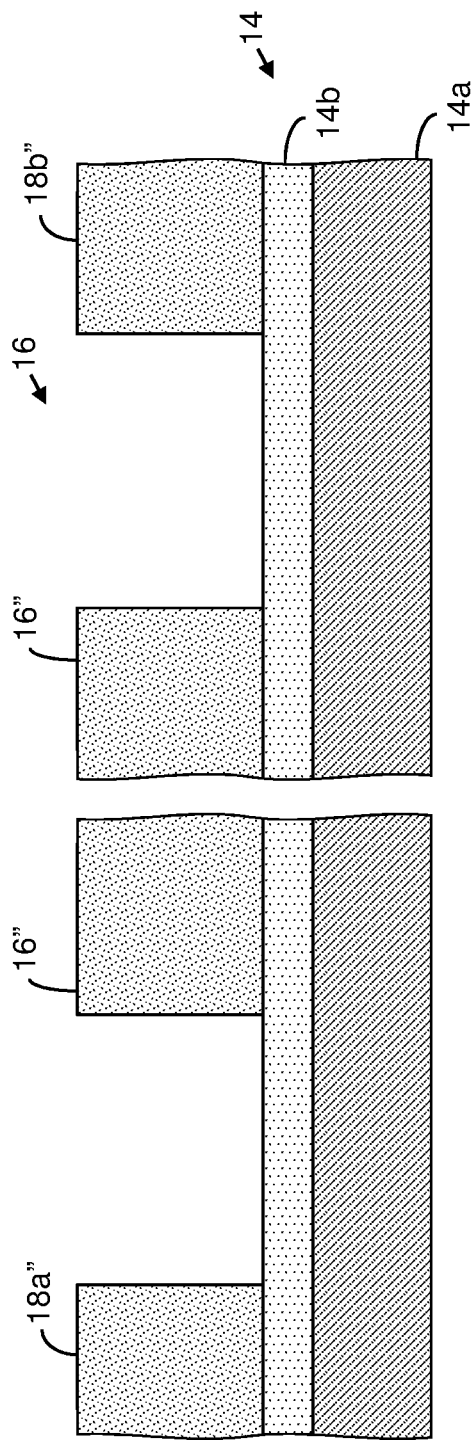
Figure 3F:
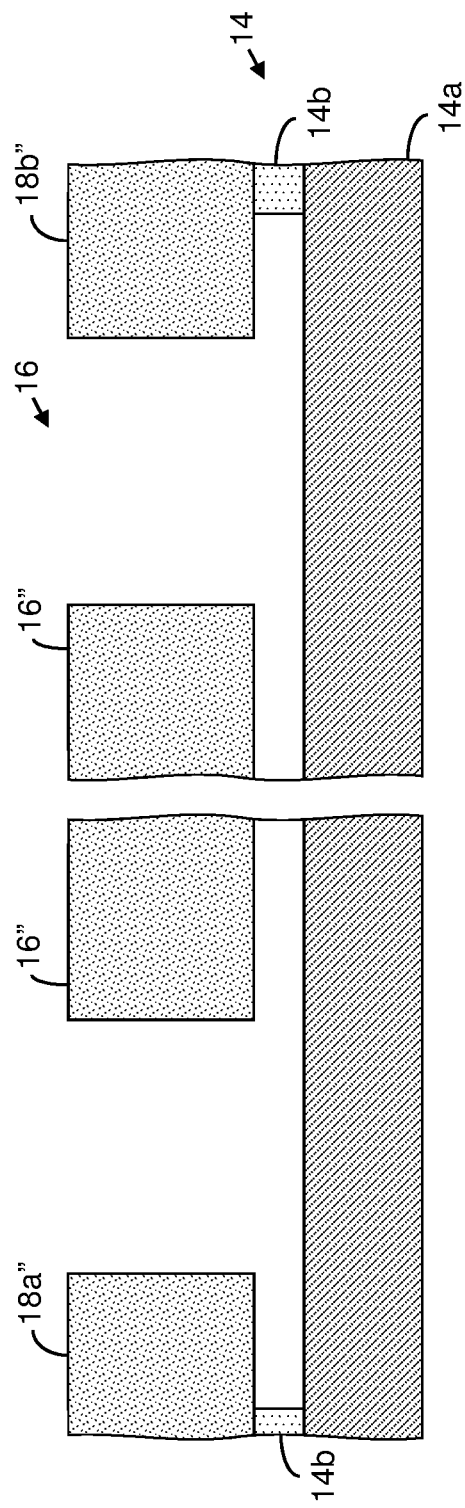

In one embodiment, where the height of the moveable or resonating member 16 is about 18 μm, dopant carrier layer 22 of POCl$_3$ may include a thickness of about 90 nm. With reference to FIG. 3E, after transfer of the impurities or dopants from dopant carrier layer 22 to portions 16" of moveable or resonating members 16, in one embodiment, dopant carrier layer 22 is removed, using, for example, conventional removal techniques—for example, a wet etch process. Concurrently with the removal of the dopant carrier layer, or after such removal, moveable or resonating member 16 may be released (vertically and/or horizontally) from substrate 14 via removal of insulating or sacrificial layer 14b. (See, FIG. 3F).

In another embodiment, the height of moveable or resonator member 16 is about 10 μm the POCl$_3$ carrier layer 22 of may include a thickness of about 50 nm. In some applications the thickness of carrier layer 22 may be thinner or thicker, e.g. nanometers to microns.

Notably, microelectromechanical structure 12 (or selected portions thereof—for example, portions 16" of moveable or resonating members 16) may be sealed or encapsulated in a chamber—thereby protecting microelectromechanical structure 12 from the external environment and/or controlling the environment/conditions (for example, pressure) in which microelectromechanical structure 12 operates/resides. Indeed, prior to, during and/or after sealing the chamber, the environment within the chamber may be defined, for example, via materials and processing techniques that provide predetermined characteristics of the environment in the chamber, for example, predetermined pressure and/or fluid (for example, an inert gas or anti-stiction fluid). (See, for example, U.S. Pat. Nos. 6,930,367, 7,449,355 and 7,514, 283). The environment within the chamber may be defined using any technique now known or later developed.

Figure 5A:
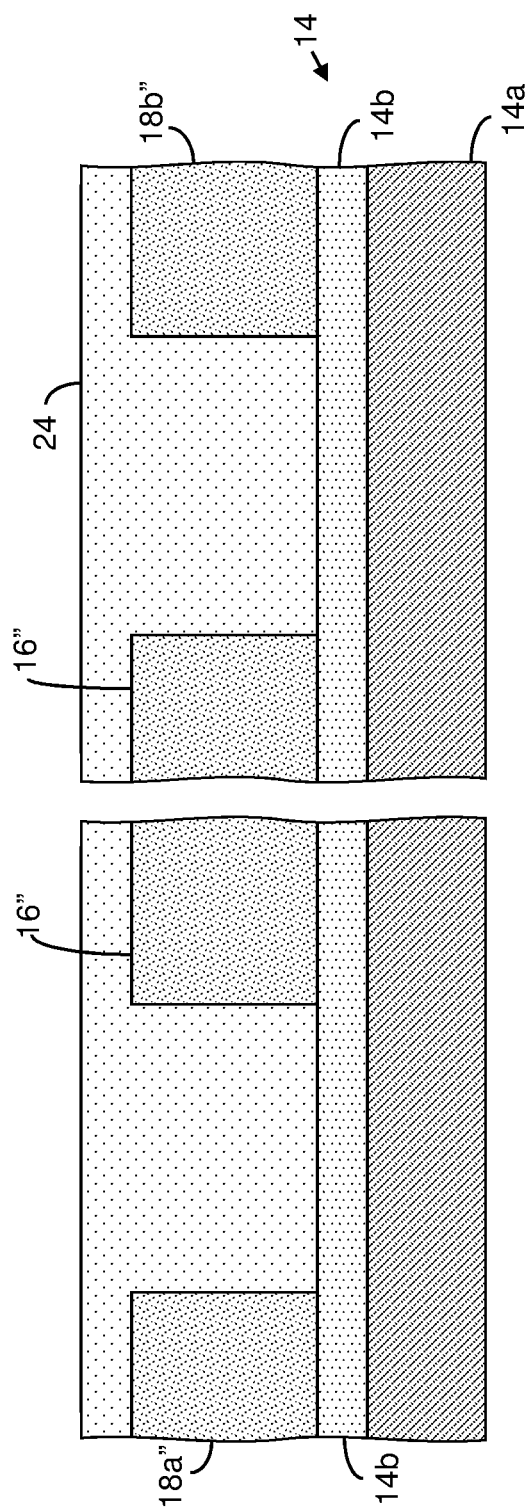
Figure 5B:
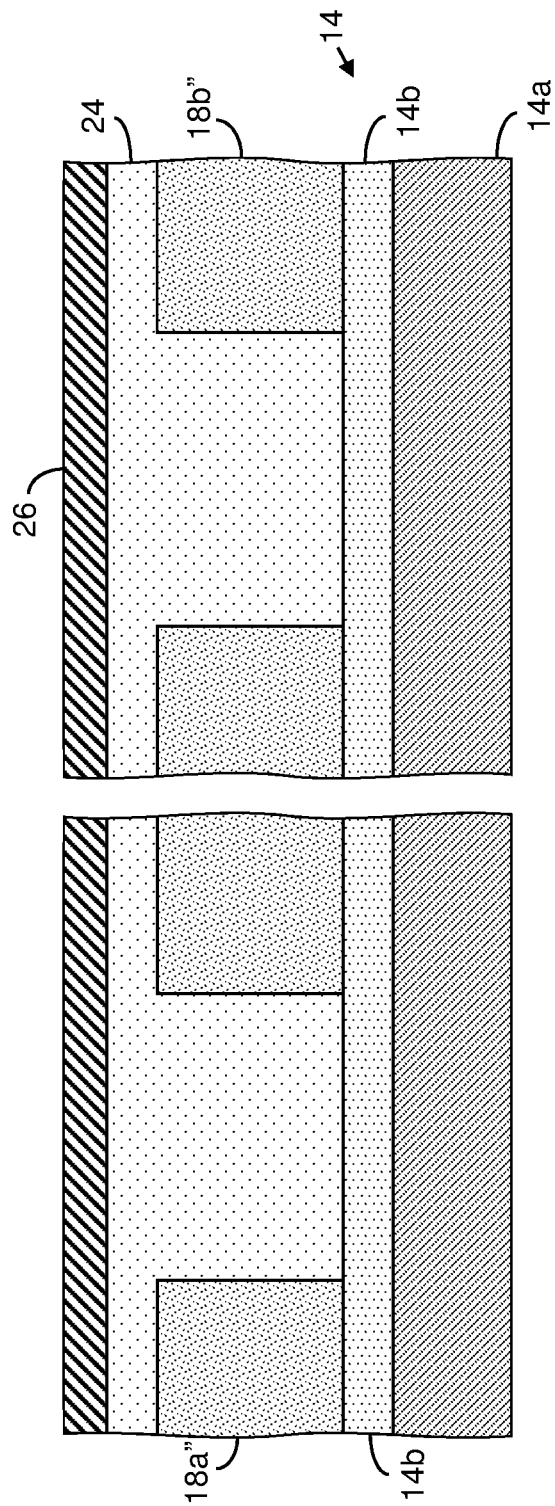
Figure 5C:
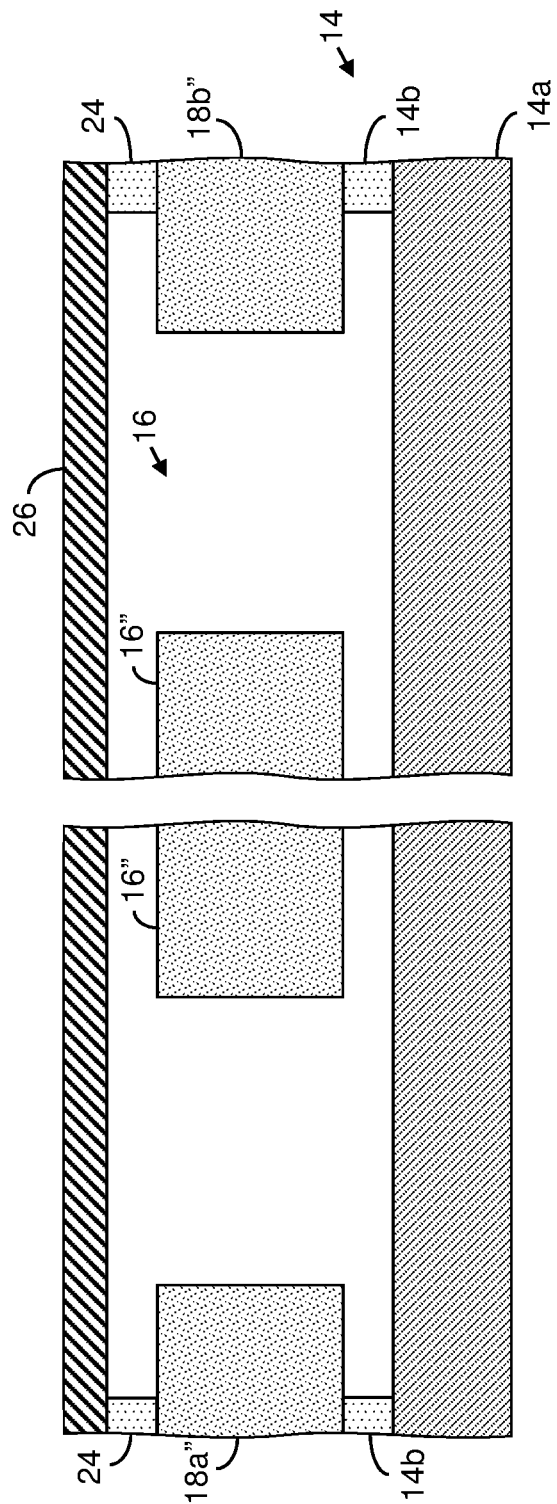
Figure 5D:
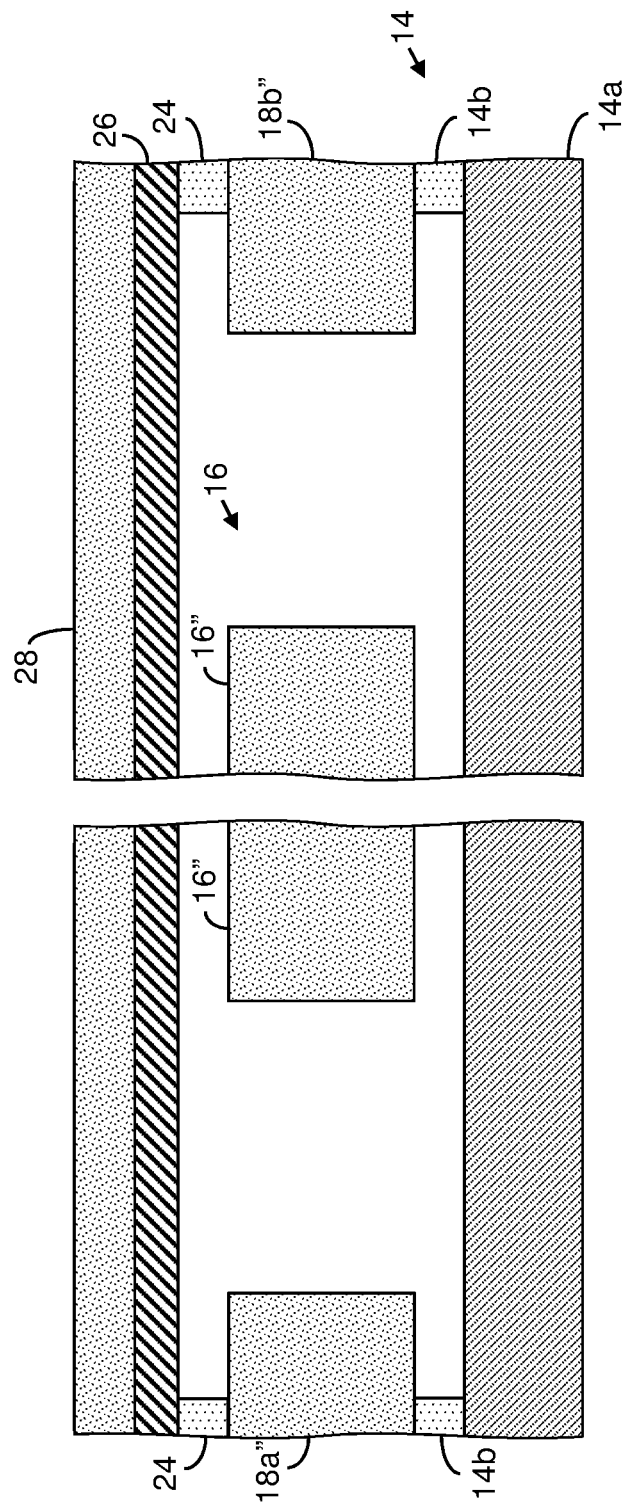
Figure 5E:
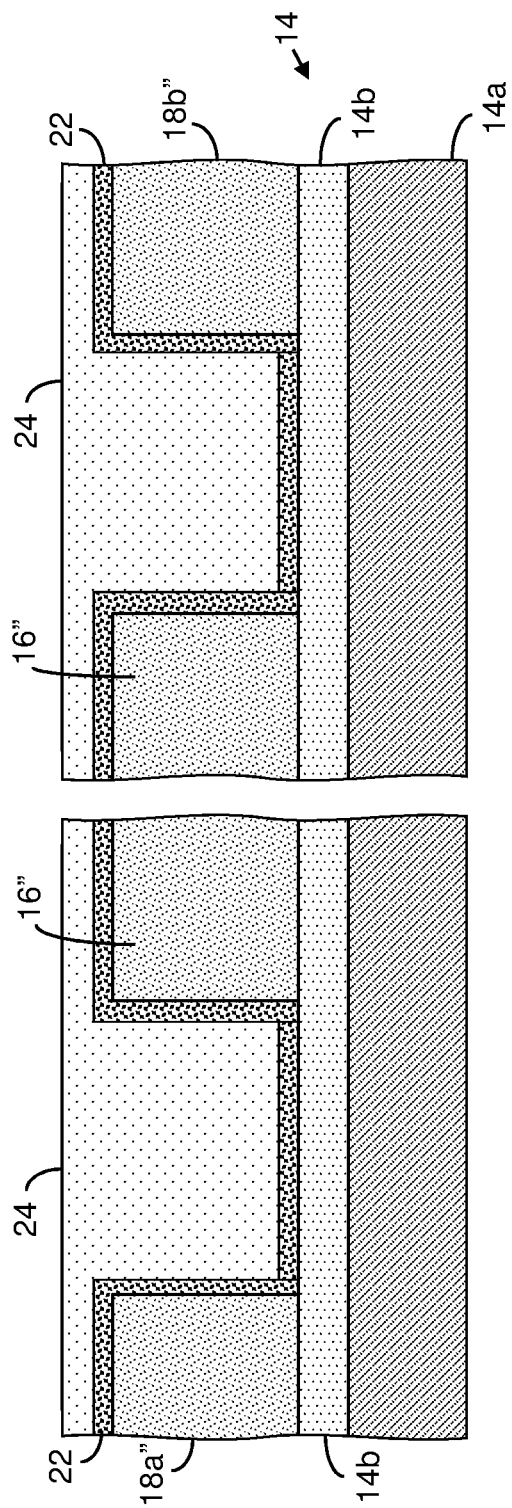
FIGS. 5E-5G illustrate cross-sectional views, along dotted line A-A of the exemplary microelectromechanical structure illustrated in FIG. 2, at various stages of manufacturing, in accordance with certain aspects and/or embodiments of the present inventions, wherein the dopant carrier layer is removed concurrently with sacrificial layers.

In one embodiment, microelectromechanical structure 12 may be sealed in a cavity via thin-film encapsulation process and structure. (See FIG. 5A). Briefly, in one exemplary embodiment, after transfer of impurities or dopants from dopant carrier layer 22 to portions 16" of moveable or resonating members 16 and removal of dopant carrier layer 22 using, for example, a wet etch technique (see, for example, the processes of FIGS. 3A-3E, and the text associated therewith—which, for the sake of brevity, will not be repeated here), a process of fabricating a thin-film encapsulation structure may start with depositing or providing sacrificial layer 24 over microelectromechanical structure 12 (see FIG. 5A). Thereafter, encapsulation layer 26 is provided, for example, formed, deposited and/or grown (see FIG. 5B). Vents (not illustrated in this series of figures) may then be formed in encapsulation layer 26 and sacrificial layers 24 and 14b are removed or etched around moveable or resonating members 16 of microelectromechanical structure 12 (for example, using a vapor etch technique) thereby substantially or entirely releasing (vertically and horizontally) moveable or resonating members 16. (See FIG. 5C). After releasing moveable or resonating members 16, in one embodiment, the vents may be closed and the cavity sealed via another deposition of a layer 28. (See FIG. 5D). A detailed discussion of an exemplary thin film encapsulation technique is described and illustrated in U.S. Pat. Nos. 6,936,491, 7,075,160, and 7,514,283. Notably, the microelectromechanical structure 12 may be sealed or encapsulated using any technique now known or later developed. In one embodiment, the vents may be sealed via attaching a die, wafer or glass substrate (which may include other structures or integrated circuitry thereon) to encapsulation layer 26.

Figure 5F:
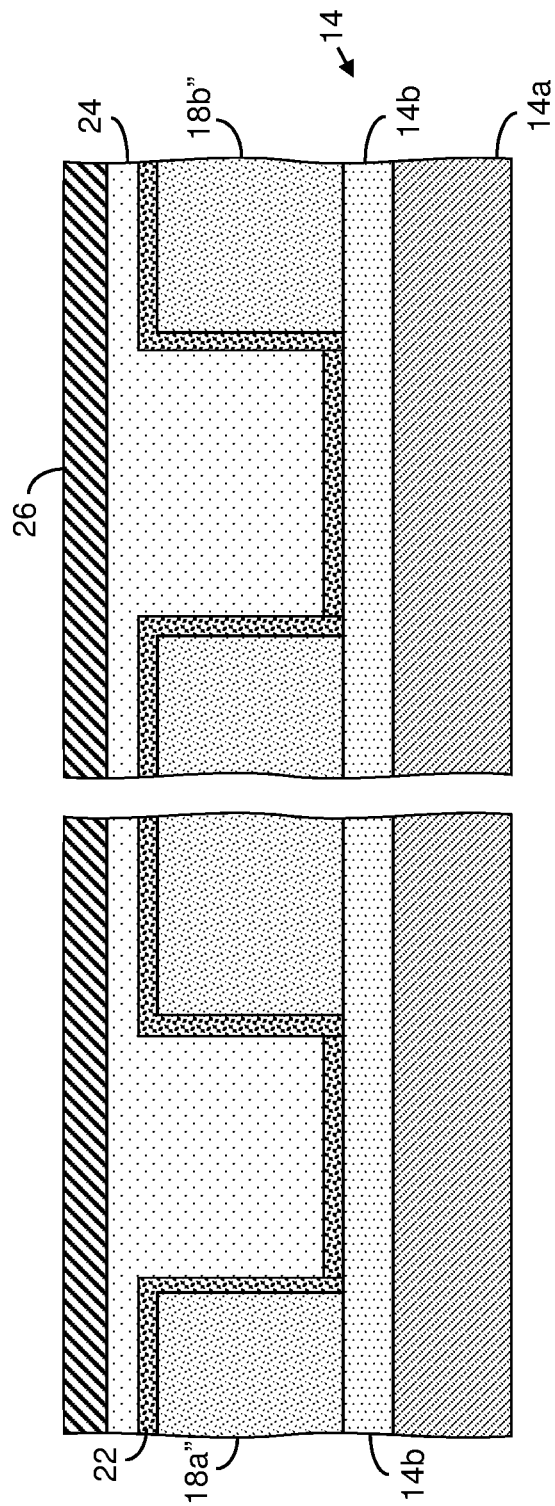
Figure 5G:
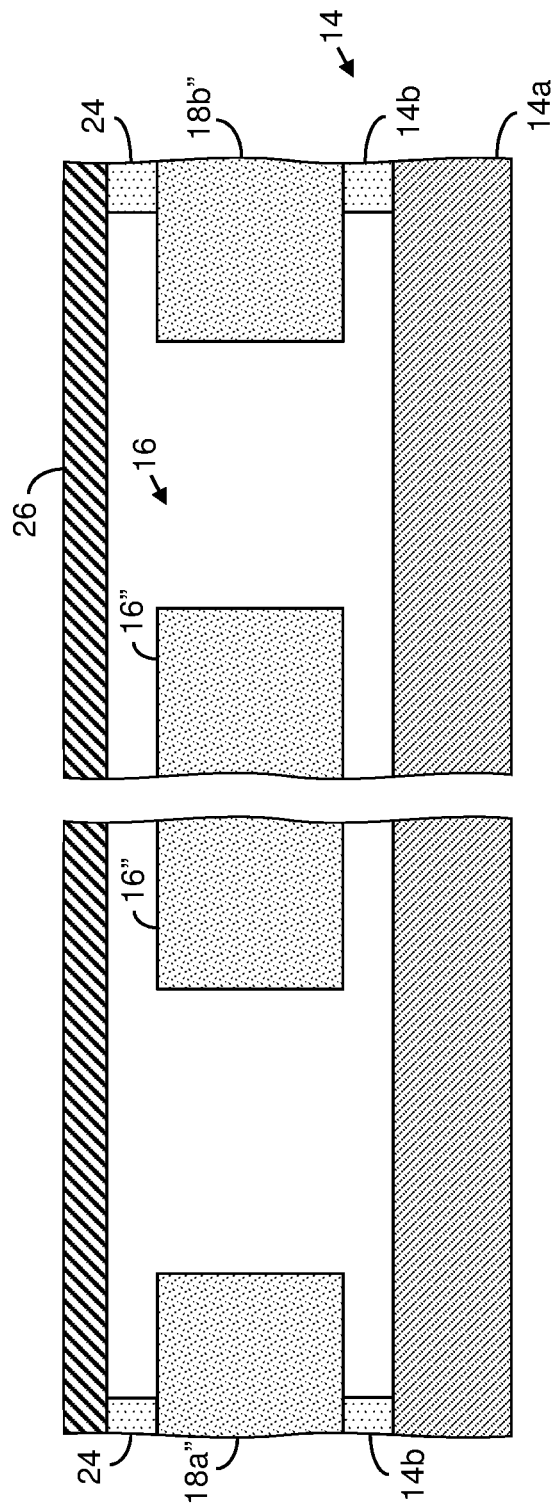
Figure 6C:
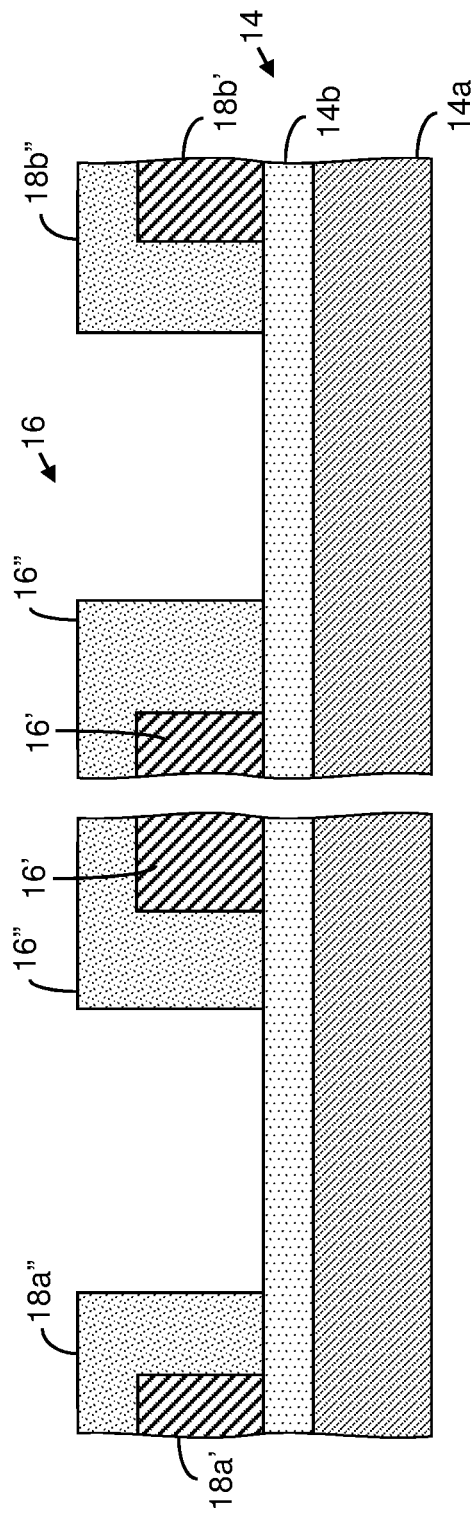
Figure 6D:
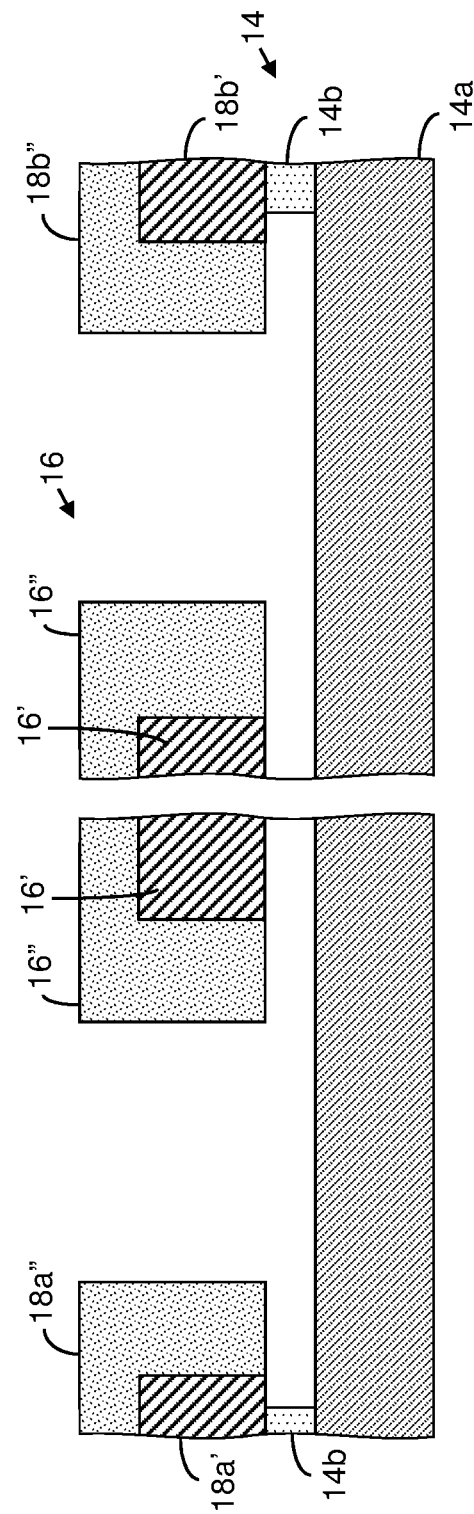

In another exemplary embodiment, the process of fabricating a thin-film encapsulation structure may start with depositing or providing sacrificial layer 24 over microelectromechanical structure 12 prior to removal of dopant carrier layer 22. (See FIG. 5F). Here, before or during depositing or providing sacrificial layer 24 over microelectromechanical structure 12, the impurities or dopants of dopant carrier layer 22 are transferred to portions 16" of moveable or resonating members 16. After encapsulation layer 26 is provided, for example, formed, deposited and/or grown (see FIG. 5F), vents (not illustrated in this series of figures) may then be formed therein and the dopant carrier layer 22 may be concurrently removed with the release of the moveable or resonating member 16, via etching of sacrificial layer 24, dopant carrier layer 22 and sacrificial layer 14b. (See, FIG. 5F). Here, dopant carrier layer 22 is removed substantially concurrently with the release of the moveable or resonating member 16, via etching of sacrificial layers 24 and 14b. (See, FIG. 5G).

In one embodiment, the microelectromechanical structure is unsealed or not encapsulated and thereby directly exposed to the external atmosphere/environment. Indeed, in those embodiments where the microelectromechanical structure is unsealed or not encapsulated, it may be advantageous to include a passivation layer on selected portions of the microelectromechanical structure. In one embodiment, the passivation layer is a silicon oxide and/or a silicon nitride material which is deposited or thermally grown. Such a passivation layer may improve long term stability of the microelectromechanical structure wherein the relationship between temperature and resistance is more stable over the life of the microelectromechanical structure.

Figure 4A:
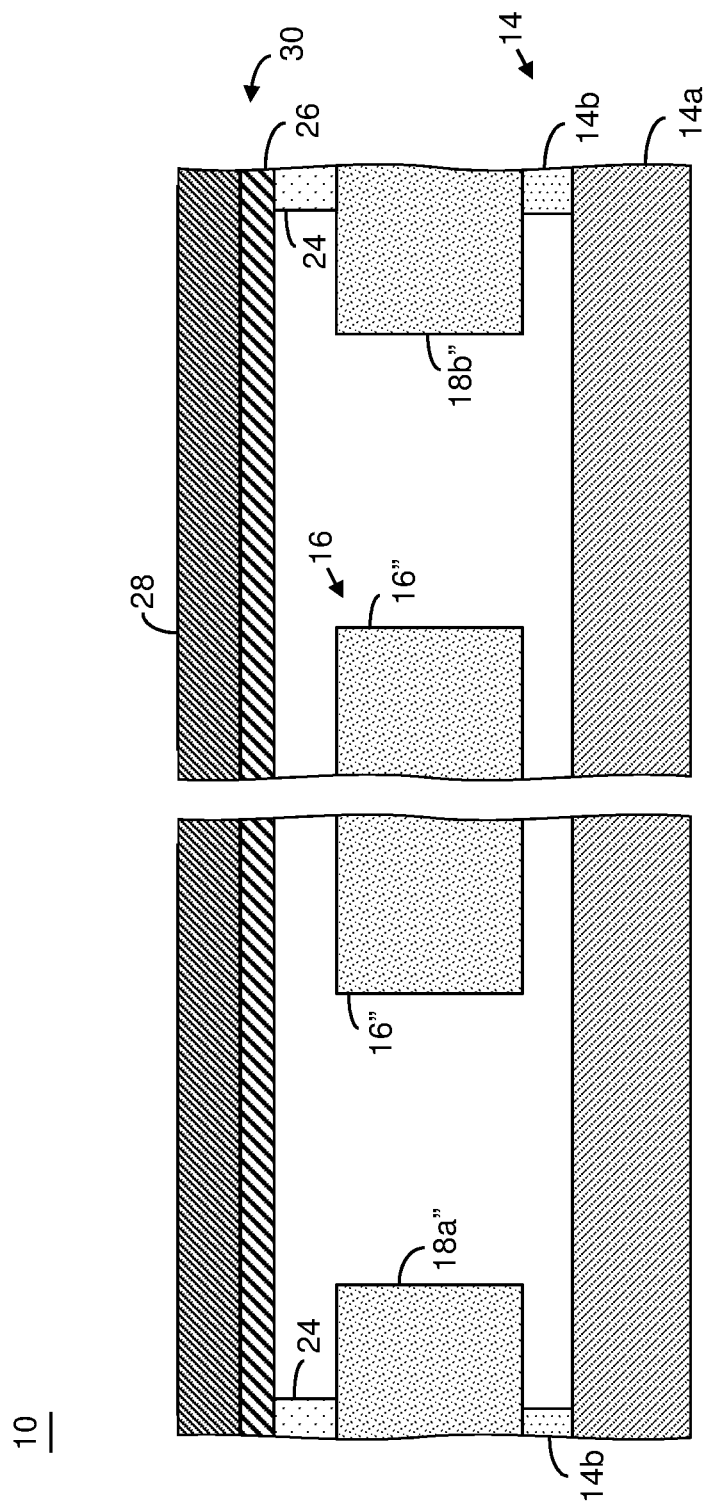
FIG. 4A illustrates a cross-sectional view, along dotted line A-A, of the exemplary microelectromechanical structure illustrated in FIG. 2 wherein the exemplary microelectromechanical structure is disposed in a cavity via thin-film encapsulation structure, in accordance with certain aspects and/or embodiments of the present inventions.
Figure 4B:
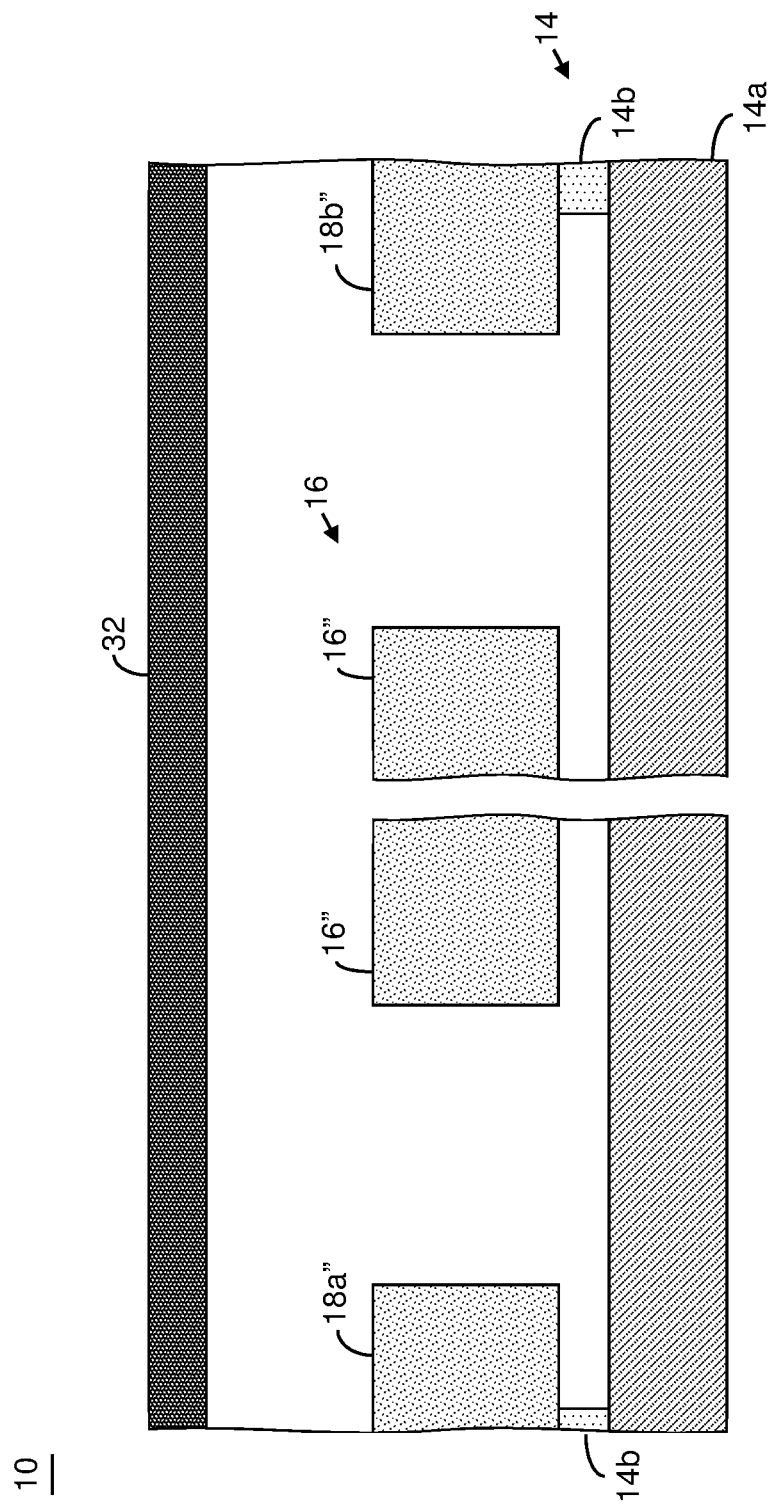
FIG. 4B illustrates a cross-sectional view, along dotted line A-A, of the exemplary microelectromechanical structure illustrated in FIG. 2 wherein the exemplary microelectromechanical structure is sealed, for example, in a TO-8 "can" (or like structure) and/or in a cavity via a silicon glass substrate or wafer bonded to the microelectromechanical structure die or substrate, in accordance with certain aspects and/or embodiments of the present inventions.

In another embodiment, microelectromechanical structure 12 may be sealed, for example, in a TO-8 "can" (or like structure) and/or in a cavity via a wafer or glass substrate 30 bonded to the MEMS device die or substrate. (See, FIG. 4B). In this regard, microelectromechanical structure 12 may be sealed in a chamber, for example, a hermetically sealed metal container (see, for example, U.S. Pat. No. 6,307,815) or bonded to a semiconductor, metal or glass-like substrate having a chamber to house, accommodate or cover microelectromechanical structure 12 (see, for example, U.S. Pat. Nos. 6,146,917, 6,352,935, 6,477,901, and 6,507,082). In the context of the hermetically sealed metal container, the substrate on, or in which, the resistive structure would reside may be disposed in and affixed to the metal container. The hermetically sealed metal container typically serves as a primary package as well.

Notably, as intimated above, after or during sealing of the chamber, an anti-stiction fluid may be incorporated into the chamber. (See, for example, U.S. Pat. Nos. 6,930,367 and 7,449,355). In this way, the anti-stiction characteristics of the moveable or resonating members of the microelectromechanical structure 12 may be enhanced.

In one embodiment, a manufacturing process in accordance with the present invention provides an impurity concentration gradient within the material of the moveable or resonating members of the microelectromechanical structure. For example, in one embodiment, the impurity concentration gradient is greater than one order of magnitude from an exposed portion of the moveable or resonating members to a more inner or core portion thereof; in other embodiments the impurity concentration gradient is greater than two and three orders of magnitude. In this regard, the impurity concentration gradient within the material of the moveable or resonating members is substantial.

With reference to FIGS. 6A-6D, in one embodiment, after formation of the moveable or resonating members of the microelectromechanical structure, dopant carrier layer 22 is deposited, formed, grown and/or provided on the moveable or resonating members 16 (and, in this embodiment, on stationary members 18a and 18b as well—although such regions may be masked if desired). Here again, dopant carrier layer 22 may include n-type or p-type impurities to be incorporated into the material of moveable or resonating members 16 to substantially increase the impurity doping concentrations of the material of moveable or resonating members 16 by at least one order of magnitude.

During and/or after depositing, forming, growing and/or providing the dopant carrier layer on moveable or resonating members 16, the impurity dopant in dopant carrier layer 22 is transferred to the semiconductor material (for example, monocrystalline silicon) of moveable or resonating members 16. In one embodiment, dopant in carrier layer 22 is transferred into the semiconductor material of moveable or resonating member via thermally annealing and/or heating. (See, for example, FIG. 6B). In this embodiment, the concentration of impurities in portion 16" of moveable or resonating member is substantially greater than in portion 16' of the moveable or resonating member. As such, in this embodiment, the impurity concentration gradient within the material of the moveable or resonating member is substantial (greater than or equal to one or more of magnitude). For example, where the semiconductor material of the moveable or resonating members is formed from monocrystalline silicon and includes an initial n-type impurity concentration of about $10^{13}$ cm$^{-3}$, in one embodiment, after thermal annealing or drive-in, the n-type impurity concentration of the monocrystalline silicon of portion 16" of moveable or resonating member is greater than $10^{19}$ cm$^{-3}$ (and preferably, between $10^{19}$ cm$^{-3}$ and $10^{21}$ cm$^{-3}$) and the n-type impurity concentration of the monocrystalline silicon of portion 16' is less than $10^{18}$ cm$^{-3}$ (and, in another embodiment, is less than $10^{17}$ cm$^{-3}$ or $10^{16}$ cm$^{-3}$). In another exemplary embodiment, where the semiconductor material of the moveable or resonating members is formed from monocrystalline silicon and includes an initial n-type impurity concentration of about $10^{19}$ cm$^{-3}$, after thermal annealing or drive-in, the n-type impurity concentration of the monocrystalline silicon of portion 16" of moveable or resonating member is greater than $10^{20}$ cm$^{-3}$ (and preferably, between $10^{20}$ cm$^{-3}$ and $10^{21}$ cm$^{-3}$) and the n-type impurity concentration of the monocrystalline silicon of portion 16' is less than $10^{20}$ cm$^{-3}$. (and preferably, between $10^{19}$ cm$^{-3}$ and $10^{20}$ cm$^{-3}$).

As in the previous embodiment, dopant carrier layer 22 may be removed before or concurrently with release of moveable or resonating members 16. (See, FIGS. 6C and 6D). For the sake of brevity that discussion will not be repeated in detail.

Notably, the impurity concentration gradient (for example, phosphorous, boron or arsenic) in the moveable or resonating members may be determined based on, among other things, the thickness of the dopant carrier layer, the concentration of dopant in the carrier layer to be introduced into the material of moveable or resonating members, the transfer or driven processes and/or parameters (for example, the amount of time, atmosphere and/or temperature employed to drive in or transfer the dopant from the carrier layer to the material of moveable or resonating members), certain base material and structural parameters of moveable or resonating members (for example, the type of material and the height, width and length of the moveable or resonating members), and/or the desired, selected and/or predetermined temperature dependent characteristics of the one or more moveable or resonating members of the microelectromechanical structure (for example, temperature coefficient of frequency (TCF) of such moveable or resonating members).

In one embodiment, manufacturing processes according to another aspect of the present inventions provides different (i) concentrations of dopant impurities, (ii) dopant impurities and/or (iii) impurity concentration gradient in the materials of different moveable or resonating members of the microelectromechanical structure. For example, with reference to FIG. 7, in one embodiment, moveable or resonating member 16a includes a first concentration of dopant impurities, first dopant impurities and/or first impurity concentration gradient in the materials thereof whereas moveable or resonating member 16b includes a second concentration of dopant impurities, second dopant impurities and/or second impurity concentration gradient in the materials thereof. In one embodiment, the processes (which may employ multiple masking processes) of the microelectromechanical structure may include a plurality of different dopant carrier layers (each having, for example, different impurity dopant types and/or doping concentrations). For example, after formation of the moveable or resonating members of the microelectromechanical structure, the different dopant carrier layers may be sequentially deposited, formed, grown and/or provided on associated selected portions of the moveable or resonating members using multiple masking steps (and, in this embodiment, on stationary members as well—although such regions may be masked if desired).

Figure 7:
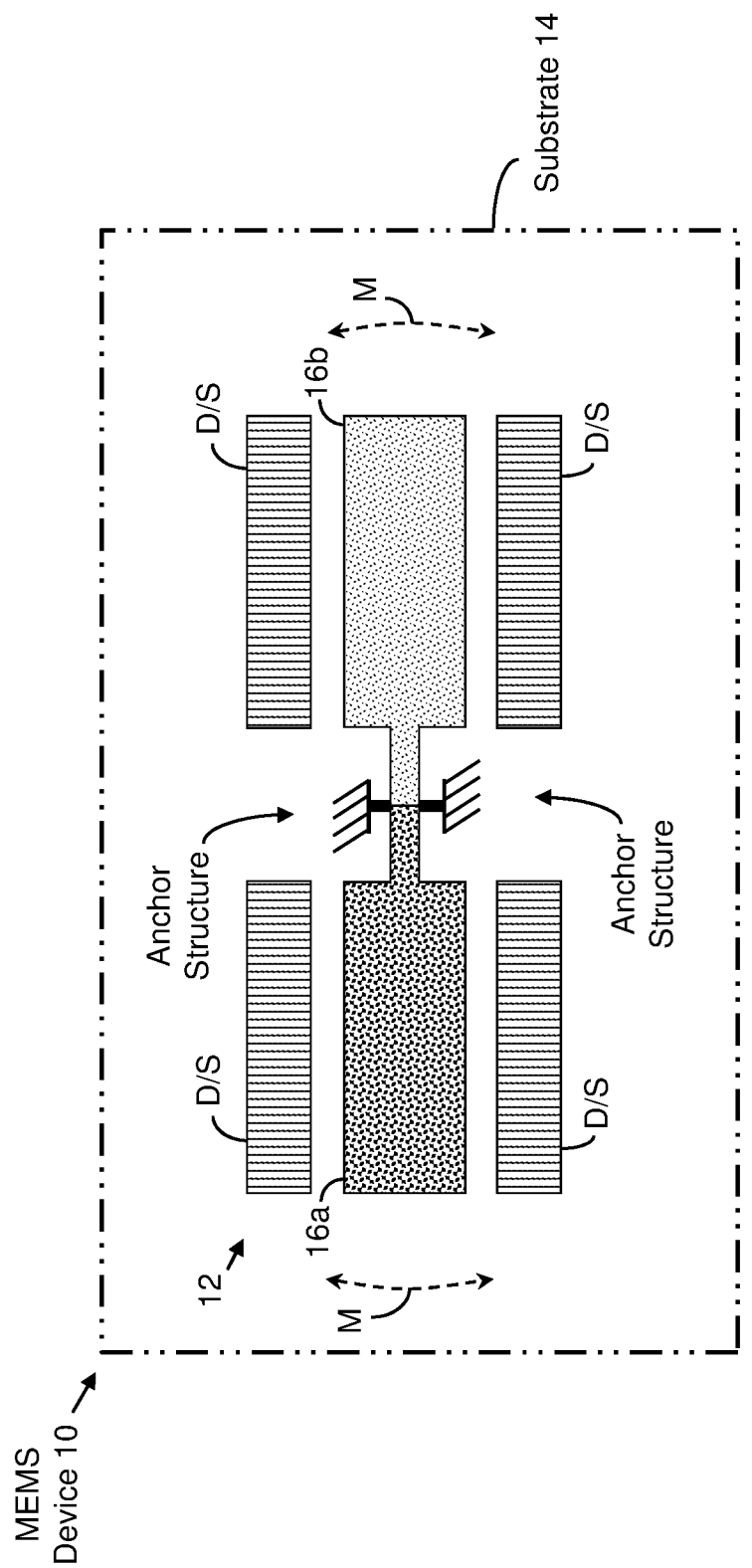
FIG. 7 illustrates a top view of an exemplary microelectromechanical structure according to certain aspects and embodiments of the present inventions wherein the exemplary microelectromechanical structure includes moveable members and stationary members (for example, drive and/or sense electrodes), and/or field area (as noted above, such features are collectively described hereinafter as "stationary members"); notably, a moveable member of the structure may be fabricated from a highly doped semiconductor (for example, silicon) having different gradients of doping than a different moveable members of the structure.

For example, with reference to FIG. 7, in one embodiment, microelectromechanical structure 12 may be fabricated by providing, depositing, forming and/or growing a dopant carrier layer on moveable or resonating member 16a while a mask layer protects moveable or resonating member 16b. Thereafter, the mask layer protecting moveable or resonating member 16b may be removed and a second dopant carrier layer may be provided, deposited, formed and/or grown on moveable or resonating member 16b. In this way, the moveable members may include different (i) concentrations of dopant impurities, (ii) dopant impurities and/or (iii) impurity concentration gradient in the materials of different moveable or resonating members of the microelectromechanical structure.

Notably, a second masking layer may or may not be provided on and/or over the dopant carrier layer on moveable or resonating member 16a while the second dopant layer is provided, deposited, formed and/or grown on moveable or resonating member 16b. Moreover, the impurity dopants of the first dopant carrier layer may be transferred to moveable or resonating member 16a before, during and/or after impurity dopants of the second dopant carrier layer are transferred to moveable or resonating member 16b.

Figure 8:
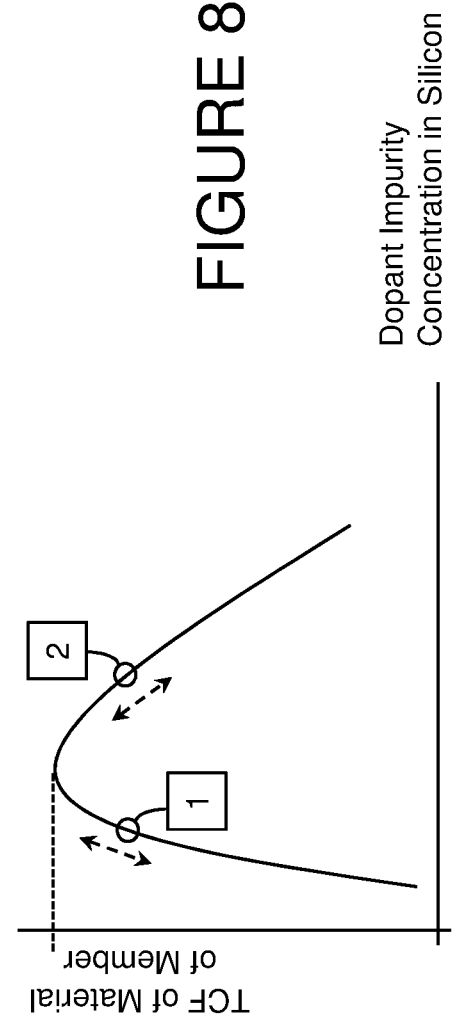
FIG. 8 is a graphical illustration of a relationship of an impurity doping concentration in silicon versus temperature coefficient of frequency (TCF) for silicon, wherein the dashed arrows reflect potential changes in TCF due to changes in impurity concentrations within the material of the includes moveable or resonating members of an exemplary microelectromechanical structure.

Indeed, in one embodiment, the impurity concentration(s) in the material of the moveable or resonating members and/or gradients of such concentrations within the members are/is defined to provide predetermined net temperature dependent characteristics of the one or more moveable or resonating members (for example, TCF) so that over a given manufacturing tolerance and operating temperature range, the one or more predetermined temperature dependent characteristics are within a predetermined range. Here, the microelectromechanical structure may be manufactured (using, for example, the techniques described herein) to provide a (1) first moveable or resonating member having a first impurity concentration and/or a first impurity gradient and (2) a second moveable or resonating member includes a second impurity concentration having a second impurity gradient. The impurity concentrations and impurity gradients may be selected to provide a net temperature dependent characteristics of the one or more moveable or resonating members (for example, TCF) so that over a given manufacturing tolerance and operating temperature range. For example, with reference to FIG. 8, the materials of one or more of the moveable or resonating members may include impurity concentration which provides a TCF associated with "1" and the materials of one or more other/different moveable or resonating members of the microelectromechanical structure may include impurity concentration which provides a TCF associated with "2". In this way, where the doping impurity concentrations changes due to, for example, manufacturing tolerances of the various processes, the overall or net temperature dependent characteristics of the one or more moveable or resonating members (for example, TCF) remain relatively constant and/or within a predetermined range. Here, any changes in impurity concentration(s) in moveable or resonating members associated with "1", due to, for example, manufacturing controllability and/or tolerances, may offset related changes in impurity concentration(s) in moveable or resonating members associated with "2".

Notably, although the impurity concentration(s) and/or gradients of such concentrations may not provide a maximum or preferred reduction in the sensitivity of the temperature dependent characteristic of the moveable or resonating structure, such impurity concentration(s) and/or gradients of such concentrations provide a sensitivity of the temperature dependent characteristic (for example, thermally-induced changes to the Young's modulus which tends to cause considerable drift or change in the frequency of the output of a microelectromechanical resonator) over manufacturing variations or tolerances in processes which is within a predetermined range or limits.

Figure 9:
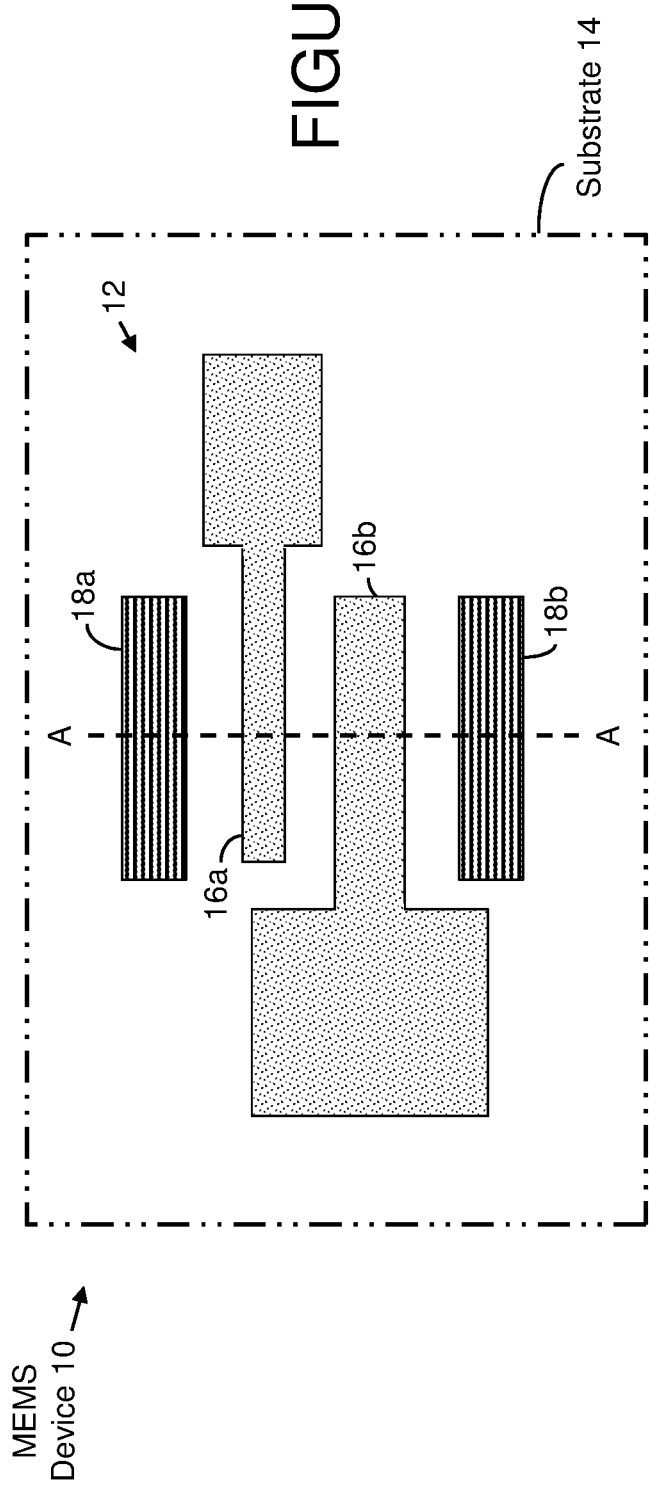
FIG. 9 illustrates a top view of an exemplary microelectromechanical structure according to certain aspects and embodiments of the present inventions wherein the exemplary microelectromechanical structure includes one or more moveable members fabricated from a highly doped semiconductor having a first doping density (of a first dopant type) and one or more moveable members having a doping density (of the first dopant type) which is different from the first doping density.

In another embodiment, the microelectromechanical structure is designed and manufactured such that a first moveable or resonating member includes a first impurity concentration having a first impurity gradient and a second moveable or resonating member includes a second impurity concentration having a second impurity gradient. In this way, the first and second moveable or resonating members include one or more different temperature dependent characteristics. For example, with reference to FIG. 9, in one embodiment, moveable or resonating member 16a includes an impurity concentration having a first impurity gradient which is different from second moveable or resonating member 16b includes a second impurity concentration having a second impurity gradient. With reference to FIGS. 10A-10D, in one embodiment, microelectromechanical structure 12 of FIG. 9 may be manufactured using techniques similar to those described above with respect to FIG. 6. That is, after formation of the moveable or resonating members 16a and 16b, dopant carrier layer 22 is deposited, formed, grown and/or provided thereon (and, in this embodiment, on stationary members 18a and 18b as well—although such regions may be masked if desired). As noted herein, dopant carrier layer 22 may include n-type or p-type impurities to be incorporated into the material of moveable or resonating members 16a and 16b to increase the impurity doping concentrations of the material thereof.

During and/or after depositing, forming, growing and/or providing dopant carrier layer 22 on moveable or resonating members 16a and 16b, the impurity dopant in dopant carrier layer 22 is transferred to the semiconductor material (for example, monocrystalline silicon) of moveable or resonating members. (See, for example, FIG. 10B). In one embodiment, impurities in carrier layer 22 are transferred into the semiconductor material of moveable or resonating member via thermally annealing and/or heating. In this embodiment, the concentrations of impurities in portion 16a" and 16b" of moveable or resonating member 16a and 16b, respectively, are substantially greater than in portion 16b' of moveable or resonating member. Moreover, the impurity concentration within the material of portions 16a" of moveable or resonating member 16a may be greater than or equal to impurity concentration within the material of portions 16b" of moveable or resonating member 16b. For example, where the semiconductor material of the moveable or resonating members is formed from monocrystalline silicon and includes an initial n-type impurity concentration of about $10^{13}$ $cm^{-3}$, in one embodiment, after transfer of the impurity dopants from carrier layer 22, the n-type impurity concentration of the monocrystalline silicon of portions 16a" and 16b" of moveable or resonating member is greater than $10^{19}$ $cm^{-3}$ (and preferably, between $10^{19}$ $cm^{-3}$ and $10^{21}$ $cm^{-3}$) and the n-type impurity concentration of the monocrystalline silicon of portion 16b' is less than $10^{18}$ $cm^{-3}$ (and, in another embodiment, is less than $10^{17}$ $cm^{-3}$ or $10^{16}$ $cm^{-3}$).

Notably, dopant carrier layer 22 may be removed before or concurrently with release of moveable or resonating members 16. (See, FIGS. 6C and 6D). For the sake of brevity that discussion will not be repeated in detail.

Figure 11A:
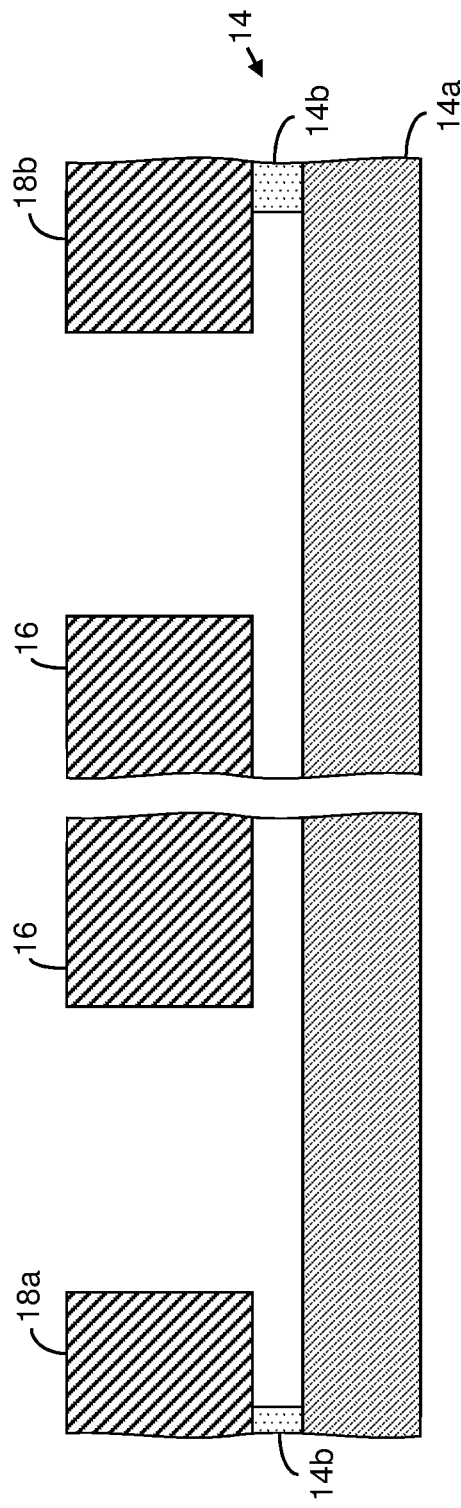
Figure 11B:
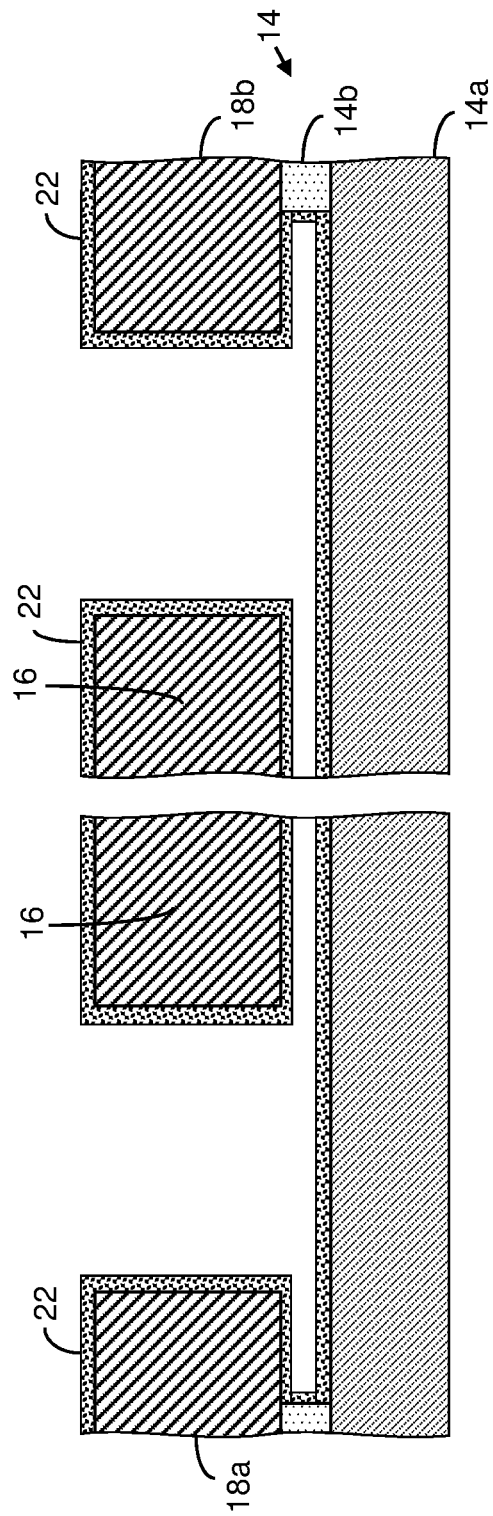

In another embodiment, the dopant carrier layer may be deposited, formed, grown and/or provided on the moveable or resonating members after such moveable or resonating members are released. For example, with reference to FIGS. 11A-11D, in one embodiment, after defining or forming one or more of the moveable or resonating members (and, in this exemplary embodiment, stationary members 18), and releasing moveable or resonating members 16, an exemplary method of the present inventions may deposit, form, grow and/or provide dopant carrier layer 22 on moveable or resonating members 16. (See, FIGS. 11A and 11B). The dopant carrier layer 22 includes one or more impurity dopants and/or types (n-type or p-type impurities) which are to be incorporated into moveable or resonating members 16. In one exemplary embodiment, dopant carrier layer 22 may be phosphorus oxychloride ($POCl_3$) which, as discussed herein, is employed as a source of phosphorus (an n-type impurity) to increase the concentration of dopant or impurities in the material of moveable or resonating members 16.

Figure 11C:
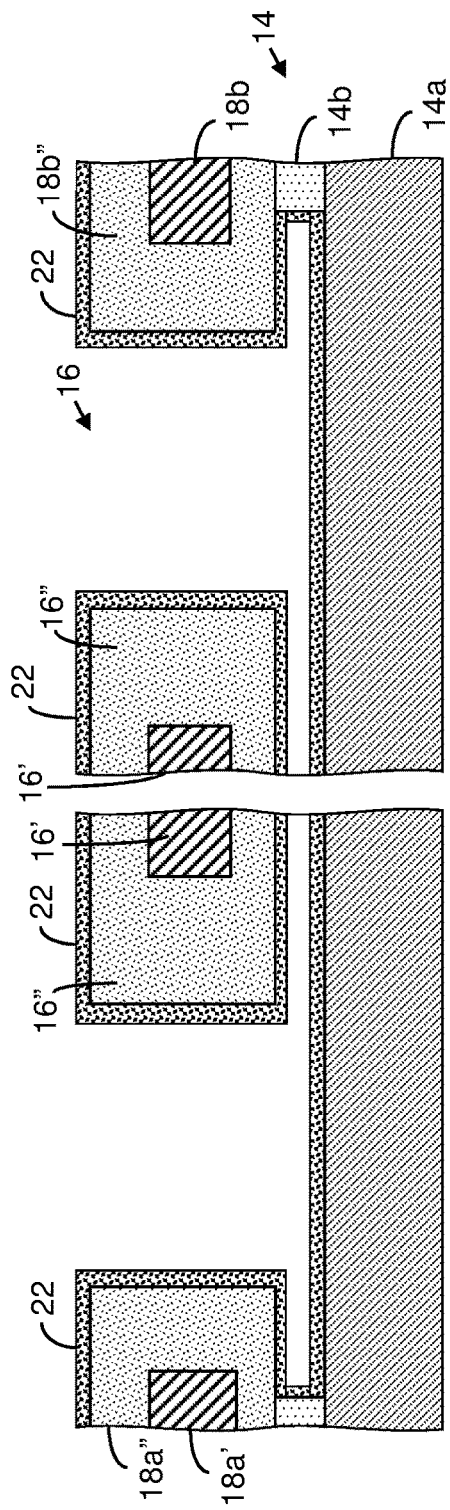

With reference to FIG. 11C, during and/or after providing, depositing, forming and/or growing dopant carrier layer 22 on moveable or resonating members 16, the dopants in dopant carrier layer 22 are transferred to or driven into moveable or resonating members 16 (which after transfer or drive-in are identified as 16" to reflect or indicate an increase in concentration of dopant within the material of portions 16' of members 16). In one embodiment, thermally annealing or heating is employed to induce the transfer of the impurities into moveable or resonating members 16. For example, where dopant carrier layer 22 is $POCl_3$ and the material of moveable or resonating members 16 is silicon, the phosphorous in the $POCl_3$ dopant carrier layer 22 is transferred from layer 22 to the material of moveable or resonating members 16 thereby increasing the concentration of n-type dopants by one or more orders of magnitude of the concentration of n-type dopants in the material of moveable or resonating members 16. In this embodiment, providing dopant carrier layer 22 over a greater surface of moveable or resonating members 16 facilitates an increase in dopants and uniformity thereof within moveable or resonating members 16. In this way, the amount of time to provide a predetermined the concentration of impurities in the material of the moveable or resonating members and/or gradients of such concentrations within the members (which provides one or more predetermined temperature dependent characteristics of the one or more moveable or resonating members (for example, TCF)) may be reduced.

Figure 11D:
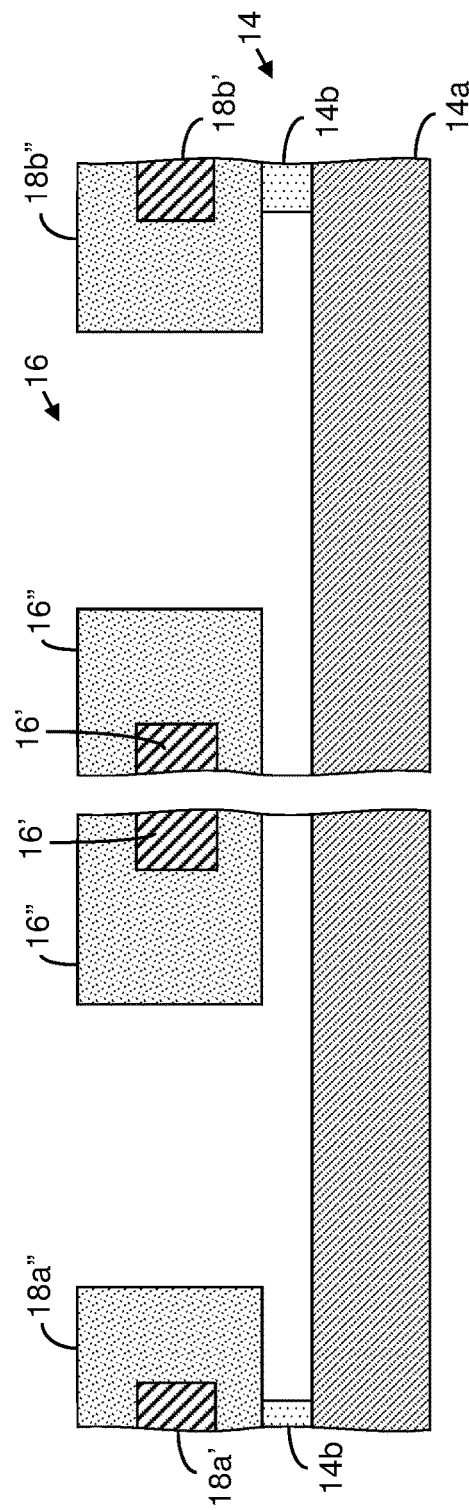

With reference to FIG. 11D, after transfer of the impurities or dopants from dopant carrier layer 22 to moveable or resonating members 16, in one embodiment, dopant carrier layer 22 may be removed, using, for example, conventional removal techniques—for example, a wet etch process.

Notably, although many of the exemplary embodiments described and illustrate providing, depositing, forming and/or growing dopant carrier layer 22 on moveable or resonating members 16 before releasing such members from the substrate, such exemplary embodiments are applicable to and may employ a process of dopant carrier layer 22 being provided, deposited, formed and/or grown on the released moveable or resonating members 16. For the sake of brevity, such exemplary embodiments having a dopant carrier layer 22 being provided, deposited, formed and/or grown on the released moveable or resonating members 16 will not be repeated.

Figure 12A:
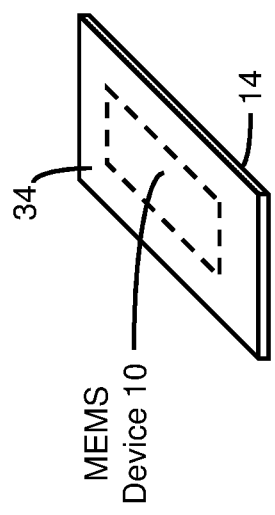
FIG. 12A illustrates a MEMS device including one or more microelectromechanical structures (for example, one or more gyroscopes, resonators and/or accelerometers), manufactured in accordance with aspects and/or embodiments of the present inventions, and fabricated, manufactured or integrated on a die with a circuitry.

The MEMS device of the present inventions may be a discrete device. For example, MEMS device 10, including a microelectromechanical structure manufactured in accordance with any of the techniques described and/or illustrated herein, may be formed in and/or on die 34 (for example, any of the embodiments described and/or illustrated herein, including any combinations and permutations thereof). (See, for example, FIG. 12A). The MEMS device 10 may include one or more microelectromechanical structures 12.

Figure 12B:
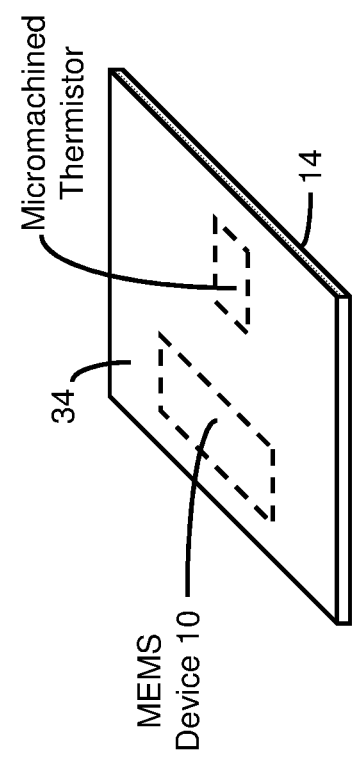
FIG. 12B illustrates a MEMS device and thermistor having one or more micromachined thermistor structures (in accordance with aspects and/or embodiments of the inventions of Provisional Application Ser. No. 61/533,148, which is incorporated in its entirety herein by reference) fabricated, manufactured or integrated on a die with a circuitry, wherein the MEMS device is fabricated using the techniques/embodiments of the present inventions and the thermistor structures may be fabricated using or include any of the aspects and/or embodiments of the inventions of Provisional Application Ser. No. 61/533,148.

In another embodiment, the MEMS device of the present inventions may be fabricated on a die having one or more other devices, structures and/or circuits. For example, in one embodiment, MEMS device 10 may be manufactured on die 34 including one or more micromachined thermistor structures (like that described and illustrated in Provisional Application Ser. No. 61/533,148, Inventor: Arft et al., filed Sep. 9, 2011, the contents of which are incorporated herein by reference). (See, for example, FIGS. 12B and 12D).

The MEMS device 10 may be integrated in, on and/or above a substrate 14 which includes circuitry. (See, for example, FIGS. 12C and 12D). For example, the MEMS device 10 may be a MEMS resonator and the integrated circuitry may be clock generation circuitry including one or more phase locked loops (PLLs), delay locked loops (DLLs), digital/frequency synthesizer (for example, a direct digital synthesizer ("DDS"), frequency synthesizer, fractional synthesizer and/or numerically controlled oscillator) and/or frequency locked loops (FLLs).

Figure 13:
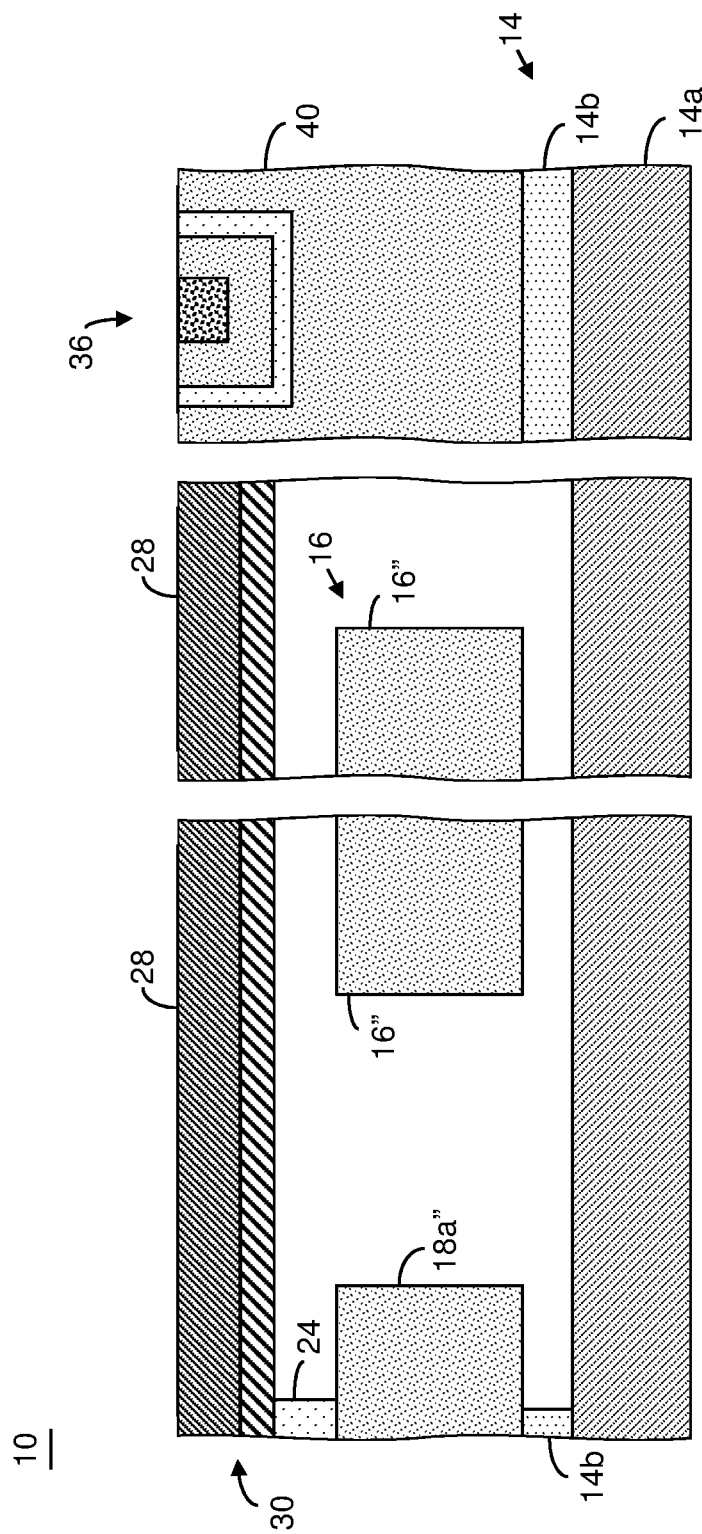
FIG. 13 illustrates a cross-sectional view of an exemplary microelectromechanical structure wherein the exemplary microelectromechanical structure is disposed in a cavity via thin-film encapsulation structure and a temperature sensing diode is disposed in field region which is laterally displaced from the microelectromechanical structure (see, for example, FIGS. 12E and 12F), in accordance with certain aspects and/or embodiments of the present inventions.

In another embodiment, MEMS device includes one or more temperature sensing active devices, for example, temperature sensing diodes or transistors. For example, with reference to FIGS. 12E and 12F, MEMS device 10 may be integrated in, on and/or above a substrate 14 which includes a temperature sensing active device 36. Such temperature sensing active device 36 may be one or more temperature sensing diodes, which is/are fabricated in and/or from the heavily doped semiconductor material in periphery or field areas 40 of MEMS device 10. (See, for example, FIG. 13). Here, in one embodiment, the opposite regions may be fabricated by counter-doping the heavily doped material or using a mask while doping material of the moveable or resonating member and thereafter doping the masked/undoped region with a dopant providing a type of material that is opposite the heavily doped material. Notably, all techniques for fabricating the one or more temperature sensing active devices are intended to fall within the scope of the present inventions.

Thus, the MEMS structures of the present inventions may be a discrete device or integrated on a substrate or die with one or more other structures (for example, one or more MEMS structures). In addition thereto, or in lieu thereof, the MEMS resonator structure may be integrated with circuitry as an integrated circuit type device. In this regard, the MEMS resonator structure of the present inventions (which may have one or more MEMS resonator structure) may be integrated on a die including integrated circuitry and/or one or more other MEMS resonator structure(s).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the doping processes may include counter-doping which includes (i) a first dopant type at first doping level and (ii) a second dopant type (which is opposite the first dopant type) at a second doping level. In the context of counter-doping, the dominant dopant type and the net doping concentration of the MEMS resonator structure depend on, among other things, the dopant types and the doping levels of such impurities. Indeed, in another embodiment, the doping processes of the MEMS resonator structure (which may employ multiple masking processes) may provide a first region of the MEMS resonator structure having first dopant type(s) and/or first doping level(s), and a second region of the MEMS resonator structure having second dopant type(s) and/or second doping level(s).

Further, the present inventions may employ any dopant and/or any "carrier" of the dopant to provide the highly doped semiconductor (for example, monocrystalline silicon). In one embodiment, for example, the dopant provides excess n-type carriers in the moveable or resonating members of the microelectromechanical structure (for example, one or more elements of Group 15 of the periodic table—such as phosphorous, arsenic and/or antimony). In another embodiment the dopant provides excess p-type carriers in the moveable or resonating members (for example, one or more elements of Group 13 of the periodic table—such as boron, gallium and/or indium). Further, in one embodiment, the "carrier" is a doped silicon glass (for example, phosphorous or boron doped silicon dioxide) and/or a doped silicon (for example, a germanium, phosphorous or boron doped silicon). Any carrier, now known or later developed, may be employed in connection with these inventions.

Moreover, the manufacturing process described herein is generally not limited to a particular order. For example, as described above, the dopant carrier layer may be provided, deposited, formed and/or grown before, during and/or after release of the moveable or resonating members. Moreover, the dopant carrier layer may be removed before, concurrently with, or after the sacrificial layer of the substrate. (See, for example, FIGS. 14A and 14B wherein dopant carrier layer 22 is removed substantially currently with (and using the same materials (etchants) and/or techniques of removal of sacrificial layer 14b and release of moveable or resonating members 16).

Indeed, as mentioned above, the dopant carrier layer may be removed before the dopant of the dopant carrier layer is driven into the semiconductor material of the moveable or resonating members via thermally annealing and/or heating. For example, with reference to FIGS. 15A and 15B, in another exemplary embodiment, after depositing, growing, forming and/or providing dopant carrier layer 22 on moveable or resonating members 16—but before transferring/driving or substantially transferring/driving dopant impurities from dopant carrier layer 22 into the semiconductor material of moveable or resonating members 16, dopant carrier layer 22 is removed thereby leaving dopant impurities 38 substantially at the surface of the semiconductor material of moveable or resonating members 16 (see FIG. 15B). During removal of dopant carrier layer 22, or thereafter, the dopant impurities at the surface are driven into other portions of the semiconductor material of moveable or resonating members 16 via, for example, thermally annealing and/or heating (see FIG. 15C) and thereby substantially increasing the doping concentrations of a selected or significant portion of the semiconductor material of the moveable or resonating members (which after transfer or drive-in portions are identified as 16″ to reflect or indicate an increase in concentration of dopant within such portion of the material of members 16).

As such, in this embodiment, dopant impurities 38 from dopant carrier layer 22 are transferred to the surface of the semiconductor material of moveable or resonating members 16 during deposition, growth and/or formation of dopant carrier layer 22—and, after (or during) removal of dopant carrier layer 22, dopant impurities 38 which are substantially at the surface of the semiconductor material of moveable or resonating members 16 are transferred/driven deeper into the semiconductor material of the moveable or resonating members (for example, via thermally annealing and/or heating) to thereby reduce and/or control the sensitivity of the temperature dependent characteristics of the one or more moveable or resonating members of the microelectromechanical structure. During or after dopant impurities 38 are driven deeper into the semiconductor material of moveable or resonating members 16, moveable or resonating members 16 may be released via removal of portions of sacrificial layer 14b. (See FIG. 15D).

Indeed, the technique of removing the dopant carrier layer prior to transferring/driving or substantially transferring/driving dopant impurities from the dopant carrier layer into the semiconductor material of the moveable or resonating members may provide a resulting structure having a lower concentration of dopant impurities at the surface (after transfer or drive-in) relative to those resulting structures manufactured using techniques that remove or etch the dopant carrier layer after transfer or drive-in.

Notably, the doping techniques illustrated in FIGS. 15A-15D may employ any of dopant distribution techniques described and/or illustrated herein. For example, one or more first regions or structures of a MEMS device may be doped using the techniques described in connection with FIGS. 15A-15D to provide a first impurity concentration level of regions of the moveable or resonating members which are different from the impurity concentration level of other regions of such members. (See, for example, FIGS. 10D, 11D and 14D). That is, one or more regions/portions of the structure may be doped to a first impurity concentration level while other regions/portions of the structure are not doped and/or are doped differently (for example, a different impurity, impurity level, different gradient and/or impurity type). For the sake of brevity, such discussions will not be repeated.

Further, as mentioned above, manufacturing processes of the present inventions may provide different (i) concentrations of dopant impurities, (ii) dopant impurities and/or (iii) impurity concentration gradient in the materials of different moveable or resonating members of the microelectromechanical structure. (See, for example, FIG. 7).

As mentioned above, MEMS device 10 may include one or more MEMS structures and may be any shape or device now known or later developed. For example, the MEMS device may include one or more structures to provide a gyroscope, resonator and/or accelerometer, made in accordance with well-known fabrication techniques, such as lithographic and other precision fabrication techniques, which form mechanical components to a scale that is generally comparable to microelectronics.

Figure 16:
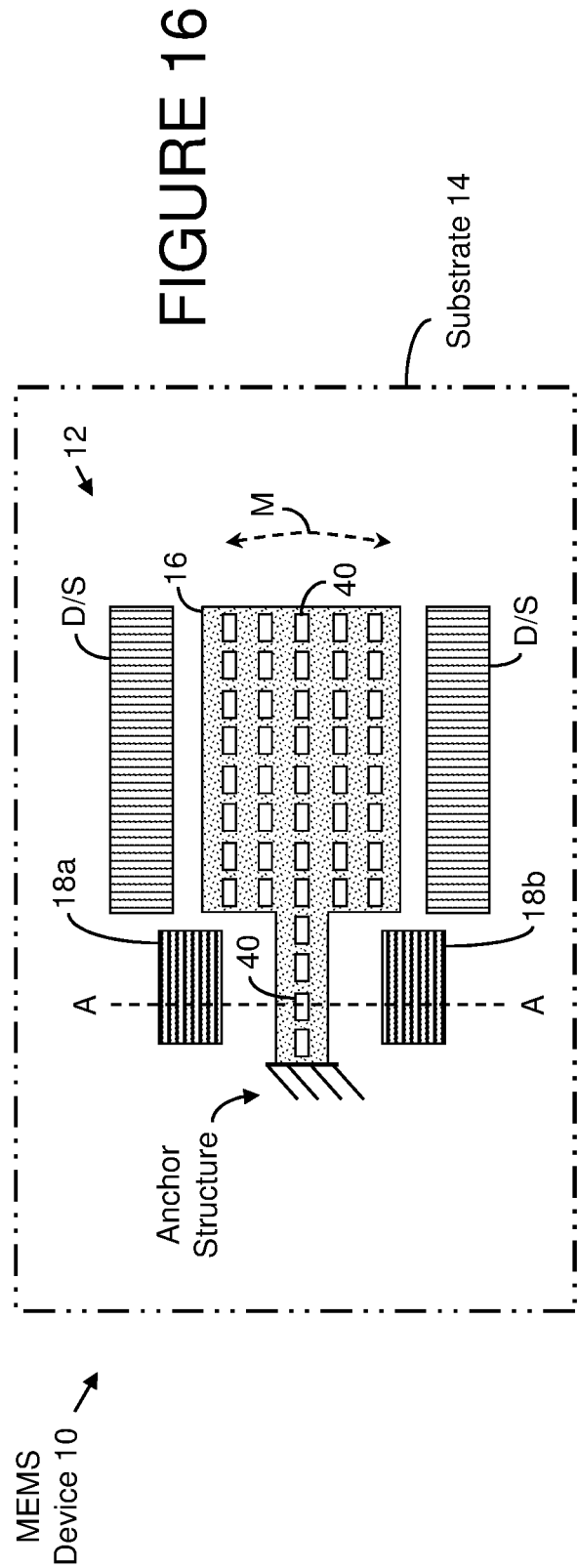
FIG. 16 illustrates a top view of an exemplary microelectromechanical structure according to certain aspects and embodiments of the present inventions wherein the exemplary microelectromechanical structure includes moveable or resonating members and stationary members (for example, drive and/or sense electrodes) or field areas (hereinafter, collectively, "stationary members") and wherein the moveable members includes one or more slots therein to, for example, provide for more thorough doping of the moveable or reasoning members.
Figure 17A:
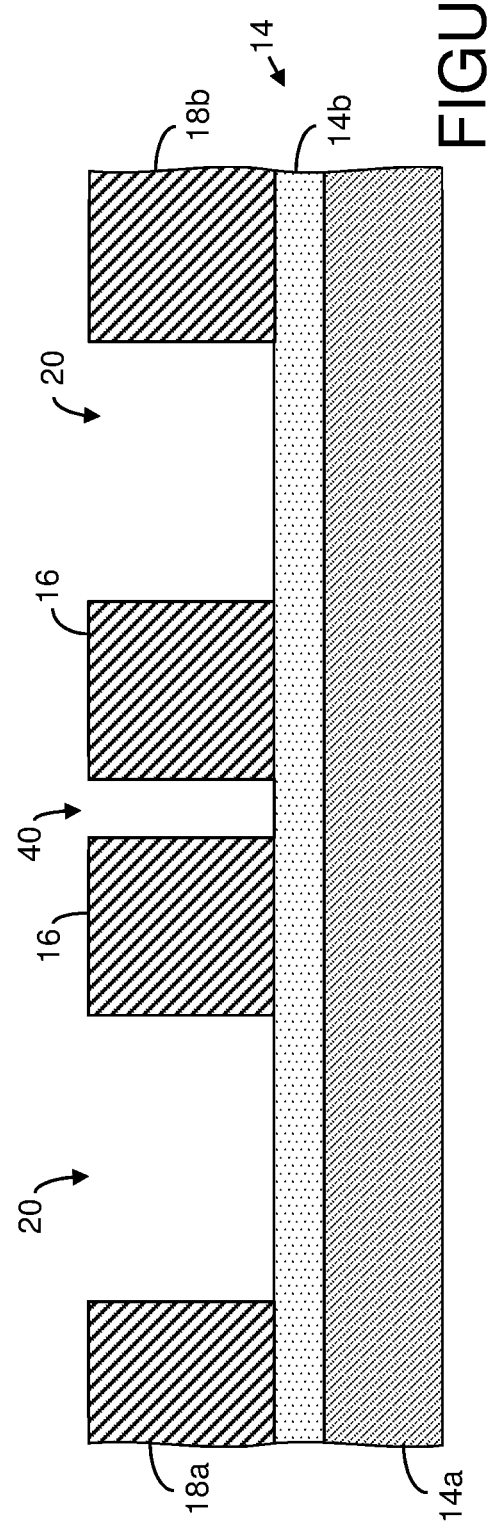

Moreover, the MEMS structure may include slots in one or more of the moveable or resonating members to facilitate, for example, more thorough impurity concentration in the material thereof and/or more complete release of the structure. For example, with reference to FIGS. 16 and 17A-17E, in one embodiment, the moveable or resonating member includes a plurality of slots 40 formed therein. In this architecture, slots 40 allow dopant carrier layer 22 to form, deposit and/or grow on a larger surface area of moveable or resonating members 16. (See, for example, FIG. 17B). As such, after the dopant in the carrier layer is transferred into the semiconductor material of moveable or resonating members 16, for example, via thermally annealing and/or heating, the concentration of impurities in the material of "center" portion of the moveable or resonating members 16 includes a substantial increase of the doping concentrations and thereby provide for reduced and/or controlled sensitivity of the temperature dependent characteristics of moveable or resonating members 16 of microelectromechanical structure 12. (See, FIGS. 17C-16E; and compare FIGS. 17C-17E to FIGS. 6C, 6D, 11C and 11D). In this way, the "center portion" of the semiconductor material of moveable or resonating members 16 formed from monocrystalline silicon may include an n-type impurity concentration, after fabrication, of greater than $10^{15}$ cm$^{-3}$ (and preferably, between $10^{15}$ cm$^{-3}$ and $10^{21}$ cm$^{-3}$), and more preferably, greater than $10^{19}$ cm$^{-3}$ (and preferably, between $10^{19}$ cm$^{-3}$ and $10^{21}$ cm$^{-3}$). In another exemplary embodiment, where the semiconductor material of the moveable or resonating members is formed from monocrystalline silicon and includes an initial n-type impurity concentration of about $10^{19}$ cm$^{-3}$, the "center portion" of semiconductor material of moveable or resonating members 16 formed from monocrystalline silicon may include an n-type impurity concentration, after fabrication, of greater than $10^{20}$ cm$^{-3}$ (and preferably, between $10^{20}$ cm$^{-3}$ and $10^{21}$ cm$^{-3}$). Indeed, these embodiments may be employ to reduce and/or control the gradient of the impurity concentration within the material of the moveable or resonating members—particularly, in those embodiment where the moveable or resonating members include challenging dimensions.

Figure 19A:
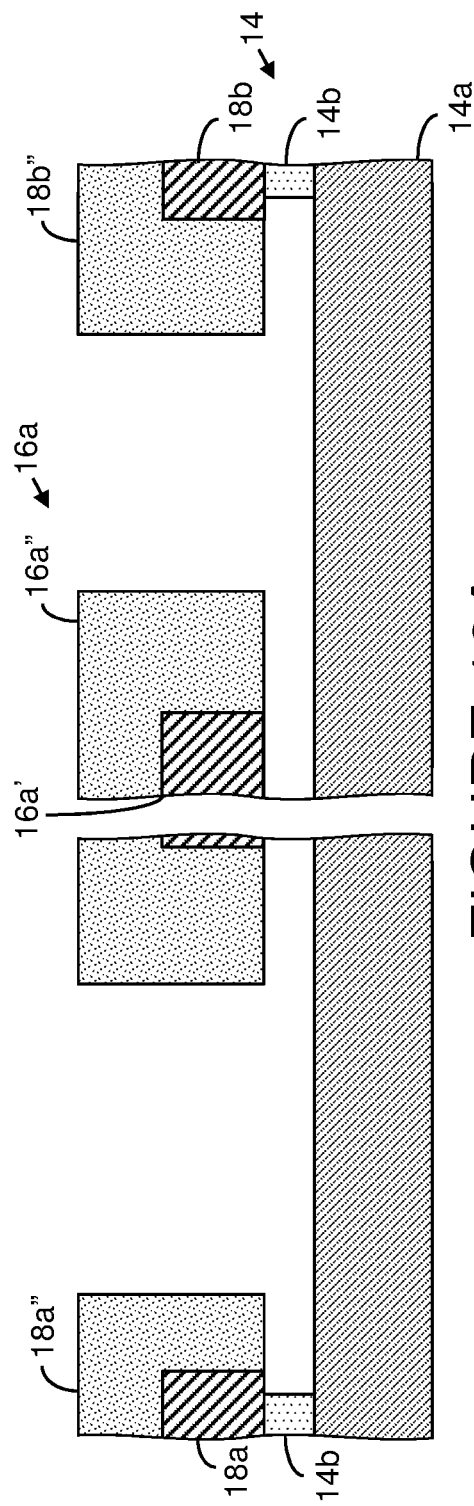
FIG. 19A illustrate cross-sectional view, along dotted line A-A, of a portion of the exemplary microelectromechanical structure of FIG. 18 (in particular, the first portion of the moveable member having the first width and the first doping density) after manufacturing in accordance with, for example, any of the processes described herein.
Figure 19B:
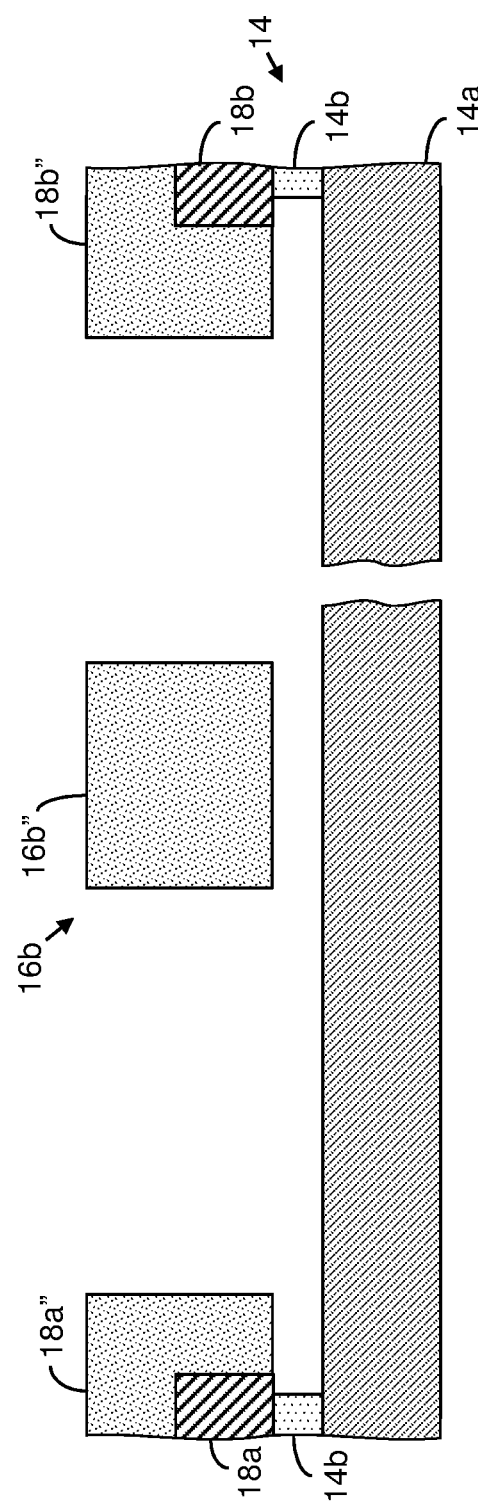
FIG. 19B illustrate cross-sectional view, along dotted line B-B, of a portion of the exemplary microelectromechanical structure of FIG. 18 (in particular, the second portion of the moveable member having the second width and the second doping density) after manufacturing in accordance with, for example, any of the processes described herein.

As noted above, the microelectromechanical structure may be designed and manufactured such that portions of the moveable or resonating members have different impurity concentrations (having different impurity concentration gradients). In one embodiment, the microelectromechanical structure includes a moveable or resonating member having a plurality of widths such that a first portion of the moveable or resonating member includes a first impurity concentration (and, in one embodiment, a first impurity gradient) and a second portion of the moveable or resonating member includes a second impurity concentration (and, in one embodiment, a second impurity gradient). In this way, the first and second portions of the moveable or resonating member include one or more different temperature dependent characteristics. (See, for example, FIG. 8 and the discussion associated therewith). For example, with reference to FIGS. 18, 19A and 19B, in one embodiment, a first portion 16a of moveable or resonating member 16 includes an impurity concentration (and/or having a first impurity gradient) which is different from a second portion 16b of moveable or resonating member 16 which includes a second impurity concentration (and/or having a second impurity gradient).

Notably, the moveable or resonating member of the microelectromechanical structure having a plurality of widths may be fabricated using any of the techniques described and/or illustrated herein including, for example, the processes illustrated in FIGS. 3A-3F. For the sake of brevity, such discussion will not be repeated. Regardless of the actual processes, the dopant from the dopant carrier layer, after transfer or drive-in, substantially increases the impurity concentrations of portions of the semiconductor material of the moveable or resonating members wherein portions of the moveable or resonating member include different impurity concentrations (and/or different impurity gradient) which after transfer or drive-in portions are identified as 16a" or 16b" to reflect or indicate an increase in concentration of dopant within such portion of the material of members 16). (See, FIGS. 19A and 19B).

Although the embodiments described and illustrated herein adjust the impurity concentrations of semiconductor material of the moveable or resonating members by selectively increasing the impurity concentration, in another aspect of the present inventions, the impurity concentration of the moveable or resonating members of the microelectromechanical structure may be adjusted by removing impurities therefrom. That is, in lieu of increasing the impurity concentrations of semiconductor material of the moveable or resonating members, the layer deposited, formed, grown and/or provided on the moveable or resonating members adjusts the impurity concentrations in semiconductor material of the moveable or resonating member by removing n-type or p-type impurities. Thus, in the embodiments of this aspect of the inventions, an impurity removal layer is deposited, formed, grown and/or provided on the moveable or resonating members and, in one embodiment, in response to an activation process (for example, thermal annealing), n-type or p-type impurities transfer from the moveable or resonating members to the impurity removal layer.

For example, with reference to FIGS. 20A and 20B, the manufacture of microelectromechanical structure 12, in one exemplary embodiment of this aspect of the inventions, includes forming or fabricating moveable or resonating member 16" from a semiconductor on insulator (SOI) substrate 14 having a silicon layer 14c disposed on an insulating or sacrificial layer 14b, which is disposed on a "handle" layer 14a (for example, silicon). In this exemplary embodiment, silicon layer 14c may be monocrystalline silicon having a first concentration of p-type impurities (for example, an initial or background p-type impurity concentration of about $10^{19}$ cm$^{-3}$). The moveable or resonating member 16" may be formed or fabricated in substrate 14c using conventional lithographic and etching techniques (see channels 20 which defines the moveable or resonating member 16"). Indeed, any technique, now known or later developed, may be employed to form or fabricate moveable or resonating member 16".

Figure 20C:
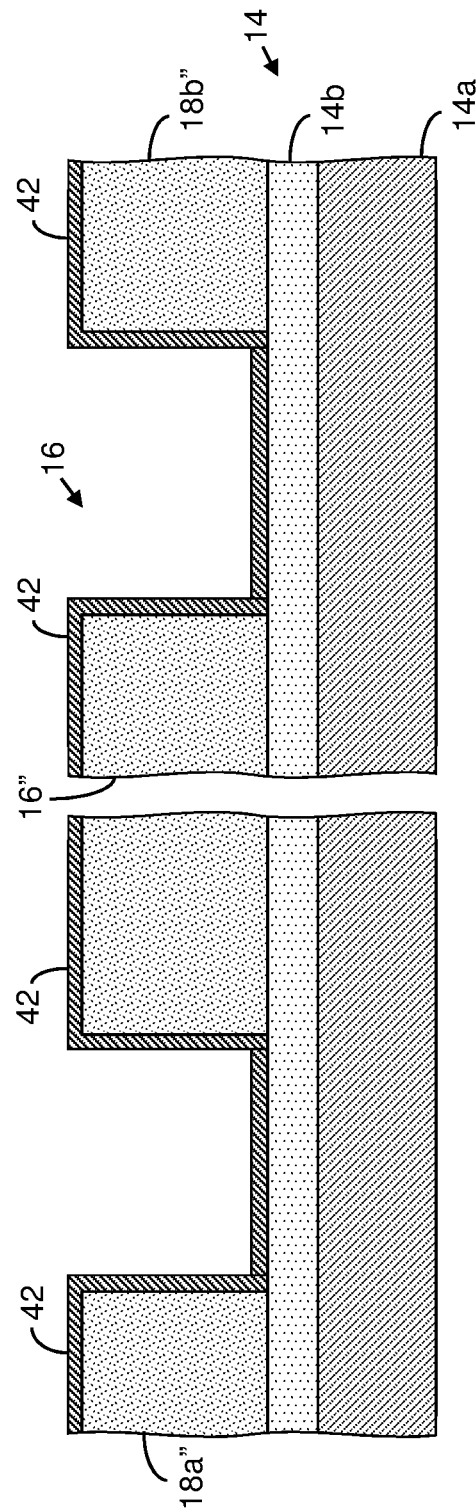

After defining or forming one or more of the moveable or resonating members, with reference to FIG. 20C, the method of this aspect of the present inventions deposits, forms, grows and/or provides impurity removal layer 42 on moveable or resonating members 16". The impurity removal layer 42 includes a material that has a higher attraction (relative to the material of moveable or resonating members 16") for one or more dopants and/or dopant types (n-type or p-type impurities) which reside in moveable or resonating members 16" and/or the segregation coefficient of the materials at the interface of layer 42 and resonating member 16" is sufficient to remove dopant near or at the surface of the material of member 16". In this exemplary embodiment, impurity removal layer 42 may be an undoped silicon glass (for example, silicon dioxide) which is employed to remove or absorb a p-type impurity (for example, boron) and thereby reduce the concentration of dopant or impurities in the material of moveable or resonating members 16.

Figure 20D:
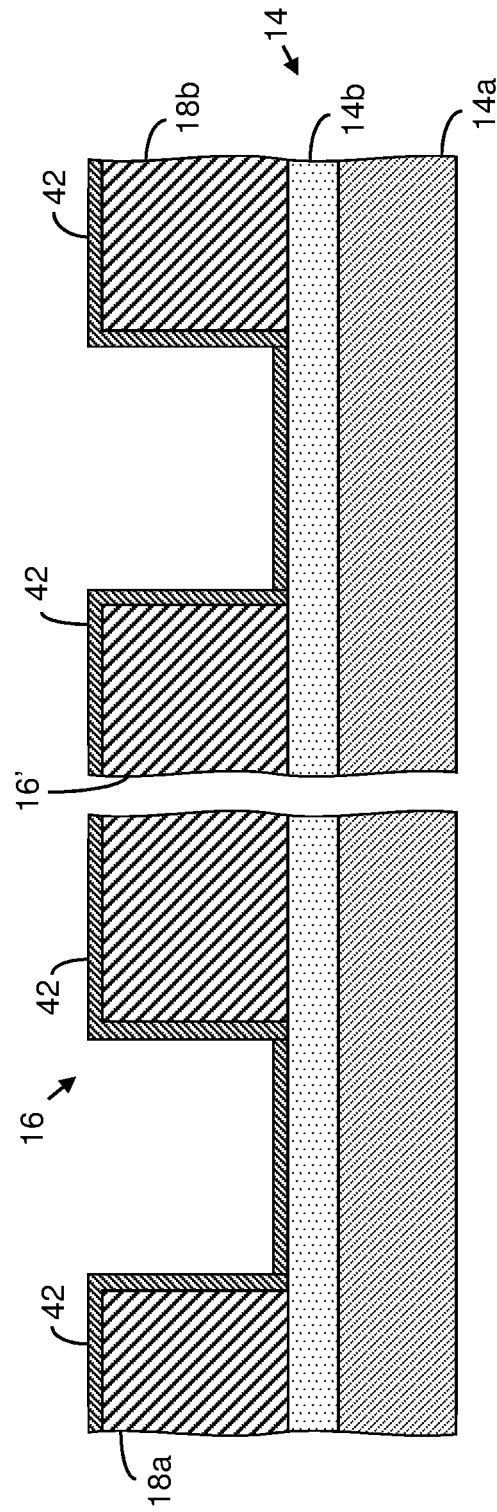

With reference to FIG. 20D, during and/or after providing, depositing, forming and/or growing impurity removal layer 42 on moveable or resonating members 16", the impurity dopants in the material of moveable or resonating members 16" is transferred to or driven into impurity removal layer 42 (which after transfer or drive-in portions are identified as 16 to reflect or indicate an increase in concentration of impurity dopant within such portion of the material of members 16'). In one embodiment, thermally annealing or heating is employed to induce the transfer of the n-type or p-type impurities from the material of moveable or resonating members 16 (for example, at or near the surface thereof) to impurity removal layer 42.

Figure 20E:
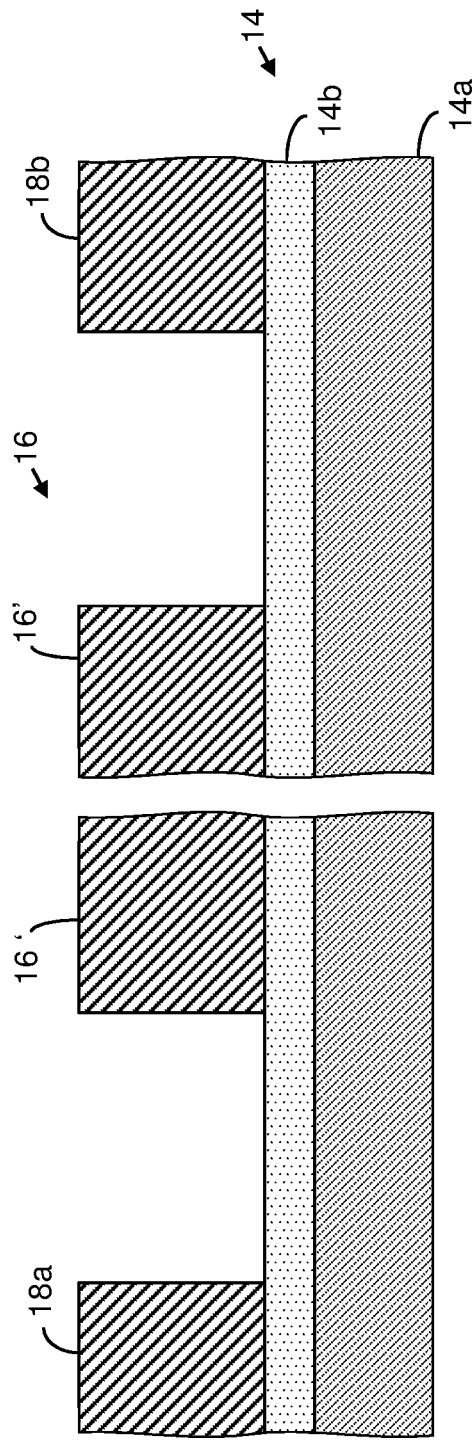
Figure 20F:
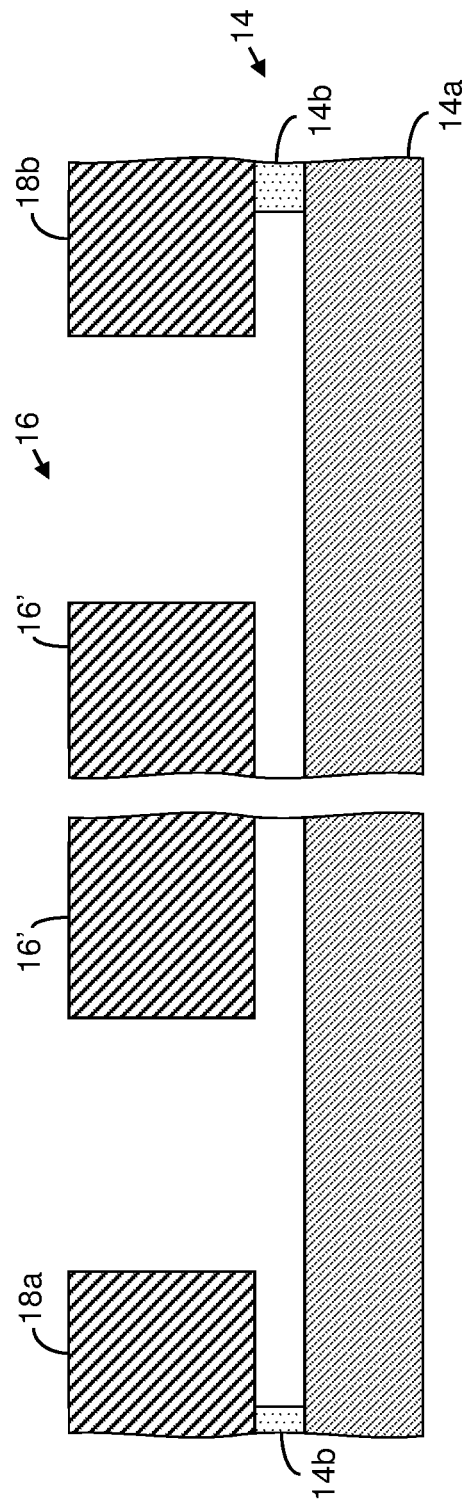

With reference to FIG. 20E, after absorption of the impurities or dopants by impurity removal layer 42 from 16" of moveable or resonating members 16, in one embodiment, impurity removal layer 42 is removed, using, for example, conventional removal techniques—for example, a wet etch process. Concurrently with the removal of the dopant carrier layer, or after such removal, moveable or resonating member 16 may be released (vertically and/or horizontally) from substrate 14 via removal of insulating or sacrificial layer 14b. (See, FIG. 20F).

The various embodiments described above with respect to adjusting the impurity concentration of the moveable or resonating members of the microelectromechanical structure by increasing such concentration are fully applicable to adjusting the impurity concentration by removing impurities from the material of the moveable or resonating members. For example, impurity removal process(es) may be "patterned" so that one or more first regions or structures of a MEMS device include a first impurity concentration level and one or more other regions or structures of the device are substantially maintained at background doping level and/or at an impurity concentration level that is/are different from the first region(s) or structure(s). Here, one or more regions/portions of a structure may include a first impurity concentration level while other regions/portions of the structure are not doped and/or are doped differently (for example, a different impurity, impurity level, different gradient and/or impurity type) so that one structure of the device is fabricated from the highly doped semiconductor and another structure is not fabricated from substantially the same highly doped semiconductor (for example, such other structure may be fabricated from material having a impurity concentration that is substantially at the background doping level. For the sake of brevity such discussions will not be repeated.

Figure 21A:
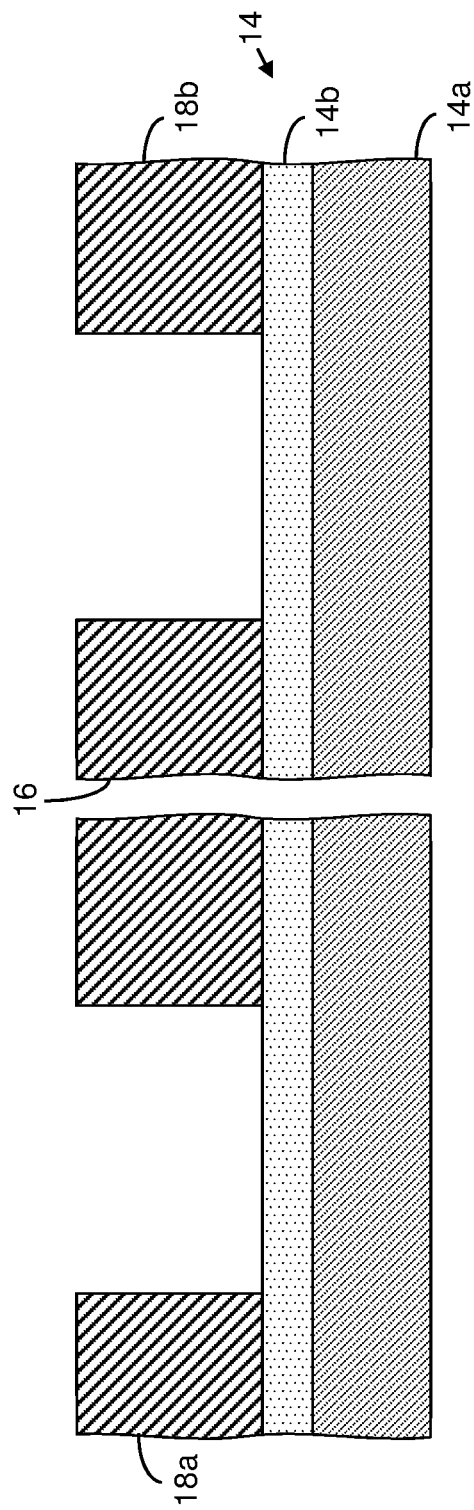
FIGS. 21A-21E illustrate cross-sectional views of an exemplary process sequence that dopes the structure 16 in a vertically symmetrical way.
Figure 21B:
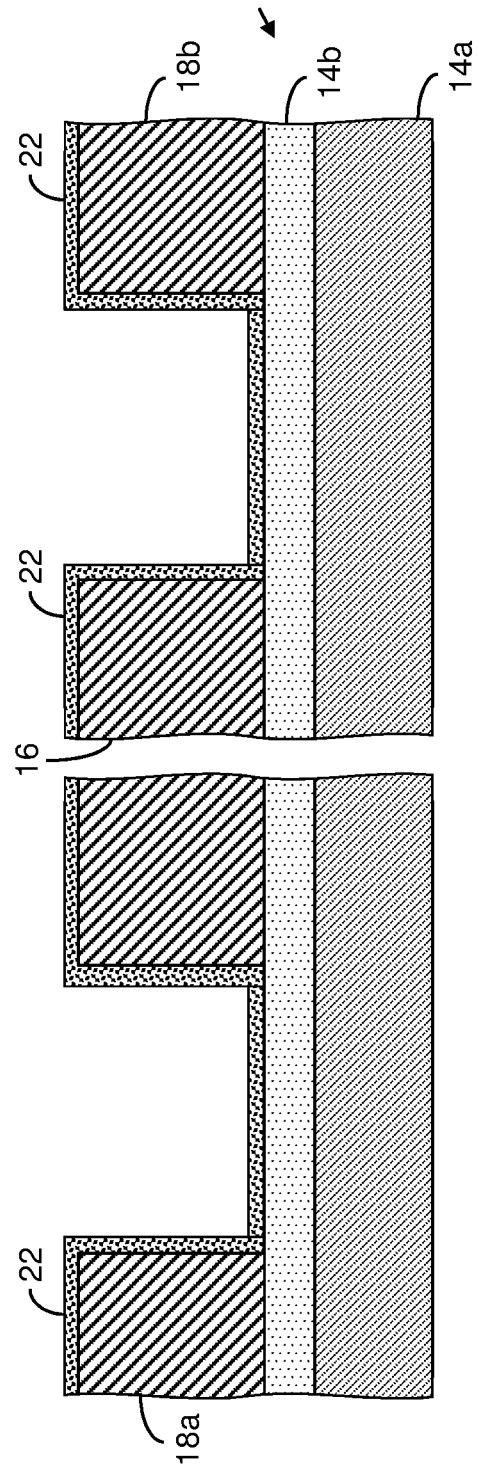
Figure 21C:
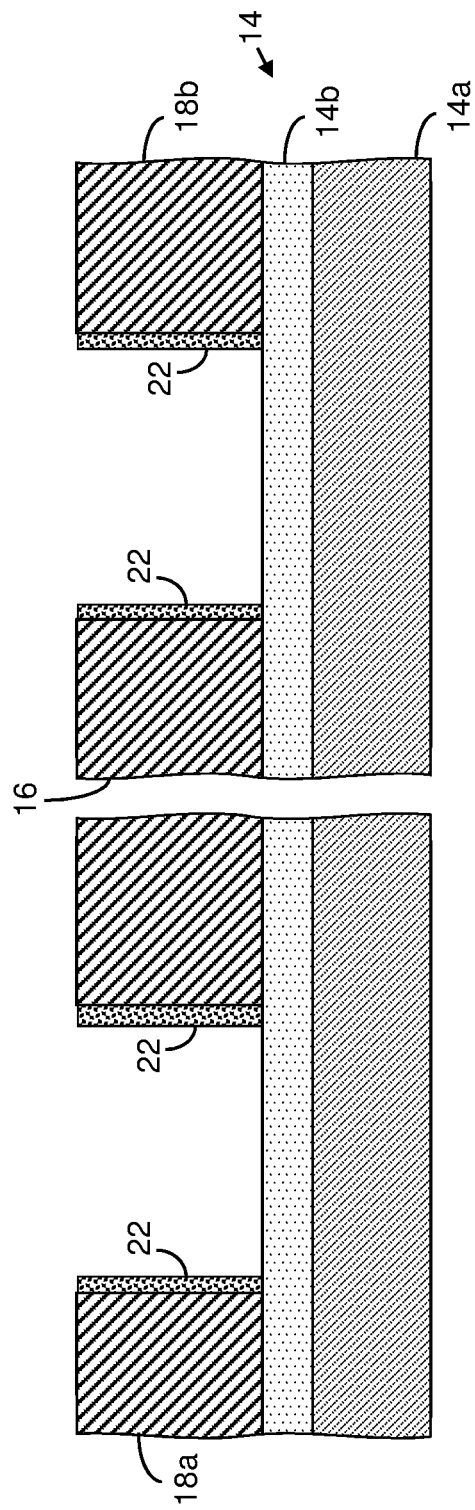
Figure 21D:
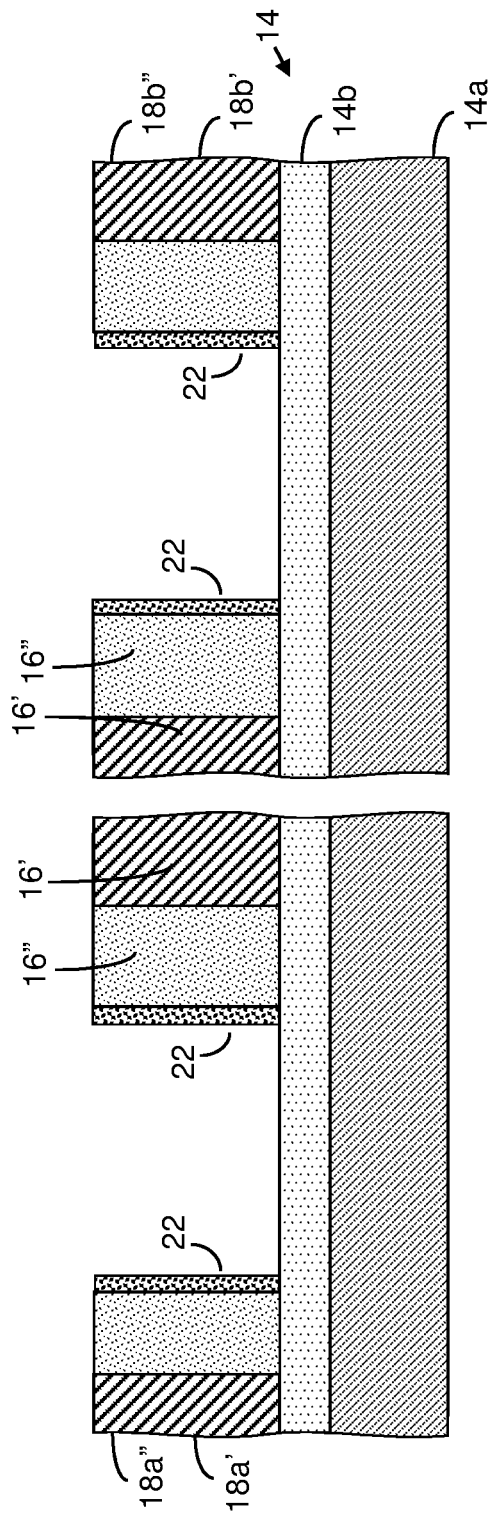
Figure 21E:
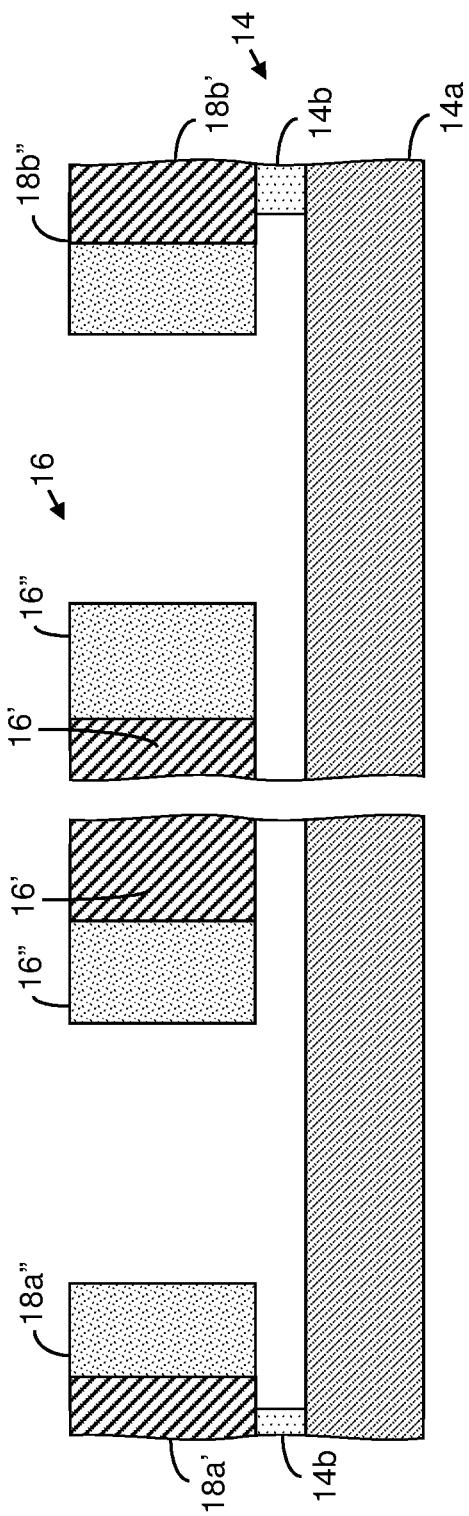

When the carrier layer 22 contacts the sides and top of the structure 16 and the dopant is driven in from the carrier layer 22 then there may be a vertical asymmetry in the final dopant profile in structure 16. In some cases this may not be desirable. This asymmetry may be reduced as shown in FIG. 11A-11D by releasing structure 16 prior to depositing carrier layer 22 and then driving dopant in from the carrier layer 16 from the sides and the top and the bottom. In this way structure 16 can be doped from the top and bottom symmetrically. An additional way to achieve a vertically symmetrical dopant profile is to remove the carrier layer 16 after deposition but prior to drive-in, as shown in FIGS. 21A-21E, where FIG. 21C shows the lateral surfaces of carrier layer 22 removed. This form or removal is well known to those skilled in the art of wafer processing as a common result of plasma etching.

Figure 22A:
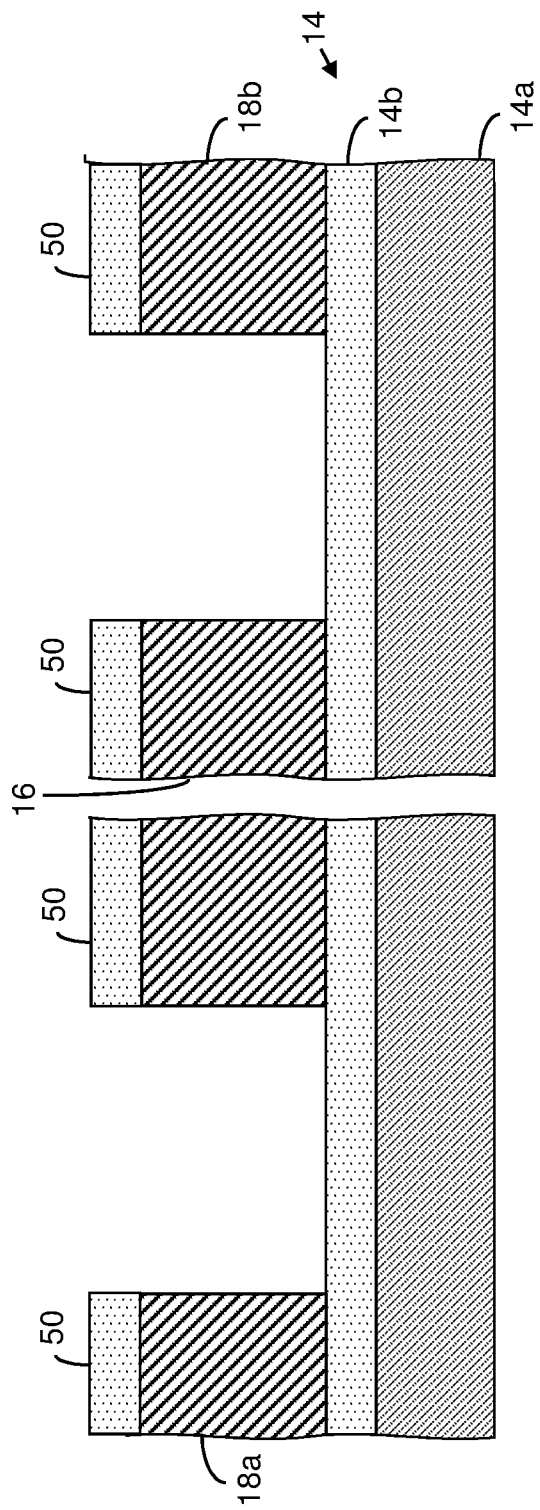
FIGS. 22A-22D illustrate cross-sectional views of another exemplary process sequence that dopes the structure 16 in a vertically symmetrical way; notably, there may be benefits to keeping the structure 16 symmetrical; that is, with the same or similar dopant concentration profiles at the top and the bottom of structure 16; for instance doing this may balance the stress on the structure that may be associated with the doping, and thereby help keep the structure from warping up or down.
Figure 22B:
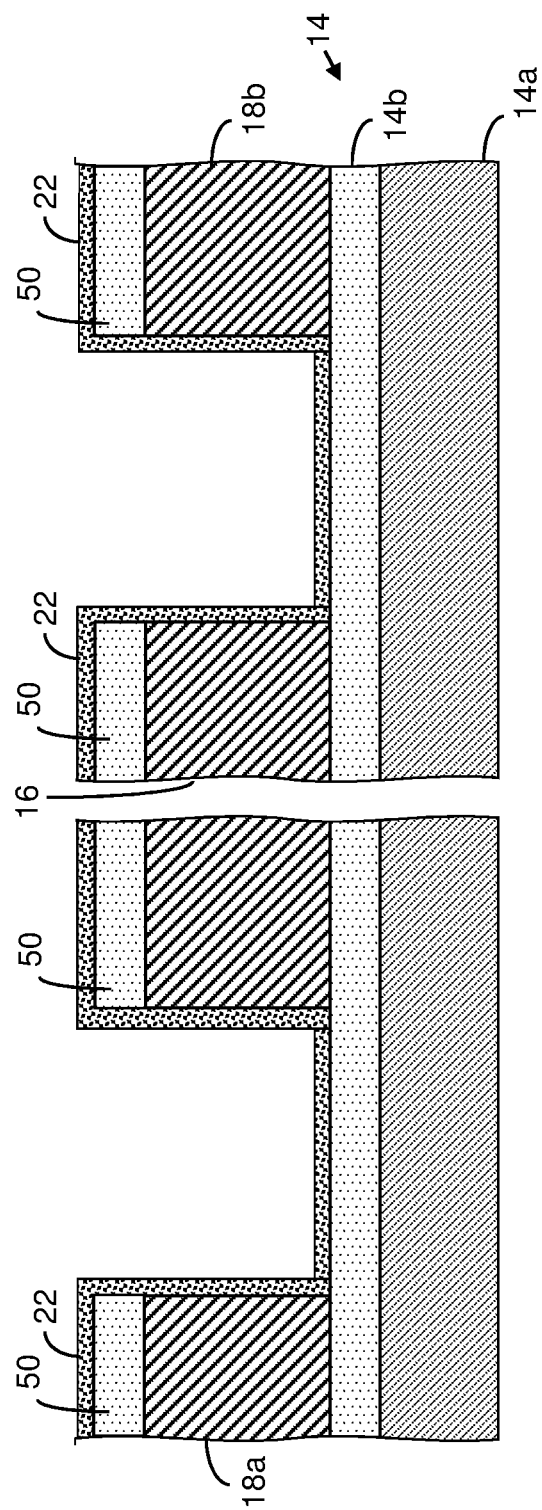
Figure 22C:
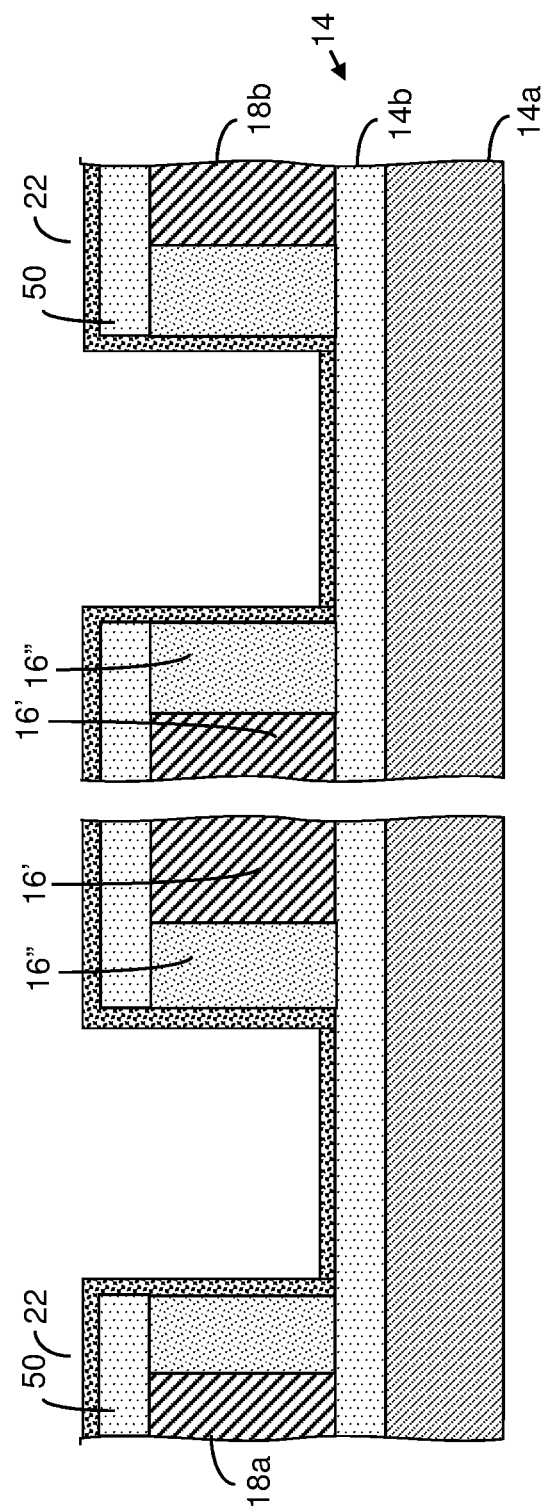
Figure 22D:
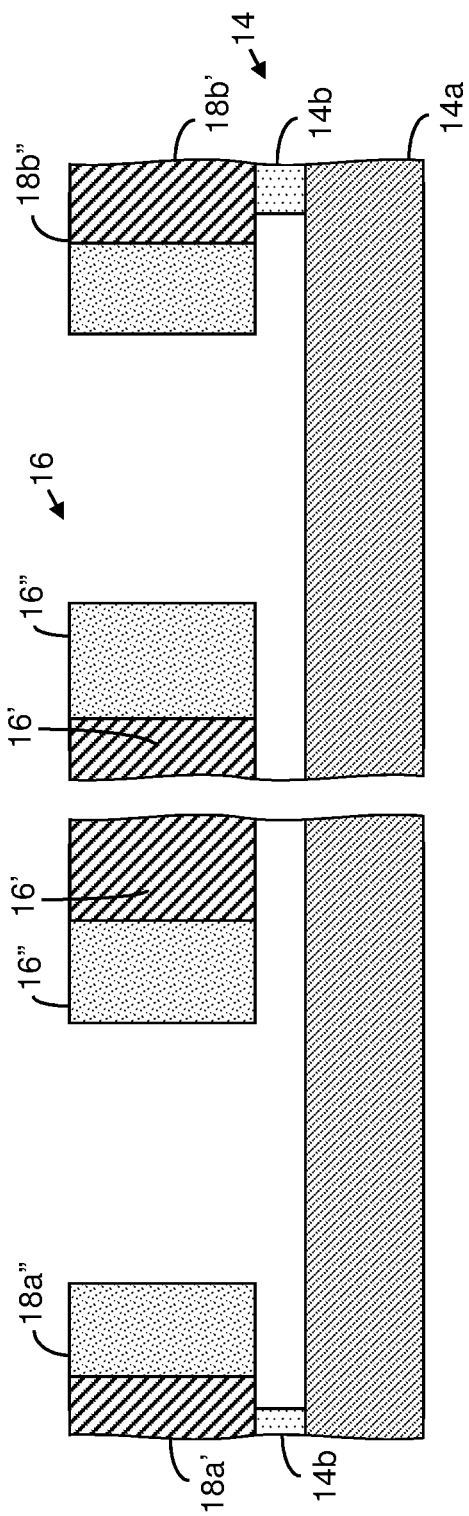

In yet another embodiment, the top surface of member 16 may be protected with a mask layer 50 from contact with carrier layer 22 as shown in FIGS. 22A-22D. The mask should be chosen to properly isolate the dopant, this can be done for instance with an oxide deposited prior to the etching step that forms structure 16. This is often referred to as a hard mask for that etch. Hard masks may be used to improve the etching properties and may be removed prior to further processing, but in this exemplary embodiment the hard mask may be left on, as shown in FIG. 22A. After the drive in FIG. 22C the dopant has not penetrated the hard mask.

By removing or masking the carrier layer 22, the member 16 may be built with doping only or primarily from the sides and not the top or bottom. In these ways the dopant symmetry both laterally and vertically in member 16 may be more uniform.

Notably, although, at times, the present inventions have been described and/or illustrated in relation to or in the context of a semiconductor-on-insulator (SOI) substrate. For example, the semiconductor layer of the SOI substrate may be materials in column IV of the periodic table, for example, silicon, germanium, carbon; also combinations of these, for example, silicon germanium, or silicon carbide; also of III-V compounds, for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon-germanium; also these materials with various crystal structures, including single/mono crystalline, polycrystalline, nanocrystalline, or amorphous; also with combinations of crystal structures, for instance with regions of single crystalline and polycrystalline structure (whether doped or undoped). Notably, the mechanical and/or thermistor structures may be comprised of the same materials as described above with respect to the first semiconductor layer.

Other substrates are also suitable—including, an insulating material (for example, a ceramic material, a glass material, a silicon oxide material and a silicon nitride material). The substrate may be a semiconductor material of a standard wafer (for example, a monocrystalline or polycrystalline silicon wafer) having an insulator or sacrificial layer deposited thereon. Moreover, the substrate may be a metal material. All substrates now known or later developed are intended to fall within the scope of the present inventions.

Moreover, the present inventions may include deposition, formation and/or growth of a silicon (doped or undoped) on the impurity adjusted moveable or resonating members of the microelectromechanical structure. In this embodiment, after adjusting the impurity concentration of the material of the moveable or resonating members of the microelectromechanical structure (according to any of the embodiments described and/or illustrated herein), the technique may include depositing, forming, growing and/or providing silicon (doped or undoped) on the surface of the moveable or resonating members to, for example, adjust the temperature coefficient of frequency (TCF) of moveable or resonating members as well as adjust the gap length between the microelectromechanical structure and the drive/sense electrodes.

It should be further noted that various structures (for example, the structures of the MEMS device), circuits and/or circuitry may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such structure and/or circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described structures, circuits and/or circuitry may be processed by a processing entity (e.g., one or more processors) within the computer system in conjunction with execution of one or more other computer programs including, without limitation, net-list generation programs, place and route programs and the like, to generate a representation or image of a physical manifestation of such structures, circuits and/or circuitry. Such representation or image may thereafter be used in device fabrication, for example, by enabling generation of one or more masks that are used to form various components of the circuits in a device fabrication process.

Moreover, the various structures (for example, the structures of the MEMS device), circuits and/or circuitry disclosed herein may be represented via simulations using computer aided design and/or testing tools. The simulation of the various structures and/or characteristics or operations thereof may be implemented by a computer system wherein characteristics and operations of such structures and/or circuitry, and techniques implemented thereby, are imitated, replicated and/or predicted via a computer system. The present inventions are also directed to such simulations of the inventive structures and circuitry, and/or techniques implemented thereby, and, as such, are intended to fall within the scope of the present inventions. The computer-readable media corresponding to such simulations and/or testing tools are also intended to fall within the scope of the present inventions.

The term "depositing" and other forms (i.e., deposit, deposition and deposited), in the claims, means, among other things, depositing, creating, forming and/or growing a layer of material. In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

What is claimed is:
1. A semiconductor device comprising:
   a crystal silicon layer having first and second regions, the first region being doped in a manner not shared by the second region;
   a first microelectromechanical systems (MEMS) resonator having a first movable body formed from the first region;
   a second MEMS resonator having a second movable body formed from the second region;

wherein the first movable body and the second movable body have respective first-order temperature coefficients of frequency that differ from one another due, at least in part, to the doping of the first region relative to the second region; and wherein the first region has a dopant concentration of at least $1E19/cm^3$ and the second region of the first silicon layer has less than $1E18/cm^3$ of the dopant concentration.

2. The semiconductor device of claim 1 wherein the semiconductor device further comprises a lid layer and one or more lateral walls, the lid layer and the one or more lateral walls enclosing the first movable body and the second movable body relative to the substrate, the lid layer having one or more oxide-release vents, and wherein the semiconductor device further comprises a material that plugs the one or more oxide-release vents so as to seal the first movable body and the second movable body relative to an environment external to the semiconductor device.

3. The semiconductor device of claim 1 wherein the semiconductor device further comprises circuitry to output a clock signal dependent on a resonance frequency of at least one of the first MEMS resonator and the second MEMS resonator.

4. The semiconductor device of claim 3 wherein the circuitry comprises at least one of a phase-locked loop (PLL) or a delay locked loop (DLL) or a digital frequency synthesizer to generate the clock signal.

5. The semiconductor device of claim 1 wherein the semiconductor device further comprises circuitry to generate a temperature-dependent signal dependent on a difference between a resonance frequency of the first MEMS resonator and a resonant frequency of the second MEMS resonator.

6. The semiconductor device of claim 5 wherein the semiconductor device further comprises circuitry to generate a clock signal dependent on at least one of the resonance frequency of the first MEMS resonator and the resonance frequency of the second MEMS resonator and circuitry to output a temperature-corrected clock signal dependent on the temperature-dependent signal.

7. The semiconductor device of claim 1 wherein:
the crystal silicon layer is a single crystal silicon layer having a first crystalline axis;
the first movable body has a longitudinal dimension that is coplanar with the first crystalline axis and extends at a first angle relative to the first crystalline axis; and
the second movable body has a longitudinal dimension that is coplanar with the first crystalline axis and extends at a second angle relative to the first crystalline axis.

8. The semiconductor device of claim 7 wherein the respective first-order temperature coefficients of frequency differ from one another due, at least in part, to a difference between the first angle and the second angle.

9. The semiconductor device of claim 1 wherein the dopant is one of phosphorus, arsenic or antimony.

10. A semiconductor device comprising:
a crystal silicon layer having first and second regions, the first region being doped in a manner not shared by the second region;
a first microelectromechanical systems (MEMS) resonator having a first movable body formed from the first region;
a second MEMS resonator having a second movable body formed from the second region;
wherein the first movable body and the second movable body have respective first-order temperature coefficients of frequency that differ from one another due, at least in part, to the doping of the first region relative to the second region; and
wherein the first movable body and the second movable body are each doped with the dopant at respective dopant concentrations that differ from each other by a factor of ten or more.

11. A semiconductor device comprising:
a crystal silicon layer having first and second regions, the first region being doped in a manner not shared by the second region;
a first microelectromechanical systems (MEMS) resonator having a first movable body formed from the first region;
a second MEMS resonator having a second movable body formed from the second region;
wherein the first movable body and the second movable body have respective first-order temperature coefficients of frequency that differ from one another due, at least in part, to the doping of the first region relative to the second region; and
wherein the first movable body has a dopant concentration that is at least 10E21 per cubic centimeter, wherein the second movable body has a dopant concentration that no more than 10E18 per cubic centimeter, and wherein each of the first movable body and the second movable body are doped with one of phosphorus, arsenic or antimony.

12. A semiconductor device comprising:
a crystal silicon layer having first and second regions, the first region being doped in a manner not shared by the second region;
a first microelectromechanical systems (MEMS) resonator having a first movable body formed from the first region;
a second MEMS resonator having a second movable body formed from the second region;
wherein the first movable body and the second movable body have respective first-order temperature coefficients of frequency that differ from one another due, at least in part, to the doping of the first region relative to the second region; and
wherein the first movable body is characterized by a first surface that is coplanar with the substrate, and a second surface that is not coplanar with the first surface, and wherein the first movable body is formed using a process that drives dopant into the first movable body via each of the first surface and the second surface, so as to establish a dopant profile that provides for declining dopant concentration as a function of distance within the first movable body from each of the first surface and the second surface.

13. A semiconductor device comprising:
a crystal silicon layer having first and second regions, the first region having a dopant and the second region having a dopant, wherein the first region and the second region differ in at least one of a dopant type or a dopant concentration;
a first microelectromechanical systems (MEMS) resonator having a first movable body formed from the first region; and
a second MEMS resonator having a second movable body formed from the second region;
wherein the first movable body and the second movable body have respective first-order temperature coefficients of frequency that differ from one another due, at least in part, to the doping of the first region relative to the second region; and wherein the first movable body has a dopant, at the dopant concentration that is at least 10E21 per cubic centimeter and wherein the second movable body also has the dopant, at a dopant concentration that no more than 10E18 per cubic centimeter.

14. The semiconductor device of claim 13 wherein:
the crystal silicon layer is a single crystal silicon layer having a first crystalline axis;
the first movable body has a longitudinal dimension that is coplanar with the first crystalline axis and extends at a first angle relative to the first crystalline axis;
the second movable body has a longitudinal dimension that is coplanar with the first crystalline axis and extends at a second angle relative to the first crystalline axis; and
the respective first-order temperature coefficients of frequency differ from one another due, at least in part, to a difference between the first angle and the second angle.

15. The semiconductor device of claim 13 wherein the first movable body is characterized by a first surface that is coplanar with the substrate, and a second surface that is not coplanar with the first surface, and wherein the first movable body is formed using a process that drives dopant into the first movable body via each of the first surface and the second surface, so as to establish a dopant profile that provides for declining dopant concentration as a function of distance within the first movable body from each of the first surface and the second surface.

16. The semiconductor device of claim 13 wherein the semiconductor device further comprises a lid layer and one or more lateral walls, the lid layer and the one or more lateral walls enclosing the first movable body and the second movable body relative to the substrate, the lid layer having one or more oxide-release vents, and wherein the semiconductor device further comprises a material that plugs the one or more oxide-release vents so as to seal the first movable body and the second movable body relative to an environment external to the semiconductor device.

17. The semiconductor device of claim 16 wherein the circuitry comprises clock generation circuitry and wherein the semiconductor device is to output a clock signal dependent on at least one of the first MEMS resonator and the second MEMS resonator.

18. The semiconductor device of claim 16 wherein the semiconductor device further comprises circuitry to generate a temperature-dependent signal dependent on a difference between a resonance frequency of the first MEMS resonator and a resonant frequency of the second MEMS resonator.

19. A method of fabricating a semiconductor device comprising:
doping a crystal silicon layer having first and second regions in a manner such that the first region is doped in a manner not shared by the second region;
forming a first microelectromechanical systems (MEMS) resonator having a first movable body, wherein the first movable body is formed from the first region; and
forming a second MEMS resonator having a second movable body, wherein the second movable body is formed from the second region;
wherein the first movable body and the second movable body have respective first-order temperature coefficients of frequency that differ from one another due, at least in part, to the doping of the first region relative to the second region;
wherein forming the first MEMS resonator and forming the second MEMS resonator are performed such that the first region has a dopant concentration of at least 1E19/cm3 and the second region of the first silicon layer has less than 1E18/cm3 of the dopant concentration.

* * * * *